(12) United States Patent
Saegusa et al.

(10) Patent No.: US 8,900,789 B2
(45) Date of Patent: Dec. 2, 2014

(54) ACTINIC-RAY- OR RADIATION-SENSITIVE RESIN COMPOSITION AND METHOD OF FORMING PATTERN USING THE COMPOSITION

(75) Inventors: Hiroshi Saegusa, Haibara-gun (JP); Shinichi Kanna, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 290 days.

(21) Appl. No.: 12/501,938

(22) Filed: Jul. 13, 2009

(65) Prior Publication Data

US 2010/0015554 A1    Jan. 21, 2010

(30) Foreign Application Priority Data

Jul. 14, 2008 (JP) ................. 2008-183126
Mar. 31, 2009 (JP) ................. 2009-087539

(51) Int. Cl.
*G03F 7/039* (2006.01)
*G03F 7/075* (2006.01)
*G03F 7/20* (2006.01)
*G03F 7/30* (2006.01)

(52) U.S. Cl.
USPC ........ 430/270.1; 430/311; 430/326; 430/905; 430/907; 430/910

(58) Field of Classification Search
None
See application file for complete search history.

(56) References Cited

U.S. PATENT DOCUMENTS

| 4,480,910 | A | 11/1984 | Takanashi et al. |
|---|---|---|---|
| 7,501,220 | B2 | 3/2009 | Hirayama et al. |
| 7,527,909 | B2 | 5/2009 | Hirayama et al. |
| 7,541,138 | B2 | 6/2009 | Hirayama et al. |
| 2006/0068322 | A1 * | 3/2006 | Sasaki ............ 430/270.1 |
| 2006/0246373 | A1 | 11/2006 | Wang |
| 2007/0134588 | A1 * | 6/2007 | Kanda et al. ........ 430/270.1 |
| 2007/0178405 | A1 * | 8/2007 | Kanda et al. ........ 430/270.1 |
| 2008/0096131 | A1 | 4/2008 | Hatakeyama et al. |
| 2008/0241736 | A1 | 10/2008 | Kobayashi et al. |
| 2008/0305433 | A1 | 12/2008 | Kanda et al. |
| 2009/0123869 | A1 | 5/2009 | Wang |
| 2009/0130592 | A1 | 5/2009 | Wang |
| 2009/0130605 | A1 | 5/2009 | Hirayama et al. |
| 2012/0115085 | A1 | 5/2012 | Kanda et al. |

FOREIGN PATENT DOCUMENTS

| JP | 57-153433 A | 9/1982 |
|---|---|---|
| JP | 7-220990 A | 8/1995 |
| JP | 2004-294688 A | 10/2004 |
| JP | 2005-221714 A | 8/2005 |
| JP | 2006-309245 A | 11/2006 |
| JP | 2007-304537 A | 11/2007 |
| JP | 2007-304545 A | 11/2007 |
| JP | 2008-46582 A | 2/2008 |
| JP | 2008-107443 A | 5/2008 |
| JP | 2008-134607 A | 6/2008 |
| JP | 2008-239918 A | 10/2008 |
| WO | 2004/068242 A1 | 8/2004 |
| WO | WO 2008/123560 A1 * | 10/2008 |

OTHER PUBLICATIONS

Hoffnagle et al., "Liquid immersion deep-ultraviolet interferometric lithography", J. Vac. Sci. Technol., Nov./Dec. 1999, vol. 17. No. 6, pp. 3306-3309.
Ito et al., "Dissolution/swelling behavior of cycloolefin polymers in aqueous base", Advances in Resist Technology and Processing XVII, Proceedings of SPIE, 2000, vol. 3999, pp. 2-12.
Lin, B.J., "Plenary Paper, Semiconductor Foundry, Lithography, and Partners", Proceedings of SPIE, vol. 4688, 2002, pp. 11-24.
Japanese Office Action issued in application No. 2009-087539 dated Apr. 23, 2013.
Japanese Office Action dated Nov. 26, 2013 issued in application No. 2009-087539.

* cited by examiner

*Primary Examiner* — Sin J. Lee
(74) *Attorney, Agent, or Firm* — Sughrue Mion, PLLC

(57) ABSTRACT

An actinic-ray- or radiation-sensitive resin composition comprises (A) a resin that when acted on by an acid, exhibits an increased solubility in an alkali developer, (B) a compound that when exposed to actinic rays or radiation, generates an acid, (C) a resin containing two or more resins (c) each having at least either a fluorine atom or a silicon atom, and (D) a solvent.

19 Claims, 1 Drawing Sheet

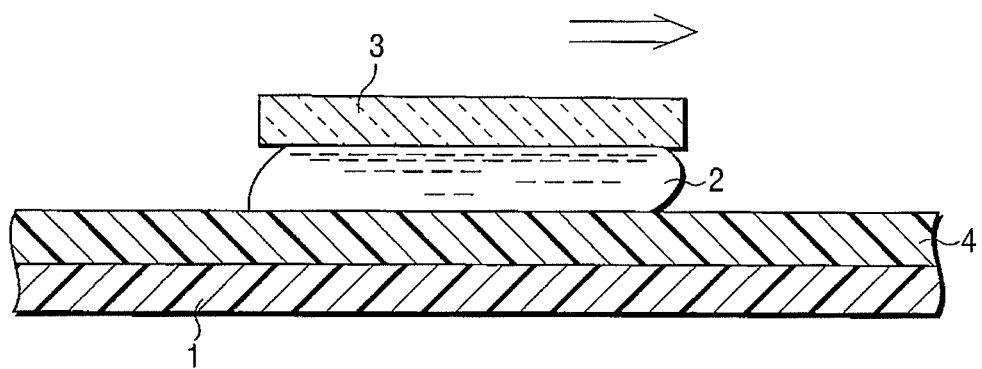

ACTINIC-RAY- OR RADIATION-SENSITIVE RESIN COMPOSITION AND METHOD OF FORMING PATTERN USING THE COMPOSITION

CROSS-REFERENCE TO RELATED APPLICATIONS

This application is based upon and claims the benefit of priority from prior Japanese Patent Applications No. 2008-183126, filed Jul. 14, 2008; and No. 2009-087539, filed Mar. 31, 2009, the entire contents of both of which are incorporated herein by reference.

BACKGROUND OF THE INVENTION

1. Field of the Invention

The present invention relates to an actinic-ray- or radiation-sensitive resin composition employed in a semiconductor production process for an IC or the like, a circuit board production process for a liquid crystal, a thermal head or the like and other photoapplication lithography processes, and also relates to a method of forming a pattern with the use of the composition. More particularly, the present invention relates to an actinic-ray- or radiation-sensitive resin composition that is suitable for exposure by means of a liquid-immersion projection exposure unit using far-ultraviolet rays of wavelength 300 nm or shorter as a light source, and also relates to a method of forming a pattern with the use of the composition.

In the present invention, the terms "actinic rays" and "radiation" mean, for example, a mercury lamp bright line spectrum, far-ultraviolet rays represented by an excimer laser, extreme ultraviolet rays, X-rays, electron beams and the like. In the present invention, the term "light" means actinic rays or radiation.

2. Description of the Related Art

In accordance with the miniaturization of semiconductor elements, the wavelength shortening of the exposure light source and the realization of high numerical apertures (high NA) for projector lenses have been advanced. At present, an exposure machine of 0.84 NA using an ArF excimer laser of wavelength 193 nm as a light source has been developed. As is commonly known, the following formulae can be established therefor.

(Resolving power)=$k_1 \cdot (\lambda/NA)$ (Focal depth)=$\pm k_2 \cdot \lambda/NA^2$ In the formulae, $\lambda$ is the wavelength of the exposure light source; NA is the numerical aperture of the projector lens; and $k_1$ and $k_2$ are factors relating to the process.

As a technology for enhancing the resolving power of an optical microscope in order to attain a further resolving power enhancement by wavelength shortening, it is heretofore known to employ a liquid immersion technique, that is, a method in which a space between a projector lens and a sample is filled with a liquid of high refractive index (hereinafter also referred to as a "liquid for liquid immersion").

The "effect of the liquid immersion" is as follows. Taking $\lambda_0$ as the wavelength of exposure light in air, n as the refractive index of the liquid for liquid immersion to air and θ as the convergent half angle of the light beam, where $NA_0 = \sin\theta$, the above-mentioned resolving power and focal depth in the event of liquid immersion can be expressed by the following formulae.

(Resolving power)=$k_1 \cdot (\lambda_0/n)/NA_0$ (Focal depth)=$\pm k_2 (\lambda_0/n)/NA_0^2$ That is, the effect of the liquid immersion is equivalent to the use of an exposure wavelength of 1/n.

In other words, in projection optic systems of identical NA, the liquid immersion would enable the focal depth to be n-fold.

This is effective in all pattern configurations. Further, this can be combined with a super-resolution technology, such as a phase shift method or a modified illumination method, now under study.

Examples of the apparatuses utilizing this effect in the transfer of the microscopic image pattern of a semiconductor element are introduced in patent references 1, 2, etc.

The recent progress of the liquid immersion exposure technology is reported in non-patent references 1, 2, 3, etc. In the use of an ArF excimer laser as a light source, it is presumed that pure water (refractive index at 193 nm: 1.44) can offer most promising prospects as the liquid for liquid immersion from the viewpoint of handling safety as well as 193-nm transmission and refractive index.

Since the emergence of the resist for a KrF excimer laser (248 nm), an image forming method through chemical amplification has been employed as a resist image forming method in order to compensate for any sensitivity deterioration caused by light absorption. Brief description of an image forming method through positive chemical amplification is given below by way of example. Upon exposure, an acid generator will be decomposed at exposed areas to thereby generate an acid. In baking after the exposure (post-exposure bake [PEB]), the generated acid is used as a reaction catalyst so that an alkali-insoluble group is converted to an alkali-soluble group. Thereafter, alkali development is carried out to thereby remove the exposed areas. Thus, the relevant image forming method is provided.

The resist for an ArF excimer laser (193 nm) utilizing this chemical amplification mechanism is now becoming mainstream. However, in the liquid immersion exposure, the resist has been unsatisfactory in the problem of pattern collapse such that a formed line pattern collapses to thereby cause a defect in device production and in the problem of line edge roughness involving roughening of pattern side walls.

Further, it is pointed out that when the chemical amplification resist is applied to the liquid immersion exposure, as the resist layer is brought into contact with the liquid for liquid immersion at the time of exposure, not only would the resist layer suffer a property alteration but also a component having an unfavorable influence on the liquid for liquid immersion would leach from the resist layer. Patent reference 3 describes an instance of resist performance alteration by immersing a resist for ArF exposure in water before and after the exposure, and in the reference this is noted as being a problem in liquid immersion exposure. Patent reference 4 describes an instance of suppressing the above-mentioned leaching by the addition of a siliconized or fluorinated resin.

Moreover with respect to the liquid immersion exposure process, when exposure is carried out using a scan type liquid immersion exposure machine, the exposure speed would be lowered by a failure of the liquid for liquid immersion to move while following a moving lens. An unfavorable influence thereof on the productivity is apprehended. When the liquid for liquid immersion is water, it is preferred for the resist film to be hydrophobic from the viewpoint of superiority in water following properties.

[Prior Art Literature]

[Patent Reference]

[Patent reference 1] Jpn. Pat. Appln. KOKAI Publication No. (hereinafter referred to as JP-A-) 57-153433,
[Patent reference 2] JP-A-7-220990,
[Patent reference 3] International Publication WO/2004/068242, and
[Patent reference 4] JP-A-2006-309245.

[Non-Patent Reference]

[Non-patent reference 1] Proc. SPIE, 2002, Vol. 4688, page 11,
[Non-patent reference 2] J. Vac. Sci. Tecnol. B 17 (1999), and
[Non-patent reference 3] Proc. SPIE, 2000, Vol. 3999, page 2.

BRIEF SUMMARY OF THE INVENTION

It is an object of the present invention to provide an actinic-ray- or radiation-sensitive resin composition capable of pattern formation that is improved in the pattern collapse, line edge roughness and scum occurrence, being free from any profile deterioration, and that exhibits appropriate following properties for the liquid for liquid immersion at the stage of liquid immersion exposure. Another object of the present invention is to provide a method of forming a pattern with the use of the composition.

The inventor has conducted extensive and intensive studies with a view toward attaining the above objects, and as a result has arrived at the following present invention.

(1) An actinic-ray- or radiation-sensitive resin composition comprising:

(A) a resin that exhibits an increased solubility in an alkali developer when acted on by an acid, (B) a compound that generates an acid when exposed to actinic rays or radiation, (C) a resin containing two or more resins (c) each having at least either a fluorine atom or a silicon atom, and (D) a solvent.

(2) The actinic-ray- or radiation-sensitive resin composition according to item (1), wherein resin (C) contains (c1) a resin having an acid number of below 1.5 and (c2) a resin having an acid number of 1.5 or higher as the resins (c) each having at least either a fluorine atom or a silicon atom.

(3) The actinic-ray- or radiation-sensitive resin composition according to item (1) or item (2), wherein at least one of the resins (c) each having at least either a fluorine atom or a silicon atom has at least any one of the groups represented by the following general formulae (F2) to (F4) and (CS-1) to (CS-3):

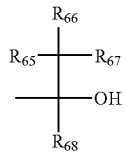

(F2)

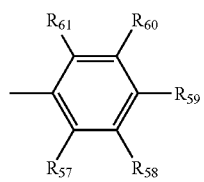

(F3)

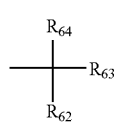

(F4)

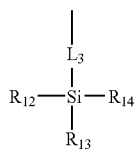

in general formulae (F2) to (F4), each of $R_{57}$ to $R_{68}$ independently represents a hydrogen atom, a fluorine atom, a linear or branched alkyl group, a cycloalkyl group or an aryl group, provided that with respect to each of $R_{57}$-$R_{61}$, $R_{62}$-$R_{64}$ and $R_{65}$-$R_{68}$, at least one thereof represents a fluorine atom or an alkyl group whose at least one hydrogen atom is substituted by a fluorine atom, and that $R_{62}$ and $R_{63}$ may be bonded to each other to thereby form a ring, and (CS-1)

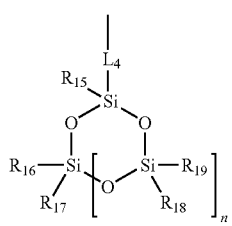

(CS-2)

(CS-3)

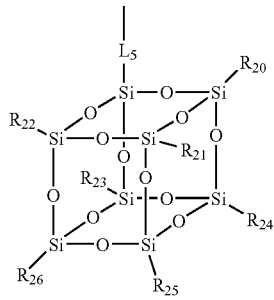

in general formulae (CS-1) to (CS-3), each of $R_{12}$ to $R_{26}$ independently represents a linear or branched alkyl group or a cycloalkyl group;

each of $L_3$ to $L_5$ represents a single bond or a bivalent connecting group; and n is an integer of 1 to 5.

(4) The actinic-ray- or radiation-sensitive resin composition according to item (3), wherein at least one of the resins (c) each having at least either a fluorine atom or a silicon atom contains at least one acrylate or methacrylate repeating unit having any one of the groups represented by general formulae (F2) to (F4) and (CS-1) to (CS-3).

(5) The actinic-ray- or radiation-sensitive resin composition according to any of items (1) to (4), wherein resin (A) contains a repeating unit containing a lactone structure.

(6) The actinic-ray- or radiation-sensitive resin composition any of items (1) to (5), wherein resin (A) has a monocyclic or polycyclic acid-decomposable group.

(7) The actinic-ray- or radiation-sensitive resin composition according to any of items (1) to (6), wherein resin (C) is contained in a ratio of 0.1 to 10 mass % based on the total solid content of the composition.

(8) A method of forming a pattern, comprising the steps of forming the actinic-ray- or radiation-sensitive resin composition according to any of items (1) to (7) into a film, exposing the film with the use of a liquid immersion technique and developing the exposed film.

The present invention has made it feasible to provide a pattern formation that is improved in the pattern collapse, line edge roughness and scum occurrence, suppressing any profile deterioration, and that exhibits appropriate following properties for the liquid for liquid immersion at the stage of liquid immersion exposure.

BRIEF DESCRIPTION OF THE SEVERAL VIEWS OF THE DRAWING

The single FIGURE is a schematic view for illustrating a method of evaluating water following properties.

DETAILED DESCRIPTION OF THE INVENTION

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

In this specification, mass % is equal to weight %. (A) Resin whose solubility in an alkali developer is increased by the action of an acid Resin (A) is a resin whose solubility in an alkali developer is increased by the action of an acid; in particular, a resin having, in its principal chain or side chain, or both of its principal chain and side chain, a group (hereinafter also referred to as "an acid-decomposable group") that is decomposed by the action of an acid to thereby generate an alkali-soluble group.

As the alkali-soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali-soluble groups with an acid eliminable group.

As the acid eliminable group, there can be mentioned, for example, —C($R_{36}$)($R_{37}$)($R_{38}$), —C($R_{36}$)($R_{37}$)(O$R_{39}$), —C($R_{01}$)($R_{02}$)(O$R_{39}$) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

It is preferred for resin (A) to have a repeating unit with an acid-decomposable group. The repeating unit with an acid-decomposable group is preferably any of those of the following general formula (AI).

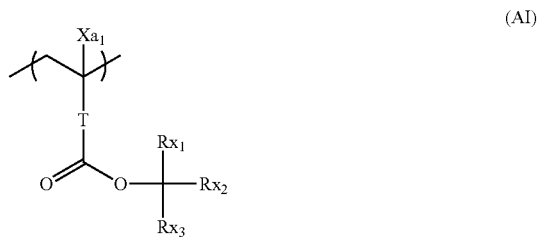

(AI)

In general formula (AI), $Xa_1$ represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded to each other to thereby form a cycloalkyl group (monocyclic or polycyclic).

General formula (AI) will be described in greater detail below.

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

In a preferred mode, $Rx_1$ is a methyl group or an ethyl group, and $Rx_2$ and $Rx_3$ are bonded to each other to thereby form any of the above-mentioned cycloalkyl groups. In another preferred mode, at least one of $Rx_1$ to $Rx_3$ any of the above-mentioned cycloalkyl groups.

The —C($Rx_1$)($Rx_2$)($Rx_3$) group being an acid-decomposable group in general formula (AI) may have at least one of the groups of the formula -(L)$_{n1}$-P as a substituent. In the formula, L represents a bivalent connecting group; $n_1$ is 0 or 1; and P represents a polar group.

As the bivalent connecting group represented by L, there can be mentioned, for example, a linear or branched alkylene group, a cycloalkylene group or the like. The bivalent connecting group represented by L consists of preferably 20 or less, more preferably 15 or less atoms. Each of the linear or branched alkylene group and the cycloalkylene group has preferably 8 or less carbon atoms. Each of the linear or branched alkylene group and the cycloalkylene group may have a substituent. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like.

As the polar group represented by P, there can be mentioned, for example, a group containing a heteroatom, such as a hydroxyl group, a ketone group, a cyano group, an amido group, an alkylamido group, a sulfonamido group, a lower ester group or a lower sulfonato group. Herein, the term "lower" preferably means a group having 2 or 3 carbon atoms. Preferred polar groups are a hydroxyl group, a cyano group and an amido group. A hydroxyl group is more preferred.

As the groups of the formula $-(L)_{n1}-P$ in which $n1=1$, there can be mentioned, for example, a linear or branched alkyl group (preferably having 1 to 10 carbon atoms) and a cycloalkyl group (preferably having 3 to 15 carbon atoms) each having a hydroxyl group, a cyano group, an amino group, an alkylamido group, an acid amido group or a sulfonamido group. An alkyl group (preferably having 1 to 5 carbon atoms, more preferably having 1 to 3 carbon atoms) having a hydroxyl group is preferred.

Specific examples of the groups of the formula $-(L)_{n1}-P$ will be shown below.

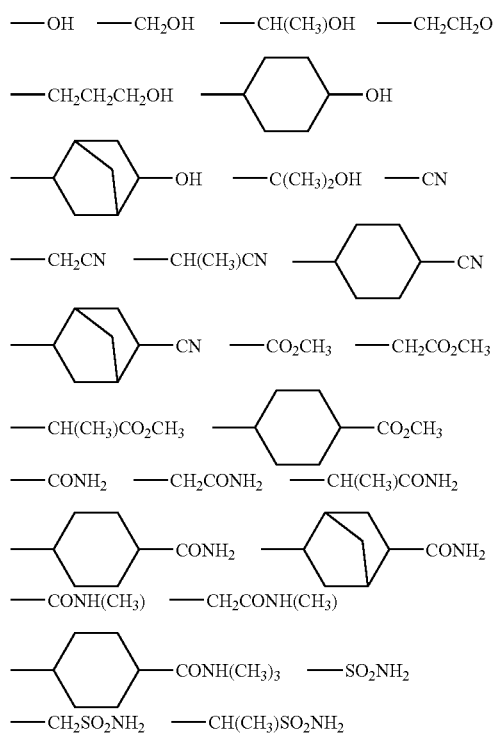

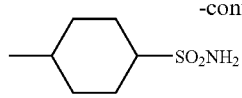

Especially preferably, P represents a hydroxyl group; n1 is 0 or 1; and L represents a linear or branched alkylene group (preferably having 1 to 5 carbon atoms).

Each of the groups of the formula $-C(Rx_1)(Rx_2)(Rx_3)$ contained in general formula (AI) has preferably one to three, more preferably one or two, most preferably one of the groups of the formula $-(L)_{n1}-P$.

It is preferred for the repeating units of general formula (AI) to be the repeating units of the following general formula (1-1).

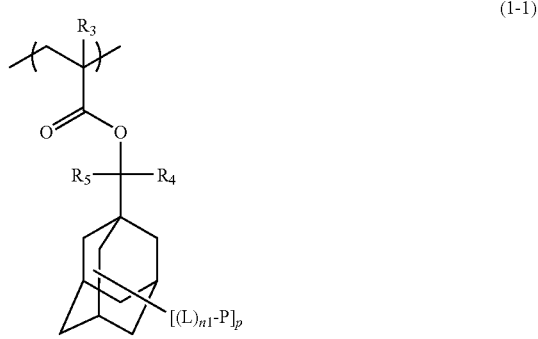

In general formula (1-1), $R_3$ has the same meaning as $X_{a1}$ of general formula (AI).

$R_4$ and $R_5$ have the same meaning as $Rx_1$ and $Rx_2$ of general formula (1).

The groups of the formula $-(L)_{n1}-P$ are the same as the groups of the formula $-(L)_{n1}-P$ of general formula (AI).

Further, p is an integer of 1 to 3, preferably 1 or 2, more preferably 1.

The monomers corresponding to the repeating units of general formula (AI) can be synthesized by, for example, the method described in JP-A-2006-16379.

The content of each of the repeating units with acid-decomposable groups is preferably in the range of 20 to 50 mol %, more preferably 25 to 45 mol %, based on all the repeating units of resin (A).

Specific examples of the preferred repeating units with acid-decomposable groups will be shown below, which however in no way limit the scope of the present invention.

In the following formulae, Rx represents H, $CH_3$, $CF_3$ or $CH_2OH$. Each of Rxa and Rxb independently represents an alkyl group having 1 to 4 carbon atoms.

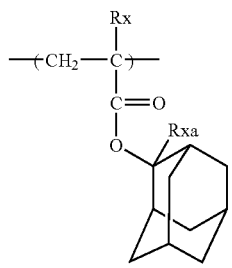

1

-continued

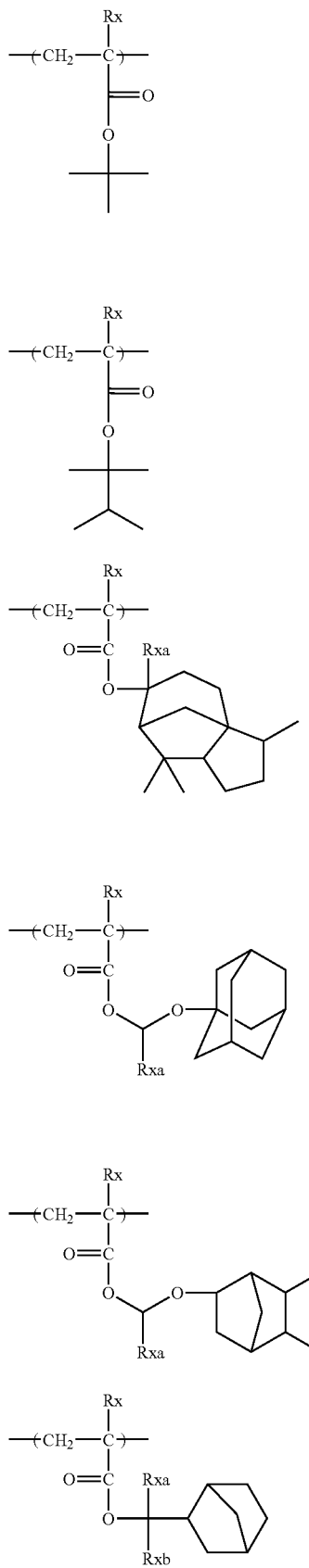
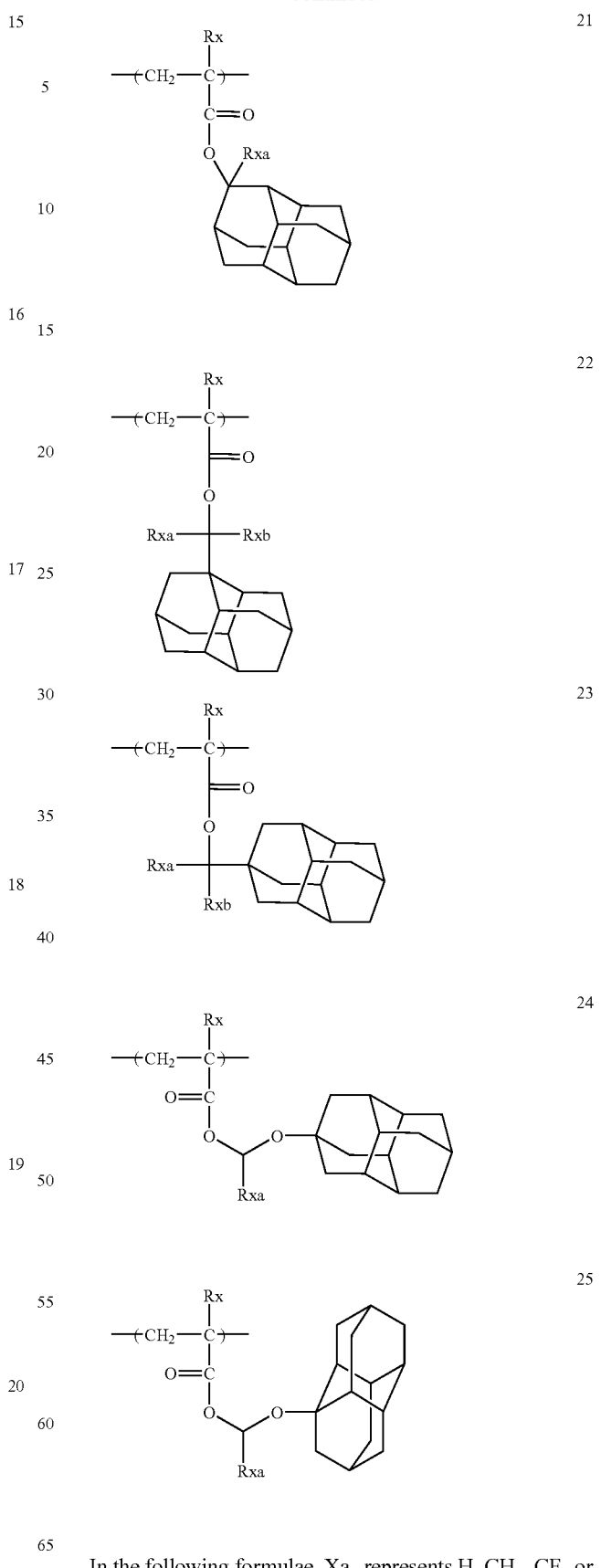
In the following formulae, Xa$_1$ represents H, CH$_3$, CF$_3$ or CH$_2$OH.

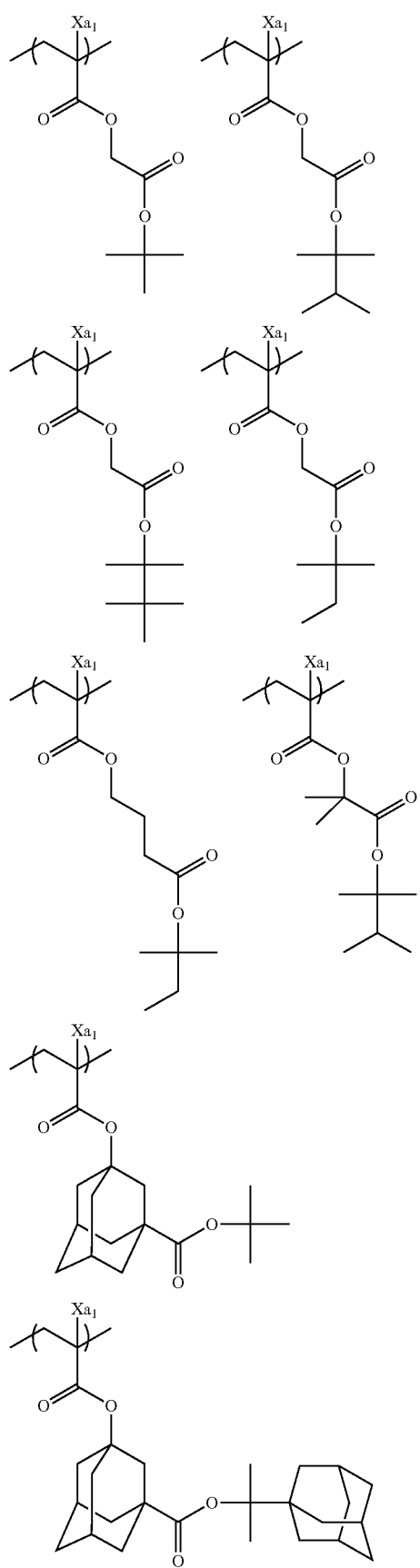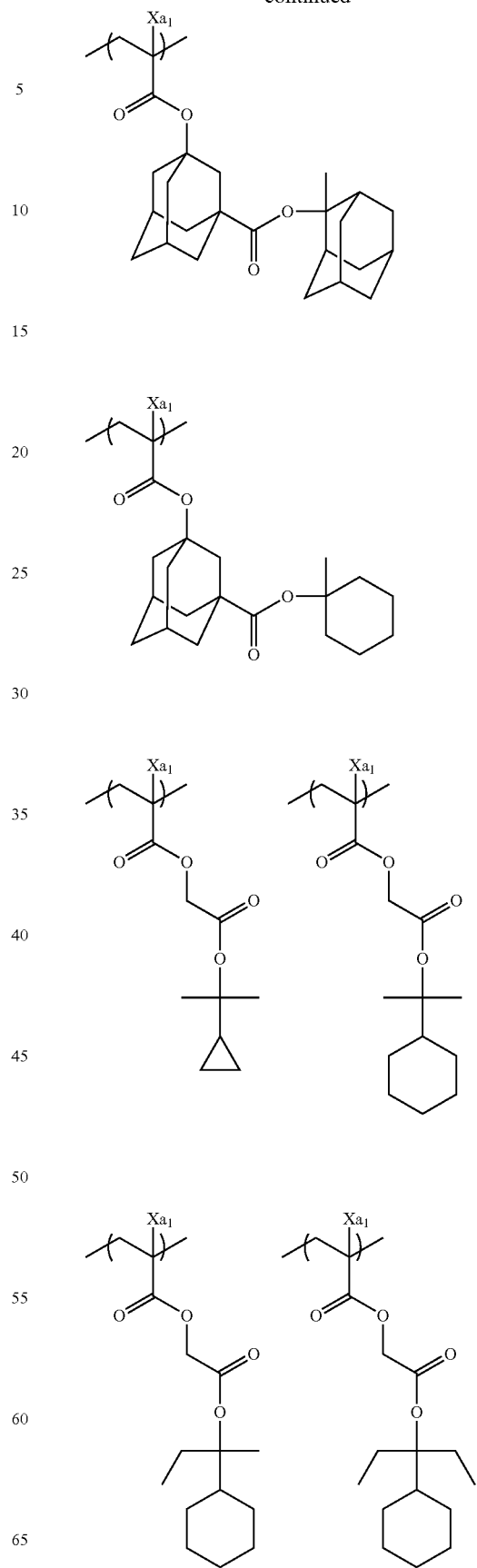

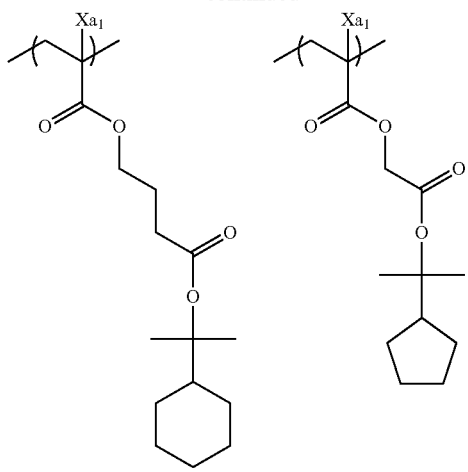
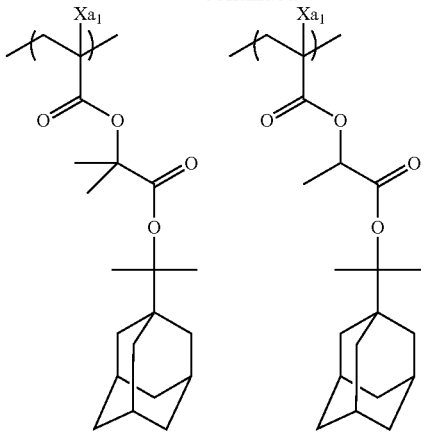
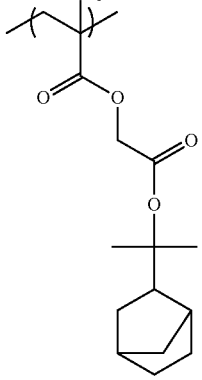
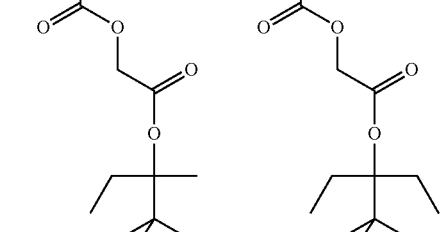
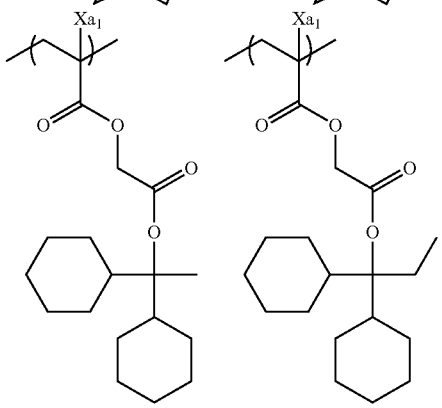

-continued
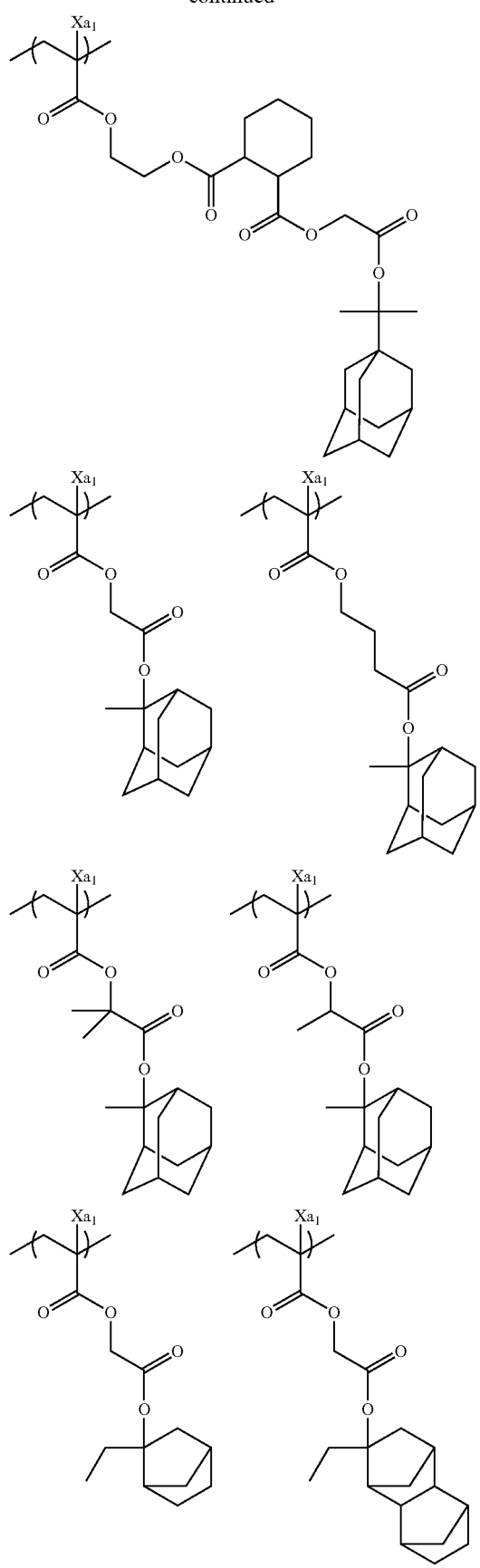
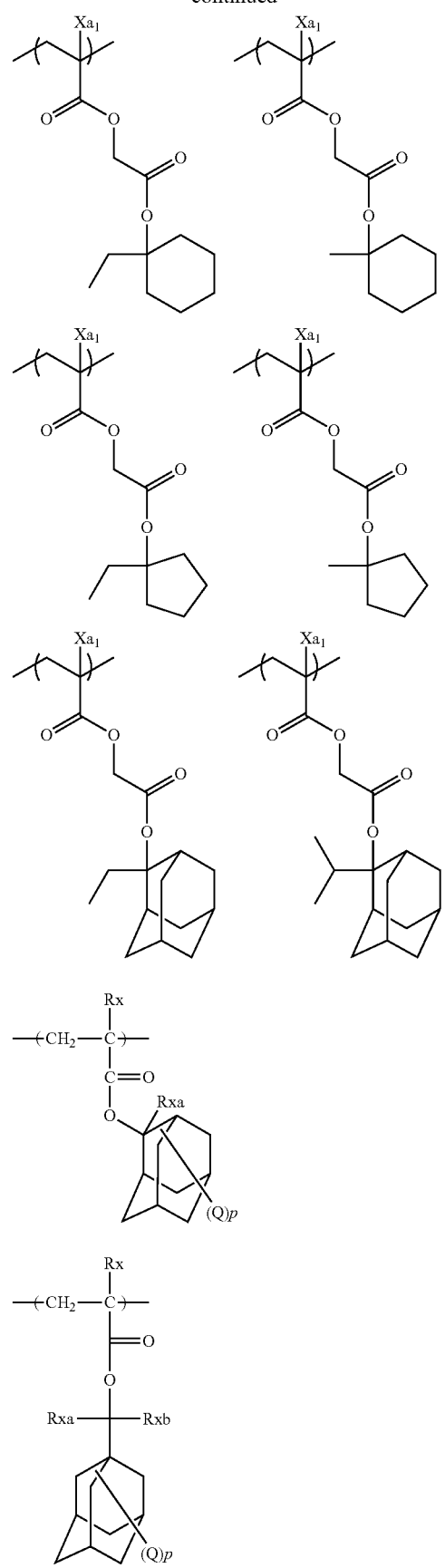

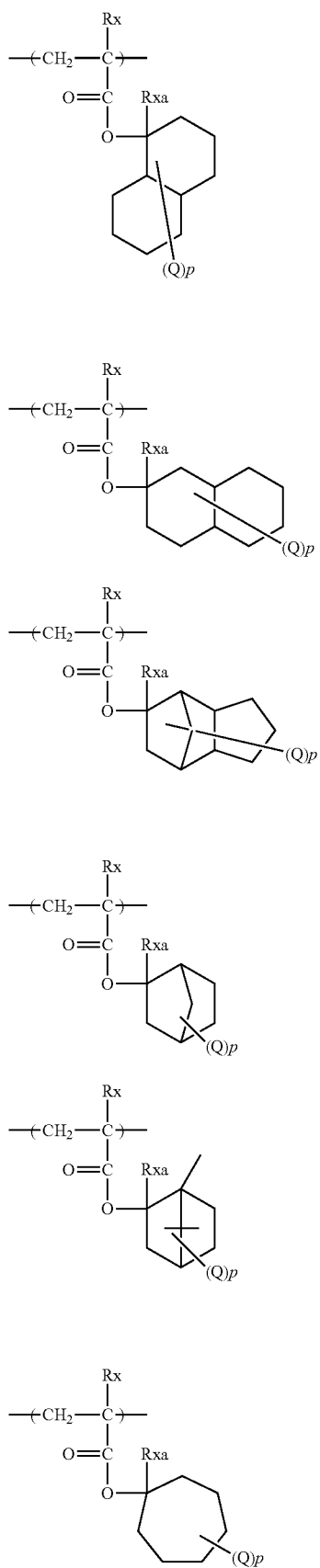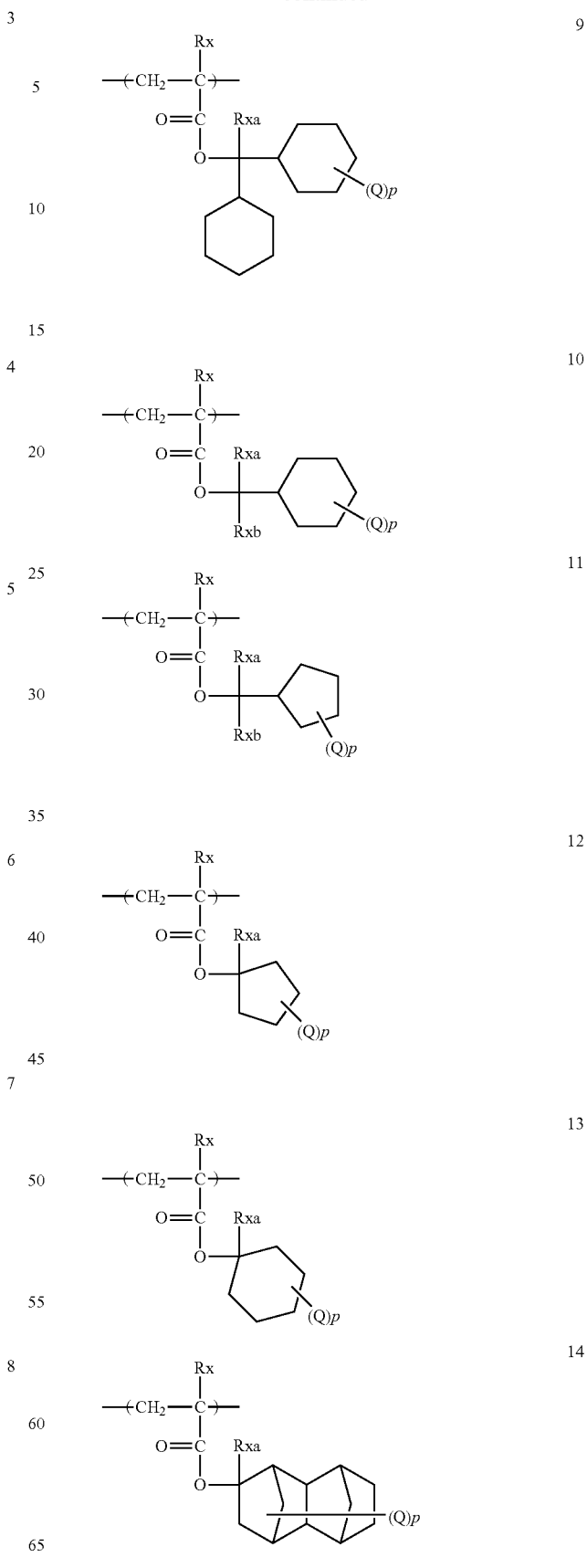

-continued

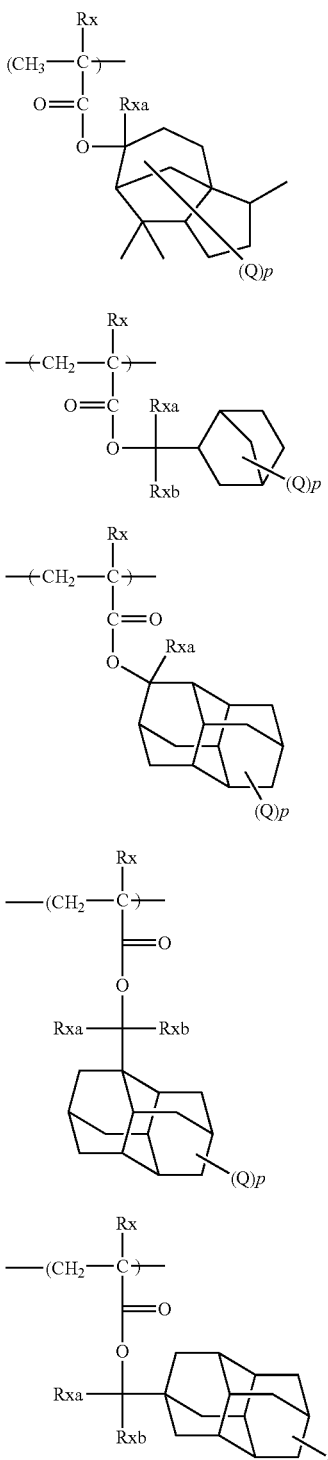

In the above structural formulae, Q represents any of the groups of the formula -(L)$_{n1}$-P (L, P and n1 are as defined in general formula (I). Rx represents a hydrogen atom, CH$_3$, CF$_3$ or CH$_2$OH. Each of Rxa and Rxb independently represents an alkyl group having 1 to 4 carbon atoms. When multiple groups are represented by each thereof, they may be identical to or different from each other. In the formulae, p is an integer of 1 to 3.

It is preferred for resin (A) to further have a repeating unit having at least one group selected from among a lactone group, a hydroxyl group, a cyano group and an alkali-soluble group.

The repeating unit having a lactone group that may be contained in resin (A) will now be described.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in the line edge roughness and development defect.

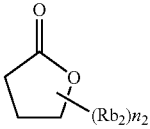

LC1-1

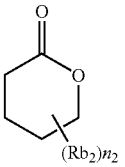

LC1-2

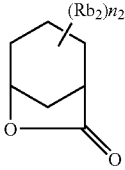

LC1-3

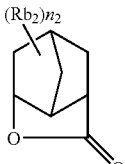

LC1-4

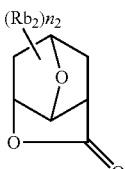

LC1-5

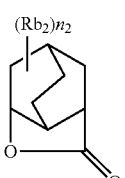

LC1-6

LC1-7 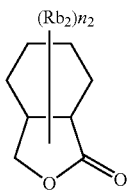

LC1-8 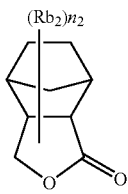

LC1-9 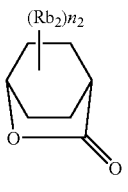

LC1-10 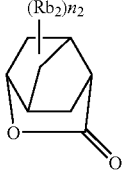

LC1-11 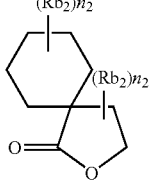

LC1-12 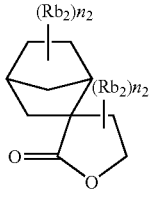

LC1-13 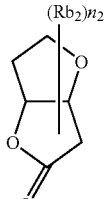

LC1-14 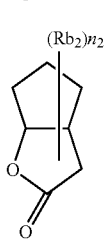

LC1-15 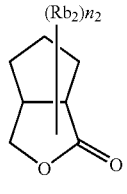

LC1-16 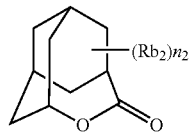

LC1-17 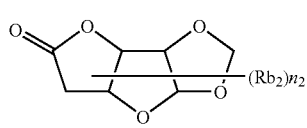

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

As the repeating units with a lactone structure represented by any of general formulae (LC1-1) to (LC1-17), there can be mentioned the repeating units represented by the following general formula (AII).

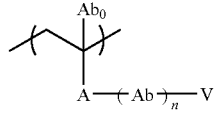

(AII)

In general formula (AII), $Ab_0$ represents a hydrogen atom, a halogen atom or an optionally substituted alkyl group having 1 to 4 carbon atoms. As a preferred substituent optionally contained in the alkyl group represented by $Ab_0$, there can be mentioned a hydroxyl group or a halogen atom. As the halogen atom represented by $Ab_0$, there can be mentioned a fluorine atom, a chlorine atom, a bromine atom or an iodine atom. The $Ab_0$ is preferably a hydrogen atom, a methyl group, a hydroxymethyl group or a trifluoromethyl group. A hydrogen atom and a methyl group are especially preferred.

A represents a —COO— group or a —CONH— group.

Ab represents a single bond, an alkylene group, a bivalent connecting group with an alicyclic hydrocarbon structure of a single ring or multiple rings, an ether group, an ester group, a carbonyl group, an amido bond, a urethane bond, a urea bond, or a bivalent connecting group resulting from combination thereof. A single bond and a bivalent connecting group of the formula -$Ab_1$-$CO_2$— are preferred.

Ab$_1$ is a linear or branched alkylene group or a monocyclic or polycyclic alkylene group, being preferably a methylene group, an ethylene group, a cyclohexylene group, an adamantylene group or a norbornylene group.

In the general formula, n is an integer of 1 to 5, preferably 1 or 2, more preferably 1.

V represents a group with a structure represented by any of general formulae (LC1-1) to (LC1-17).

Specific examples of the repeating units having a lactone group will now be shown, which however in no way limit the scope of the present invention. In the formulae, Rx represents H, CH$_3$, CH$_2$OH or CF$_3$.

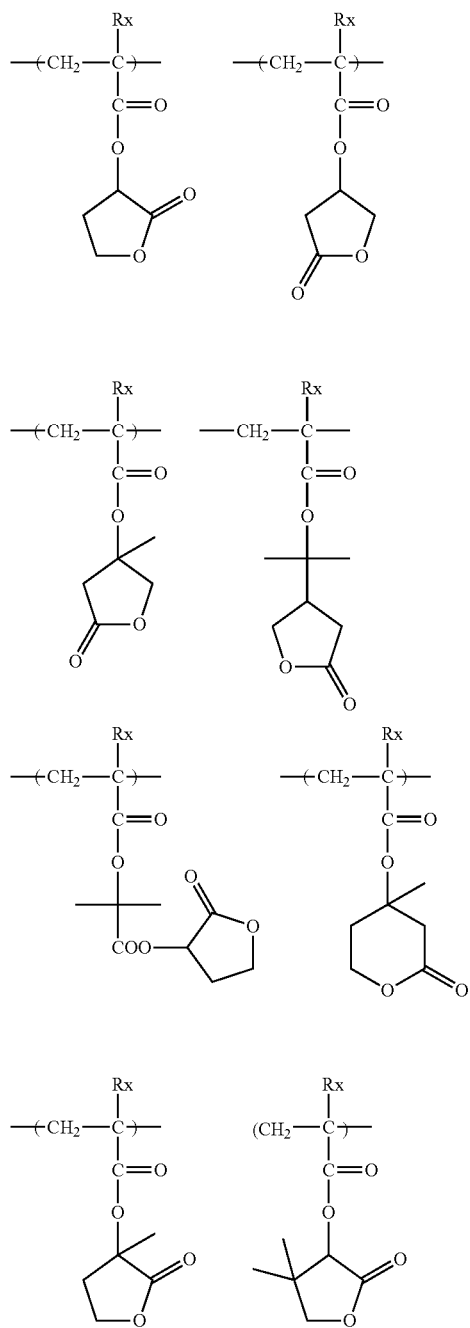

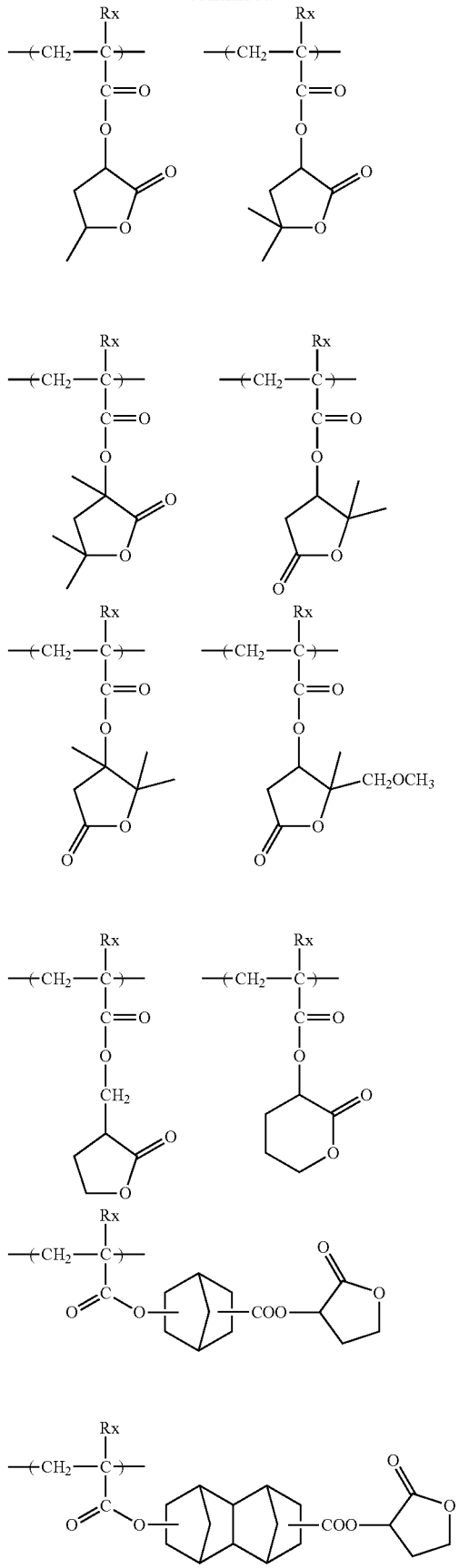

27
-continued
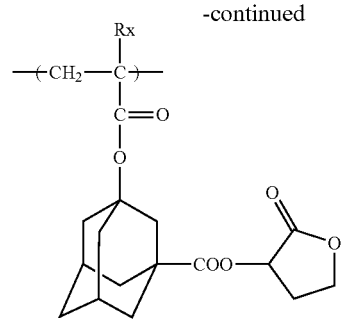
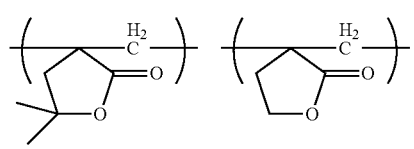
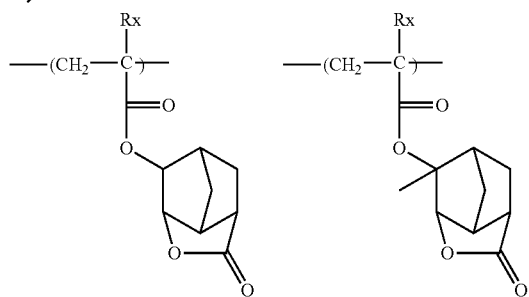
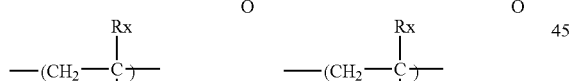
28
-continued
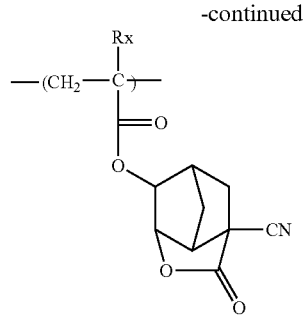
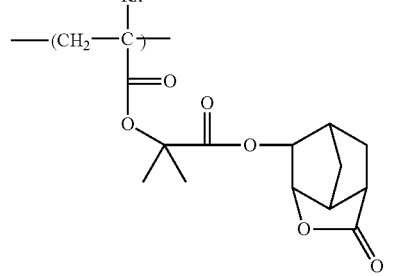
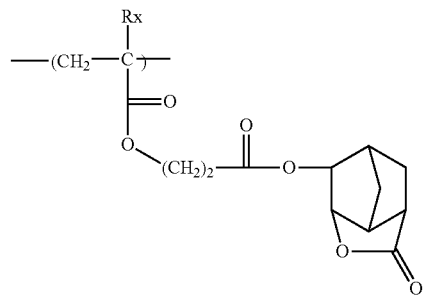
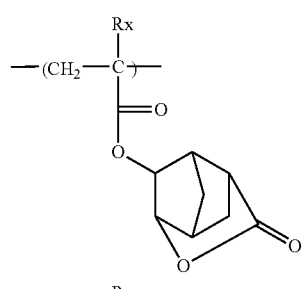
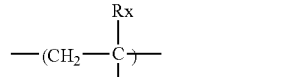
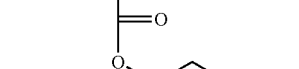
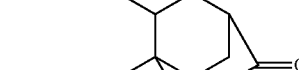

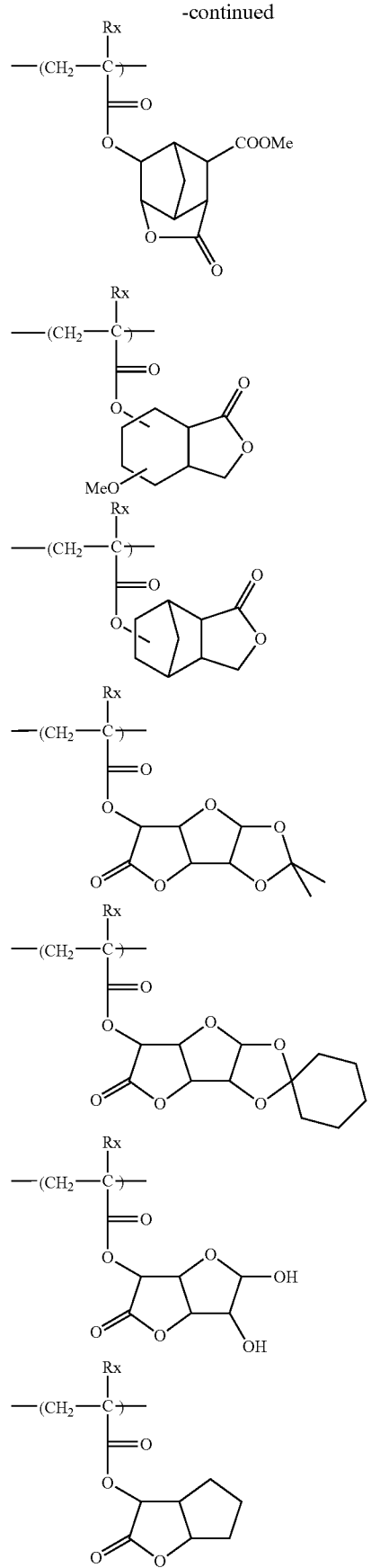
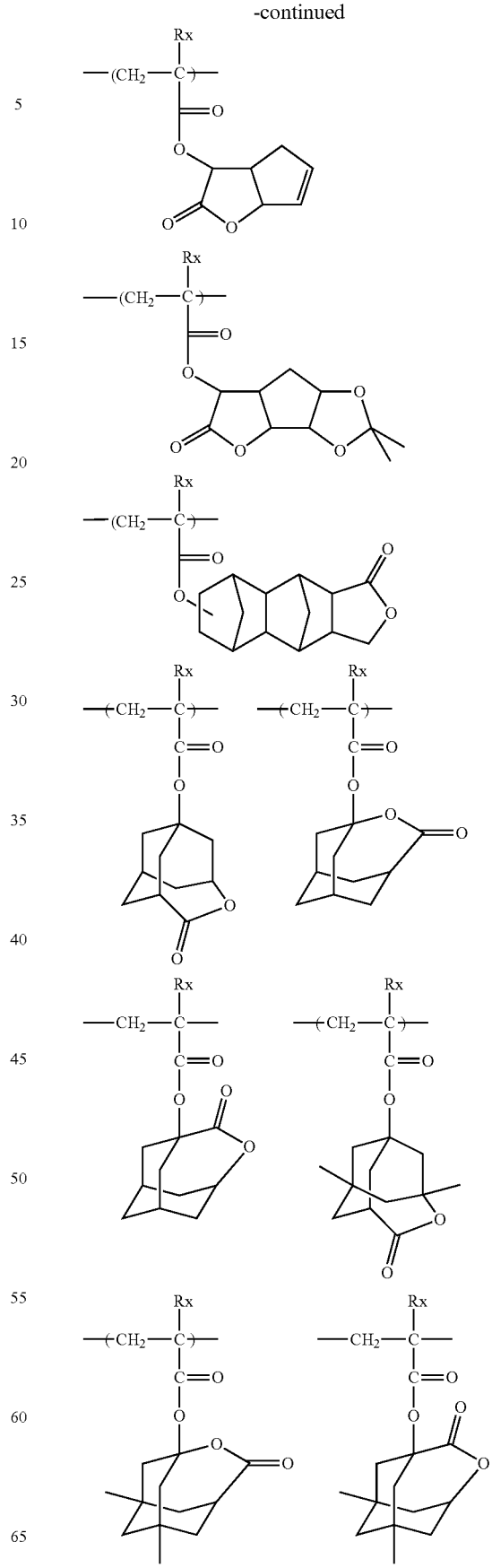

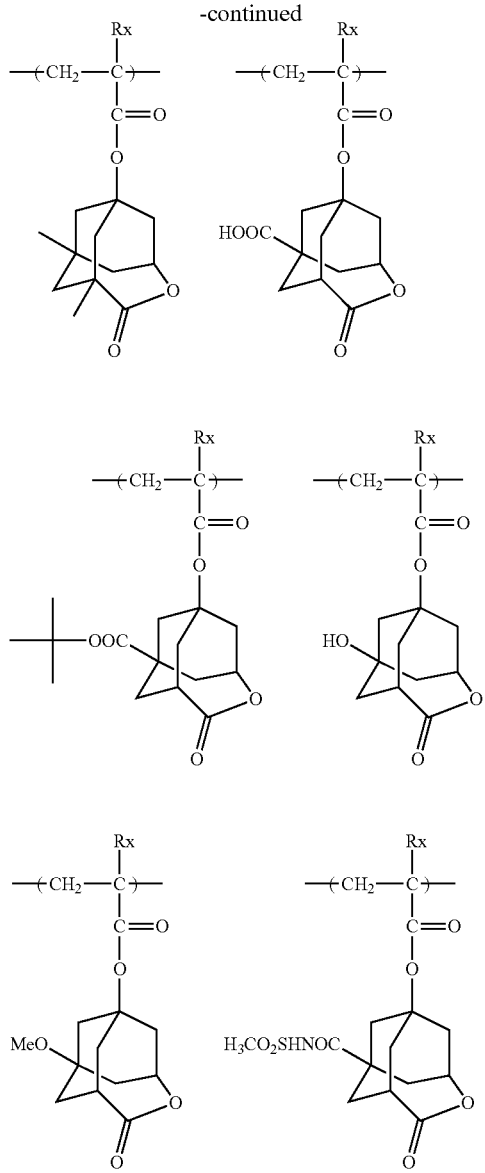
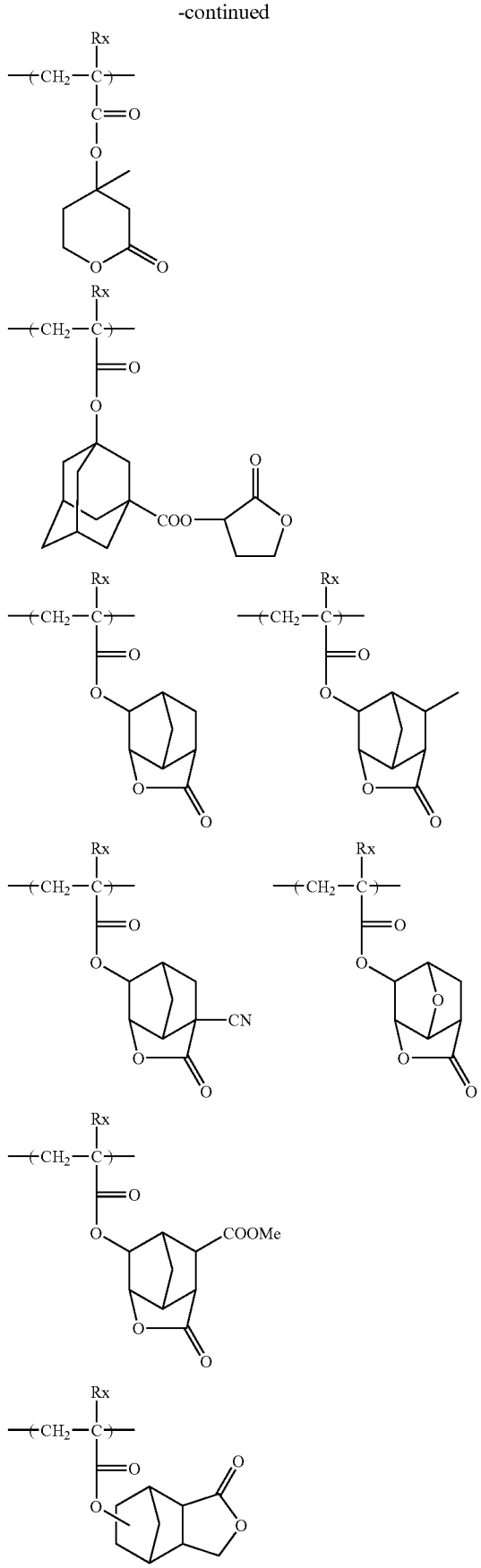
The repeating units having an especially preferred lactone group will be shown below. An improvement in pattern profile and optical density dependence can be attained by selection of the most appropriate lactone group. In the formulae, Rx represents H, CH₃, CH₂OH or CF₃.
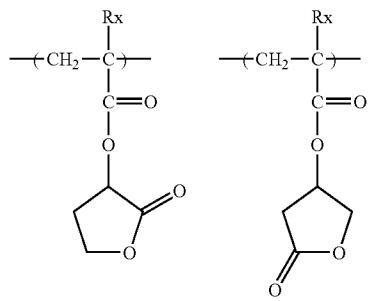

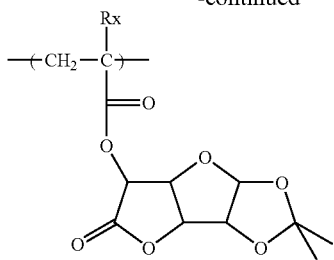

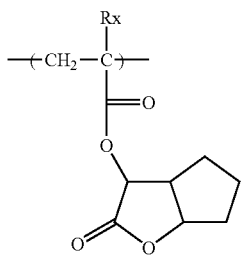

It is preferred for resin (A) to contain any of the repeating units having a lactone group represented by the following general formula (3).

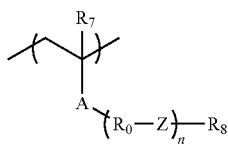

(3)

In formula (3),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, a carbonyl group, an amido bond, a urethane bond or a urea bond.

$R_8$ represents a monovalent organic group with a lactone structure.

n represents the number of repetitions of the structure of the formula —$R_0$—Z— in any of the repeating units of formula (3) and is an integer of 1 to 5. n is preferably 1 or 2, more preferably 1.

$R_7$ represents a hydrogen atom, a halogen atom or an optionally substituted alkyl group.

Each of the alkylene group and cycloalkylene group represented by $R_0$ may have a substituent.

Z preferably represents an ether bond or an ester bond, most preferably an ester bond.

The alkyl group represented by $R_7$ is preferably an alkyl group having 1 to 4 carbon atoms, more preferably a methyl group or an ethyl group and most preferably a methyl group. The alkyl group represented by $R_7$ may be substituted. As substituents on $R_7$, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyl group such as an acetyl group or a propionyl group, an acetoxy group and the like. $R_7$ preferably represents a hydrogen atom, a methyl group, a trifluoromethyl group or a hydroxymethyl group.

The alkylene group represented by $R_0$ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The substituent with a lactone structure represented by $R_8$ is not limited as long as the lactone structure is contained. As particular examples thereof, there can be mentioned the lactone structures of the above general formulae (LC1-1) to (LC1-17). Of these, the structures of general formula (LC1-4) are most preferred. In general formulae (LC1-1) to (LC1-17), $n_2$ is more preferably 2 or less.

$R_8$ preferably represents a monovalent organic group with an unsubstituted lactone structure or a monovalent organic group with a lactone structure substituted with a methyl group, a cyano group or an alkoxycarbonyl group. More preferably, $R_8$ represents a monovalent organic group with a lactone structure substituted with a cyano group (cyanolactone).

Specific examples of the repeating units having groups with a lactone structure of general formula (3) will be shown below, which however in no way limit the scope of the present invention.

In the following specific examples, R represents a hydrogen atom, an optionally substituted alkyl group or a halogen atom. Preferably, R represents a hydrogen atom, a methyl group, or a hydroxymethyl or acetoxymethyl group as a substituted alkyl group.

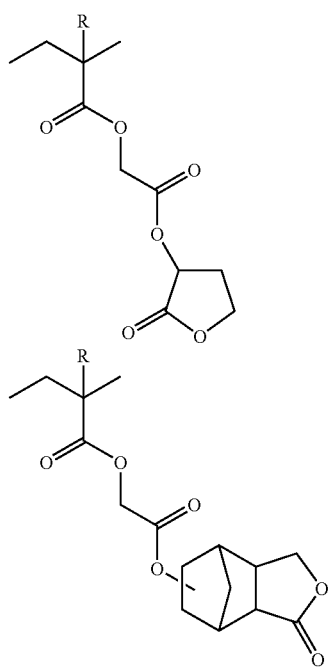

-continued

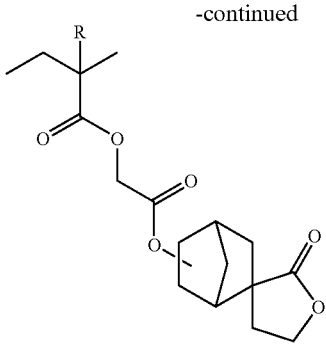

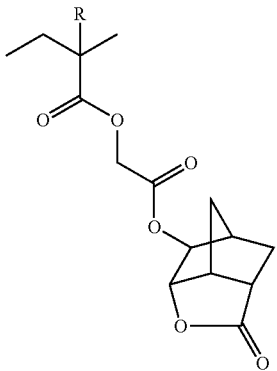

As more preferred repeating units with a lactone structure, there can be mentioned the repeating units of the following general formula (3-1).

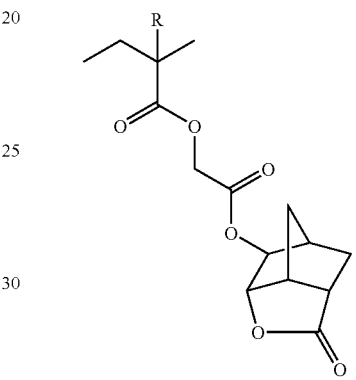

(3-1)

In general formula (3-1), $R_7$, A, $R_0$, Z and n are as defined above with respect to general formula (3).

$R_9$, each independently in the presence of two or more groups, represents an alkyl group, a cycloalkyl group, an alkoxycarbonyl group, a cyano group, a hydroxyl group or an alkoxy group. In the presence of two or more groups, two $R_9$s may be bonded to each other to thereby form a ring.

X represents an alkylene group, an oxygen atom or a sulfur atom, and m is the number of substituents and is an integer of 0 to 5. Preferably, m is 0 or 1. When m=1, the $R_9$ substitution site is preferably the α- or Deposition of carbonyl group on the lactone. The α-position of carbonyl group is especially preferred.

The alkyl group represented by $R_9$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the ester group, there can be mentioned a methoxycarbonyl group, an ethoxycarbonyl group, an n-butoxycarbonyl group, a t-butoxycarbonyl group or the like. As the substituent therefor, there can be mentioned a hydroxyl group, an alkoxy group such as a methoxy group or an ethoxy group, a cyano group, or a halogen atom such as a fluorine atom. More preferably, $R_9$ represents a methyl group, a cyano group or an alkoxycarbonyl group, still more preferably a cyano group.

As the alkylene group represented by X, there can be mentioned a methylene group, an ethylene group or the like. Preferably, X represents an oxygen atom or a methylene group, more preferably a methylene group.

Specific examples of the repeating units having groups with a lactone structure expressed by general formula (3-1) will be shown below, which however in no way limit the scope of the present invention.

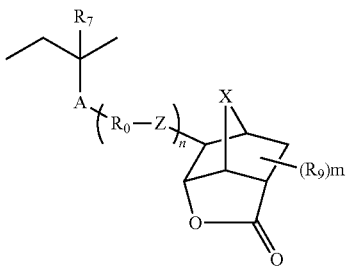

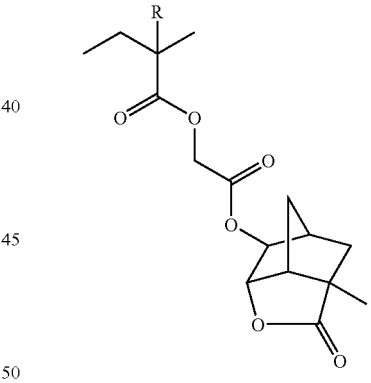

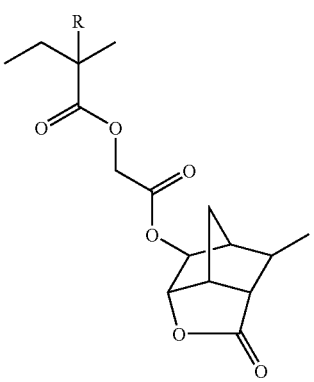

| 37 | 38 |
|---|---|
| -continued | -continued |
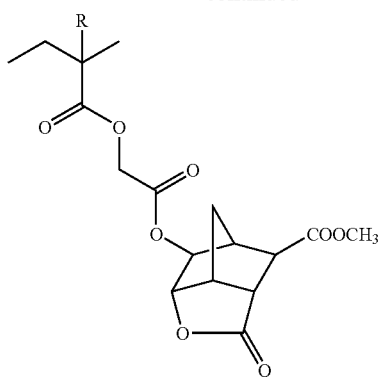
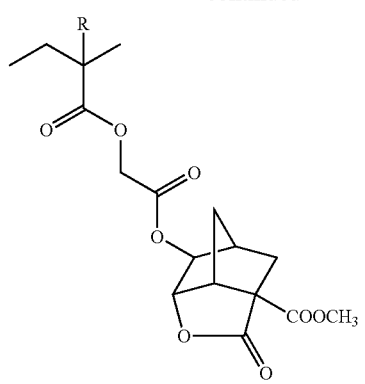
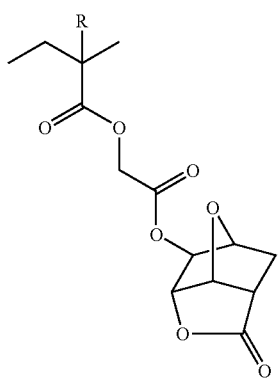
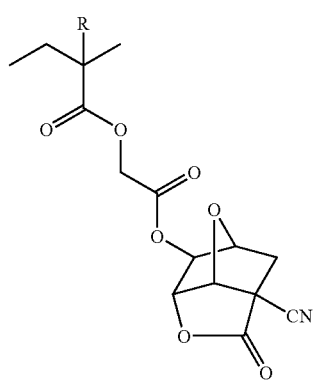
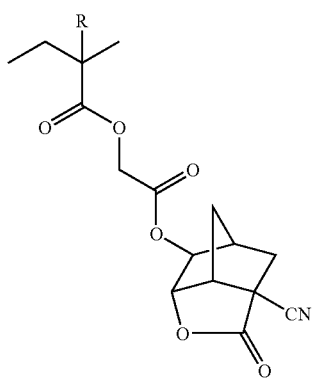
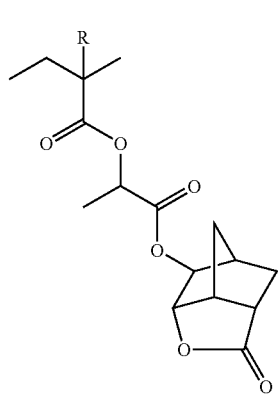
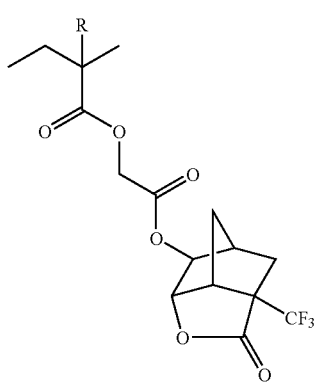
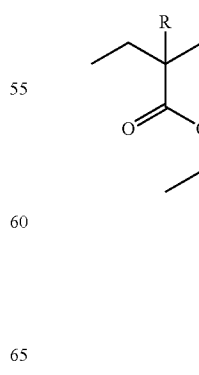

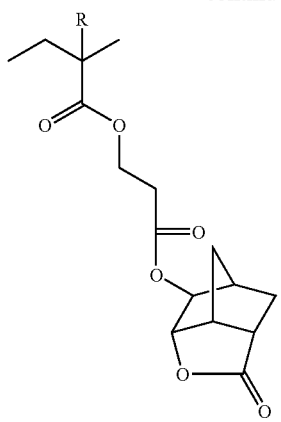
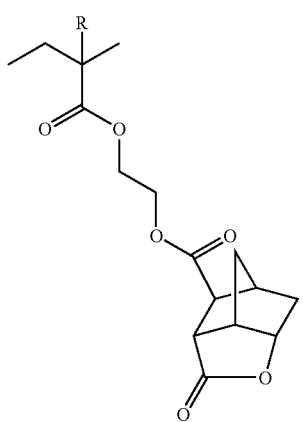
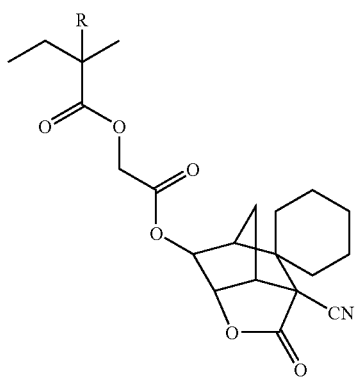
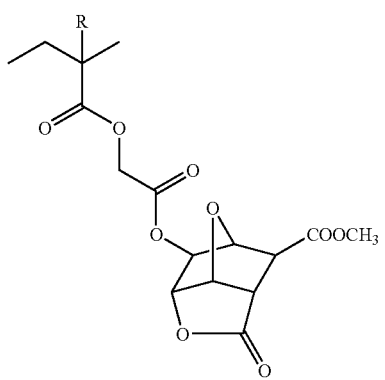
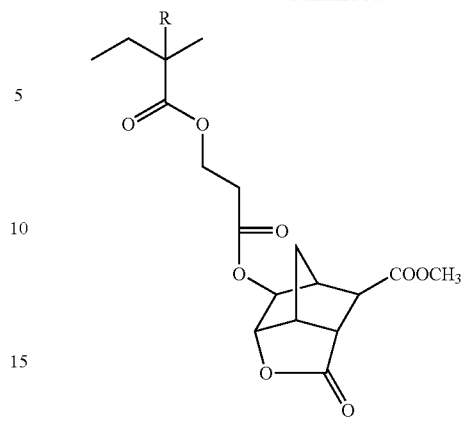
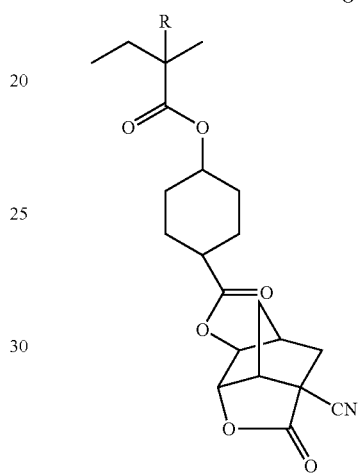
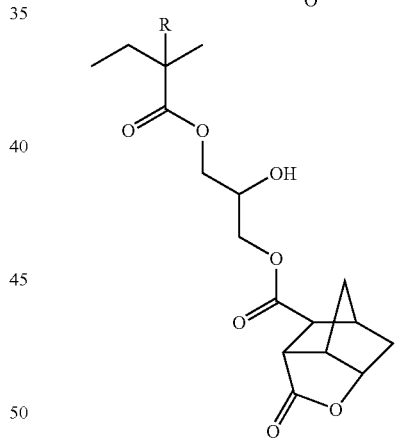
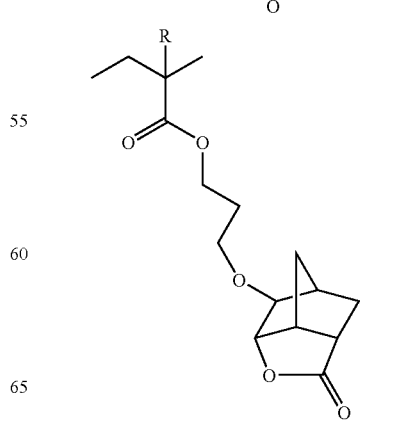

-continued

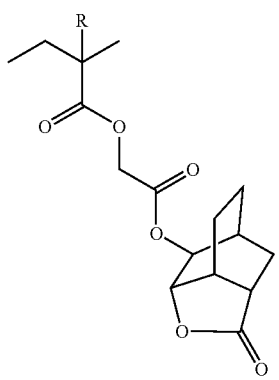

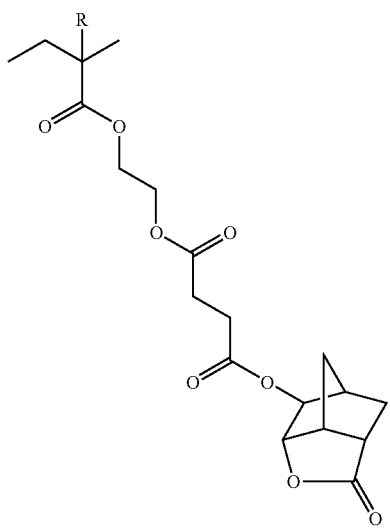

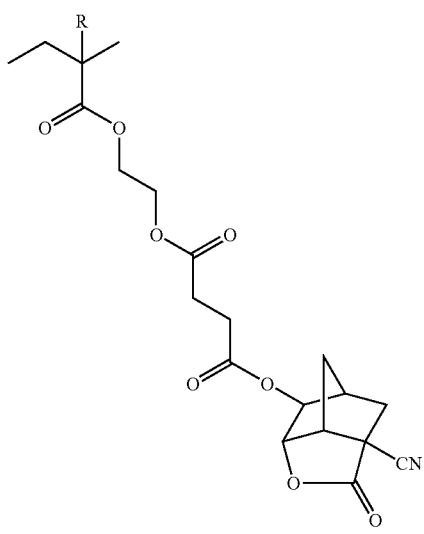

-continued

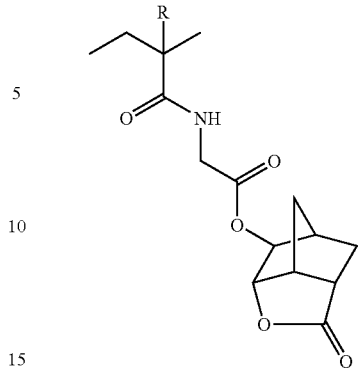

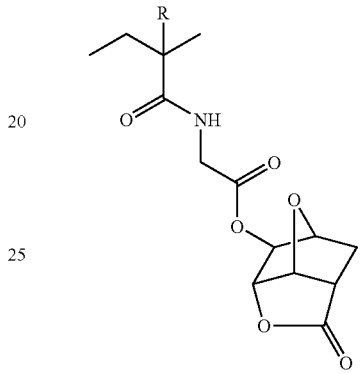

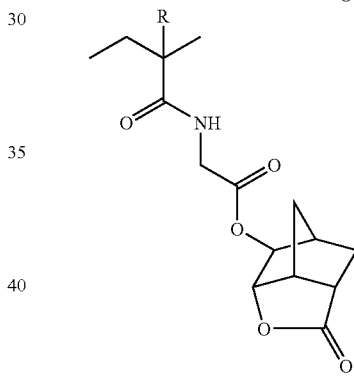

Each of the repeating units having a lactone group is generally present in the form of optical isomers. Any of the optical isomers may be used. It is appropriate to use both a single type of optical isomer alone and a plurality of optical isomers in the form of a mixture. When a single type of optical isomer is mainly used, the optical purity (ee) thereof is preferably 90 or higher, more preferably 95 or higher.

Two or more lactone repeating units selected from among those of general formula (3) can be simultaneously used in order to enhance the effect of the present invention. In the event of the simultaneous use, it is preferred to simultaneously use two or more members selected from among the lactone repeating units of general formula (3) wherein n is 1.

The content of repeating unit having a lactone group based on all the repeating units of resin (A) is preferably in the range of 15 to 60 mol %, more preferably 20 to 50 mol % and still more preferably 30 to 50 mol %.

Preferably, resin (A) contains a repeating unit having a hydroxyl group or a cyano group, not included in general formulae (AI) and (AII). The containment of this repeating unit would realize enhancements of adhesion to substrate and developer affinity. The repeating unit having a hydroxyl group or a cyano group is preferably a repeating unit having an alicyclic hydrocarbon structure substituted with a hydroxyl group or a cyano group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of the following formulae (VIIa) to (VIId).

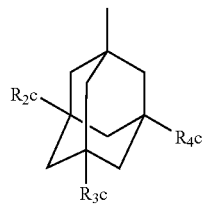

(VIIa)

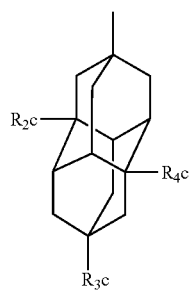

(VIIb)

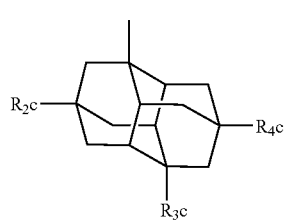

(VIIc)

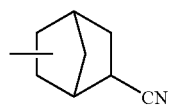

(VIId)

In general formulae (VIIa) to (VIIc), each of $R_{2c}$ to $R_{4c}$ independently represents a hydrogen atom, a hydroxyl group or a cyano group, providing that at least one of the $R_{2c}$ to $R_{4c}$ represents a hydroxyl group or a cyano group.

Preferably, one or two of the $R_{2c}$ to $R_{4c}$ are hydroxyl groups and the remainder is a hydrogen atom. In general formula (VIIa), more preferably, two of the $R_{2c}$ to $R_{4c}$ are hydroxyl groups and the remainder is a hydrogen atom.

As the repeating units having any of the partial structures of formulae (VIIa) to (VIId), there can be mentioned those of the following general formulae (AIIa) to (AIId).

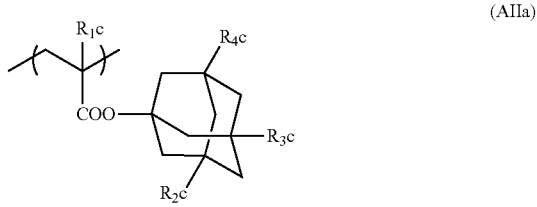

(AIIa)

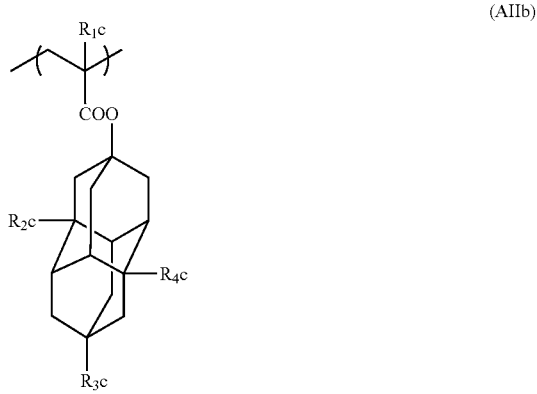

(AIIb)

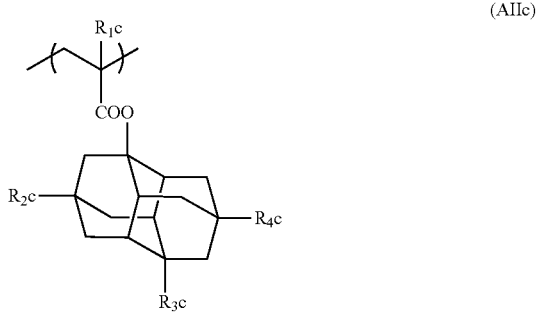

(AIIc)

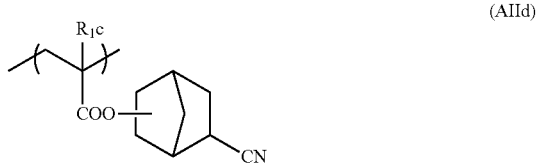

(AIId)

In general formulae (AIIa) to (AIId), $R_1c$ represents a hydrogen atom, a methyl group, a trifluoromethyl group or a hydroxymethyl group.

$R_2c$ to $R_4c$ have the same meaning as those of general formulae (VIIa) to (VIIc).

The content of the repeating unit having a hydroxyl group or a cyano group, based on all the repeating units of resin (A), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

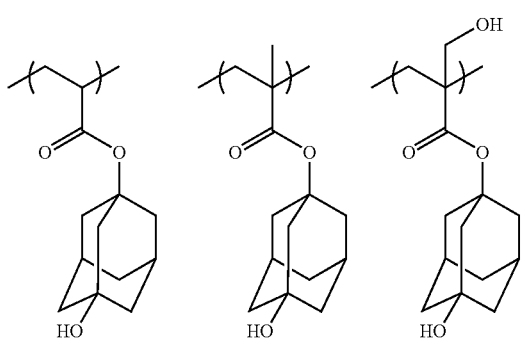
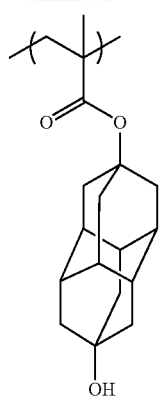
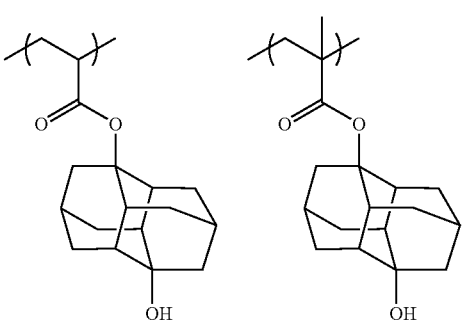

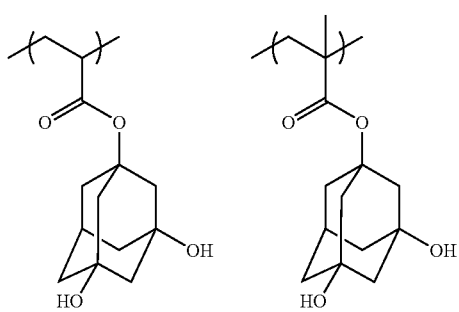

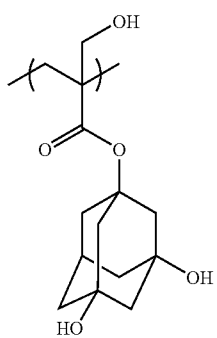

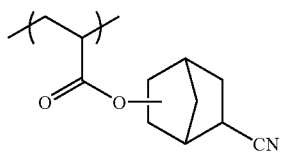
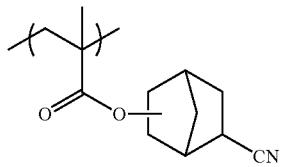
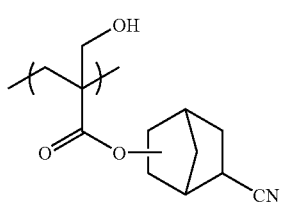

It is preferred for resin (A) to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a monocyclic or polycyclic hydrocarbon structure. The repeating unit of acrylic acid or methacrylic acid is especially preferred.

The content of the repeating unit having an alkali-soluble group based on all the repeating units of resin (A) is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, $CH_3$, $CF_3$, or $CH_2OH$.

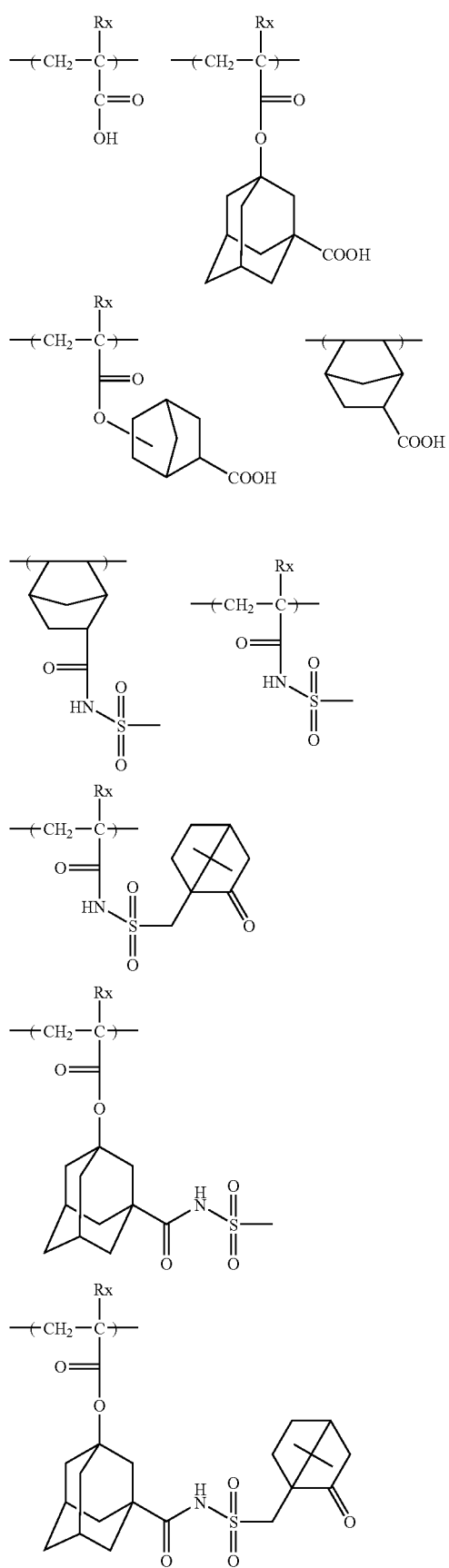
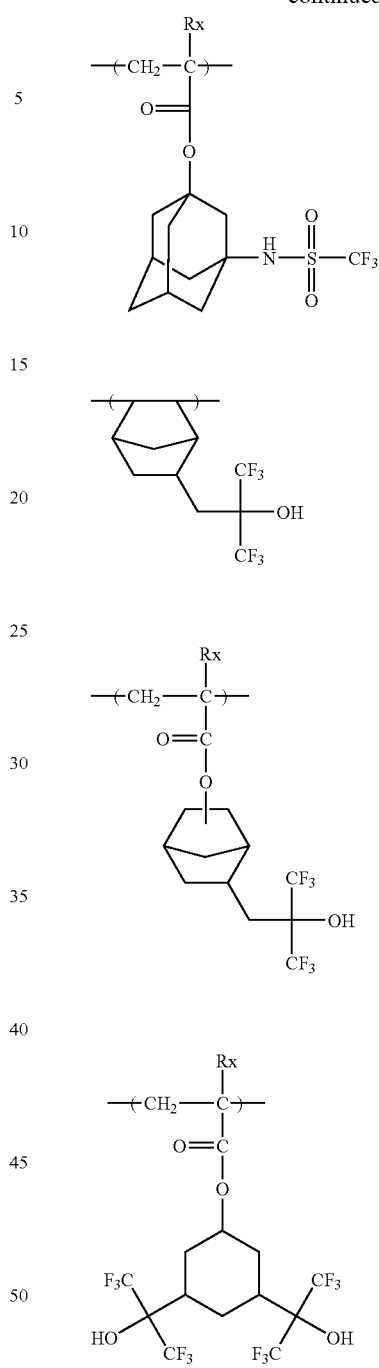

The repeating unit having at least one group selected from among a lactone group, a hydroxyl group, a cyano group and an alkali-soluble group is preferably a repeating unit having at least two groups selected from among a lactone group, a hydroxyl group, a cyano group and an alkali-soluble group and more preferably a repeating unit having a cyano group and a lactone group. A repeating unit of the structure wherein above lactone structure (LC1-4) is substituted with a cyano group is especially preferred.

Resin (A) preferably further contains any of the repeating units of general formula (I) having neither a hydroxyl group nor a cyano group.

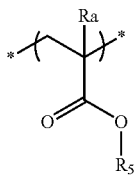

(I)

In general formula (I), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. For example, Ra represents a hydrogen atom, a methyl group, a trifluoromethyl group, a hydroxymethyl group or the like.

The cyclic structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group are more preferred.

The polycyclic hydrocarbon groups include ring-assembly hydrocarbon groups and crosslinked-ring hydrocarbon groups. Examples of the ring-assembly hydrocarbon groups include a bicyclohexyl group, a perhydronaphthalene group and the like. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenarene rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content of any of the repeating units of general formula (I) having neither a hydroxyl group nor a cyano group, based on all the repeating units of resin (A), is preferably in the range of 0 to 40 mol %, more preferably 0 to 20 mol %.

Specific examples of the repeating units of general formula (I) will be shown below, which however in no way limit the scope of the present invention. In the formulae, Ra represents H, $CH_3$, $CH_2OH$ or $CF_3$.

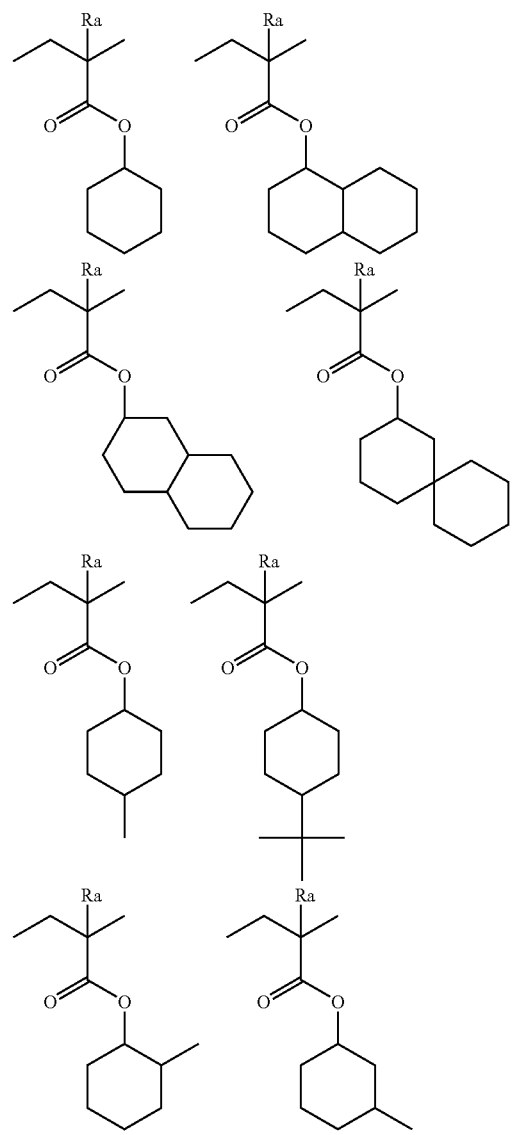

-continued

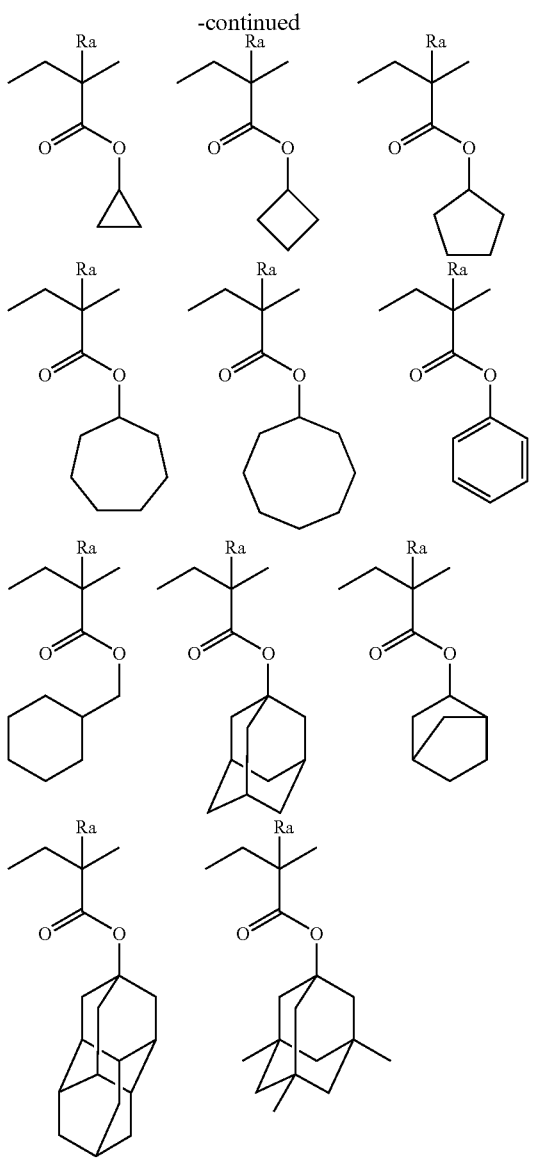

Resin (A) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of resin (A), especially:

(1) solubility in applied solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in resin (A) are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the actinic-ray- or radiation-sensitive resin composition of the present invention is one for ArF exposure, it is preferred for resin (A) to have no aromatic group from the viewpoint of transparency to ArF beams.

From the viewpoint of the compatibility with resin (C) to be described hereinafter, it is preferred for resin (A) to contain neither a fluorine atom nor a silicon atom.

In resin (A), preferably, all the repeating units consist of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. It is more preferred to employ a copolymer containing 20 to 50 mol % of (meth)acrylate repeating units having an acid-decomposable group according to general formula (AI), 20 to 50 mol % of (meth)acrylate repeating units having a lactone group, 5 to 30 mol % of (meth)acrylate repeating units having an alicyclic hydrocarbon structure substituted with a hydroxyl group or a cyano group and 0 to 20 mol % of other (meth)acrylate repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for resin (A) to have not only the repeating units of general formula (AI) but also hydroxystyrene repeating units. More preferably, resin (A) has hydroxystyrene repeating units, hydroxystyrene repeating units protected by an acid-decomposable group and acid-decomposable repeating units of a (meth)acrylic acid tertiary alkyl ester, etc.

As preferred repeating units having an acid-decomposable group, there can be mentioned, for example, repeating units derived from t-butoxycarbonyloxystyrene, a 1-alkoxy-ethoxystyrene and a (meth)acrylic acid tertiary alkyl ester. Repeating units derived from a 2-alkyl-2-adamantyl (meth)acrylate and a dialkyl(1-adamantyl)methyl (meth)acrylate are more preferred.

Resin (A) can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of resin (A) in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is generally in the range of 1 to 3, preferably 1 to 2.6, more preferably 1 to 2 and most preferably 1.4 to 1.7. The lower the molecular weight distribution, the more excellent the resolving power and resist profile and the smoother the side wall of the resist pattern to thereby attain an excellence in roughness.

In the actinic-ray- or radiation-sensitive resin composition of the present invention, the amount of resin (A) contained in the whole composition based on the total solid content is preferably in the range of 50 to 99 mass %, more preferably 70 to 98 mass %.

In the present invention, the resins (A) may be used either individually or in combination.

(B) Compound that when Exposed to Actinic Rays or Radiation, Generates an Acid

The actinic-ray- or radiation-sensitive resin composition of the present invention contains a compound that when exposed to actinic rays or radiation, generates an acid (hereinafter also referred to as an "acid generator").

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

Further, use can be made of compounds obtained by introducing any of the above groups or compounds that when exposed to actinic rays or radiation, generate an acid in a polymer principal chain or side chain, for example, compounds described in U.S. Pat. No. 3,849,137, DE 3914407, JP-As 63-26653, 55-164824, 62-69263, 63-146038, 63-163452, 62-153853, 63-146029, etc.

Furthermore, use can be made of compounds that when exposed to light, generate an acid described in U.S. Pat. No. 3,779,778 and EP 126,712.

As preferred compounds among the acid generators, there can be mentioned those of the following general formulae (ZI), (ZII) and (ZIII).

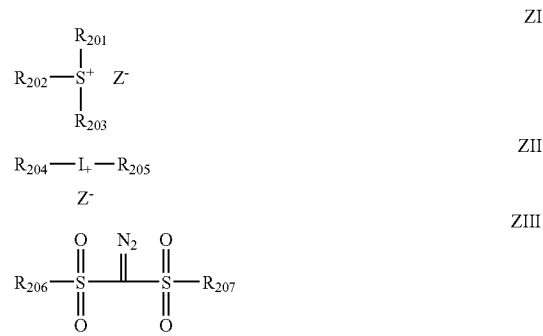

In above general formula (ZI),
each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a normucleophilic anion.

As the normucleophilic anion represented by Z—, there can be mentioned, for example, a sulfonate anion, a carboxylate anion, a sulfonylimido anion, a bis(alkylsulfonyl)imido anion, a tris(alkylsulfonyl)methyl anion or the like.

The normucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resist.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a boronyl group or the like.

As a preferred aromatic group of the aromatic sulfonate anion, there can be mentioned an aryl group having 6 to 14 carbon atoms, for example, a phenyl group, a tolyl group, a naphthyl group or the like.

The alkyl group, cycloalkyl group and aryl group of the aliphatic sulfonate anion and aromatic sulfonate anion may have a substituent. As the substituent of the alkyl group, cycloalkyl group and aryl group of the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As the aliphatic moiety of the aliphatic carboxylate anion, there can be mentioned the same alkyl groups and cycloalkyl groups as mentioned with respect to the aliphatic sulfonate anion.

As the aromatic group of the aromatic carboxylate anion, there can be mentioned the same aryl groups as mentioned with respect to the aromatic sulfonate anion.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, there can be mentioned, for example, the same halogen atom, alkyl group, cycloalkyl group, alkoxy group, alkylthio group, etc., as mentioned with respect to the aromatic sulfonate anion.

As the sulfonylimido anion, there can be mentioned, for example, a saccharin anion.

The alkyl group of the bis(alkylsulfonyl)imido anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As a substituent of these alkyl groups, there can be mentioned a halogen atom, an alkyl group substituted with a halogen atom, an alkoxy group, an alkylthio group, an alkyloxysulfo-nyl group, an aryloxysulfonyl group, a cycloalkylaryloxysulfonyl group or the like. An alkyl group substituted with a fluorine atom is preferred.

As the other normucleophilic anions, there can be mentioned, for example, phosphorus fluoride, boron fluoride, antimony fluoride and the like.

The normucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the normucleophilic anion is a perfluorinated aliphatic sulfonate anion having 4 to 8 carbon atoms or a benzene sulfonate anion having a fluorine atom. Still more preferably, the normucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, there can be mentioned, for example, corresponding groups of the following compounds (ZI-1), (ZI-2) and (ZI-3).

Appropriate use may be made of compounds with two or more of the structures of general formula (ZI). For example, use may be made of compounds having a structure wherein at least one of $R_{201}$ to $R_{203}$ of a compound of general formula (ZI) is bonded to at least one of $R_{201}$ to $R_{203}$ of another compound of general formula (ZI).

As preferred (ZI) components, there can be mentioned the following compounds (ZI-1), (ZI-2) and (ZI-3).

Compounds (ZI-1) are arylsulfonium compounds of general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, a nitrogen atom, a sulfur atom or the like. As the aryl group having a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, compounds (ZI-2) will be described.

Compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Compounds (ZI-3) are those represented by the following general formula (ZI-3) which have a phenacylsulfonium salt structure.

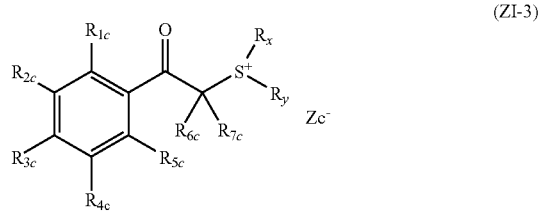

(ZI-3)

In general formula (ZI-3),
each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a normucleophilic anion. There can be mentioned the same normucleophilic anions as mentioned with respect to the $Z^-$ of general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

As the alkyl groups and cycloalkyl groups represented by $R_x$ and $R_y$, there can be mentioned the same alkyl groups and cycloalkyl groups as mentioned with respect to $R_{1c}$ to $R_{7c}$. Among them, a 2-oxoalkyl group, a 2-oxocycloalkyl group and an alkoxycarbonylmethyl group are preferred.

As the 2-oxoalkyl group and 2-oxocycloalkyl group, there can be mentioned groups having >C=O at the 2-position of the alkyl group and cycloalkyl group represented by $R_{1c}$ to $R_{7c}$.

Regarding the alkoxy group of the alkoxycarbonylmethyl group, there can be mentioned the same alkoxy groups as mentioned with respect to $R_{1c}$ to $R_{5c}$.

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

In general formulae (ZII) and (ZIII),
each of $R_{204}$ to $R_{207}$ independently represents an aryl group, an alkyl group or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom or the like. As the aryl group having a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like.

As preferred alkyl groups and cycloalkyl groups represented by $R_{204}$ to $R_{207}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

$Z^-$ represents a normucleophilic anion. As such, there can be mentioned the same normucleophilic anions as mentioned with respect to the $Z^-$ of general formula (ZI).

As the acid generators, there can be further mentioned the compounds of the following general formulae (ZIV), (ZV) and (ZVI).

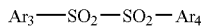

ZIV

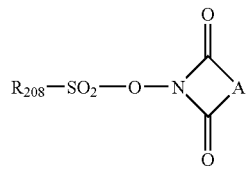

ZV

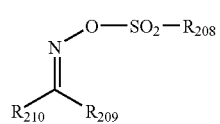

ZVI

In general formulae (ZIV) to (ZVI),
each of $Ar_3$ and $Ar_4$ independently represents an aryl group.
Each of $R_{208}$, $R_{209}$ and $R_{210}$ independently represents an alkyl group, a cycloalkyl group or an aryl group.
A represents an alkylene group, an alkenylene group or an arylene group.

Among the acid generators, the compounds of general formulae (ZI) to (ZIII) are more preferred.

As a preferred acid generator, there can be mentioned a compound that generates an acid having one sulfonate group or imido group. As a more preferred acid generator, there can be mentioned a compound that generates a monovalent perfluoroalkanesulfonic acid, a compound that generates a monovalent aromatic sulfonic acid substituted with a fluorine atom or fluorine-atom-containing group, or a compound that generates a monovalent imidic acid substituted with a fluorine atom or fluorine-atom-containing group. As a still more preferred acid generator, there can be mentioned any of sulfonium salts of a fluorinated alkanesulfonic acid, fluorinated benzenesulfonic acid, fluorinated imidic acid and fluorinated methide acid. With respect to practicable acid generators, it is especially preferred for the generated acid to be a fluorinated alkanesulfonic acid, fluorinated benzenesulfonic acid or fluorinated imidic acid of −1 or below pKa. By the use thereof, an enhancement of sensitivity can be attained.

Especially preferred examples of the acid generators are as follows.

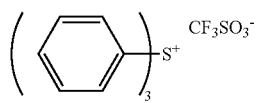

(z1)

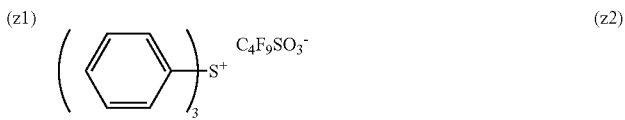

(z2)

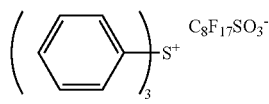

(z3)

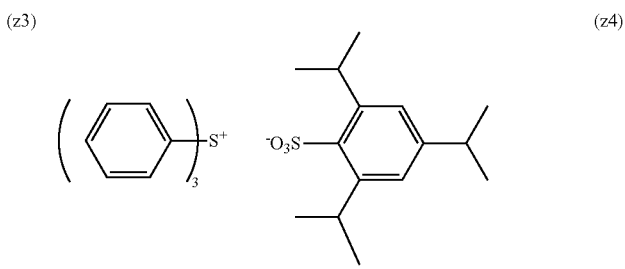

(z4)

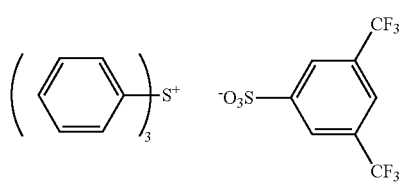

(z5)

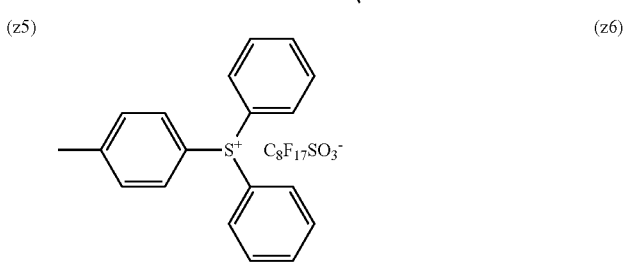

(z6)

-continued
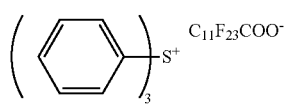 (z7)
 (z8)
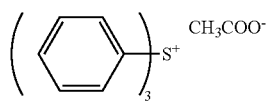 (z9)
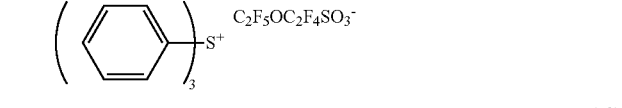 (z10)
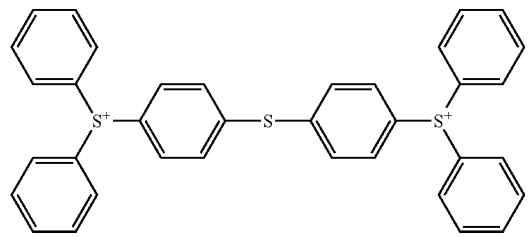
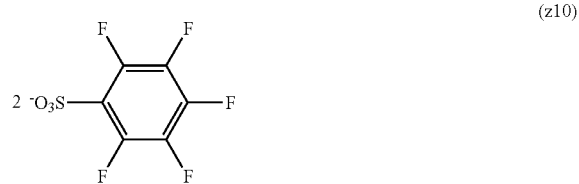 (z11)
 (z12)
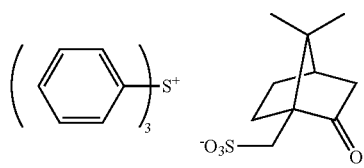 (z13)
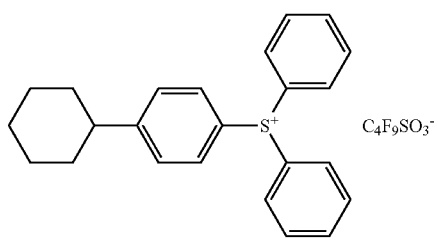 (z14)
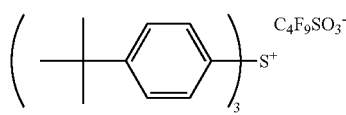 (z15)
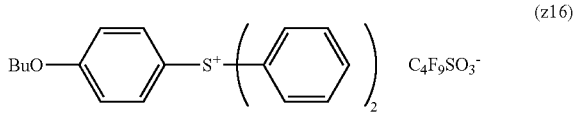 (z16)
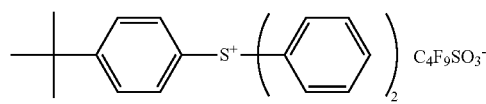 (z17)
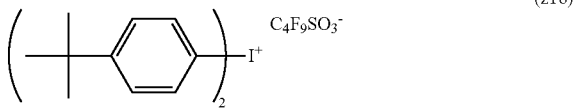 (z18)
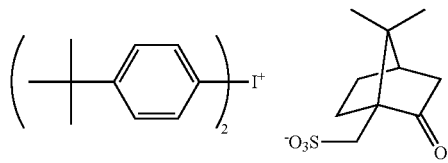 (z19)
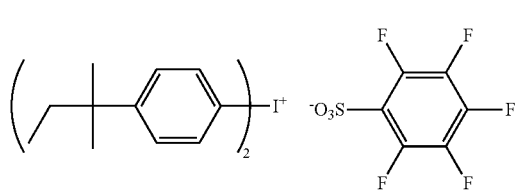
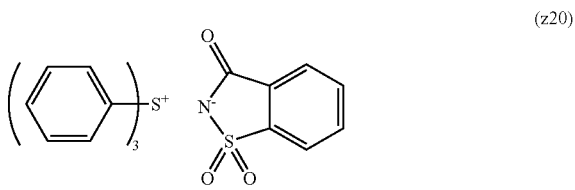 (z20)

-continued
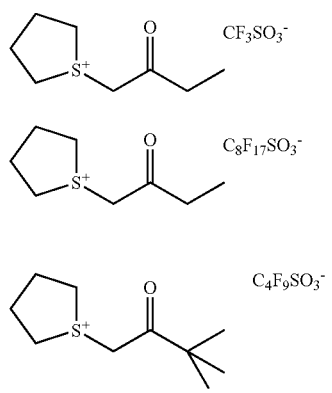
(z21) (z22) 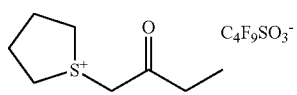
(z23) 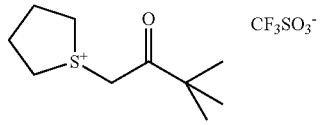 (z24)
(z25) 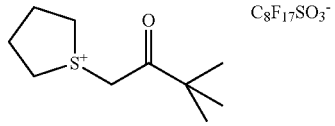 (z26)
(z27) 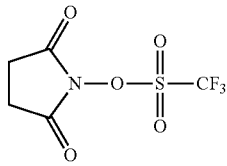 (z28)
(z29) 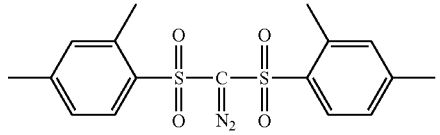 (z30)
(z31) 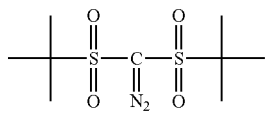 (z32)
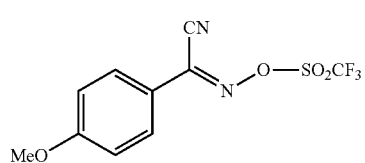
(z33)
(z34)
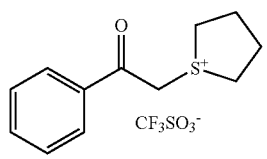 (z35) 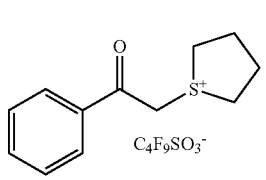 (z36)
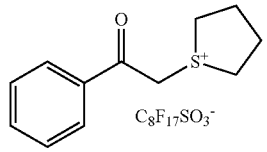 (z37) 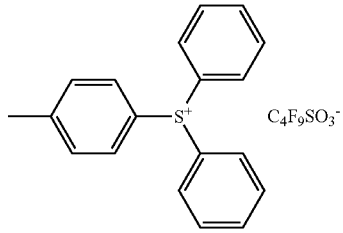 (z38)

-continued
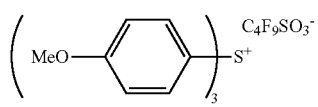
(z39)
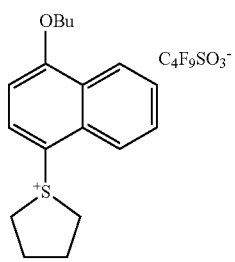
(z40)
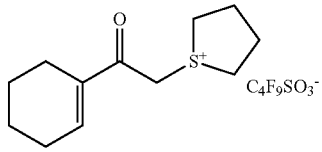
(z41)
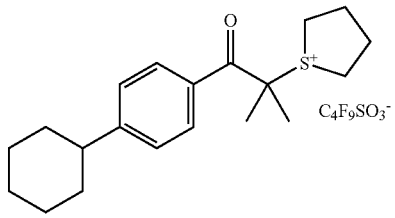
(z42)
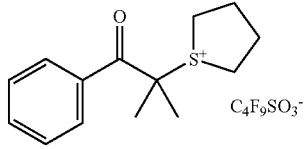
(z43)
(z44)
(z45)
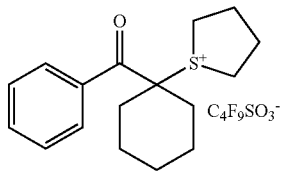
(z46)
(z47)
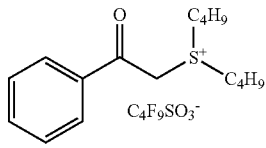
(z48)
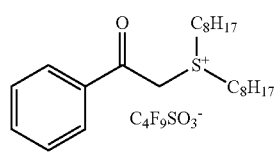
(z49)
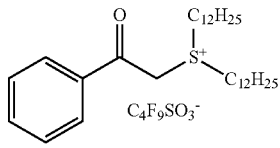
(z50)
(z51)
(z52)

-continued
(z53) 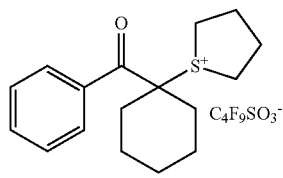
(z54) 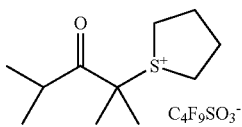
(z55) 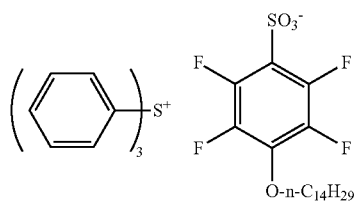
(z56) 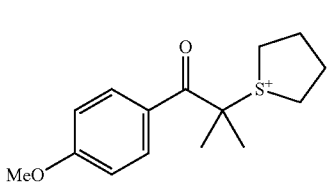
(z57) 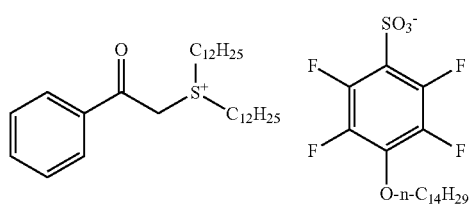
(z58) 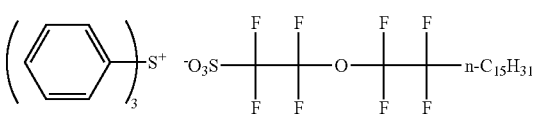
(z59) 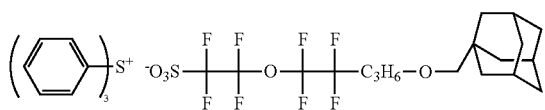
(z60) 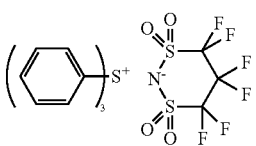
(z61) 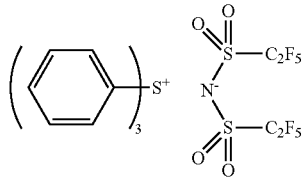
(z62) 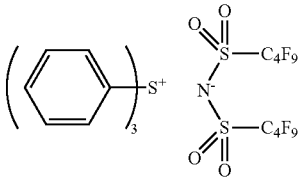
(z63) 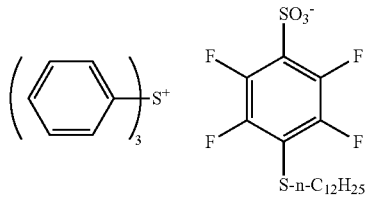
(z64) 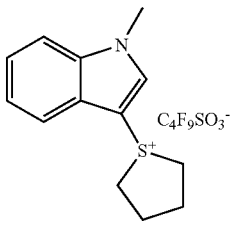
(z65) 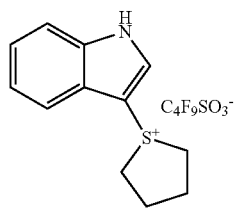
(z66) 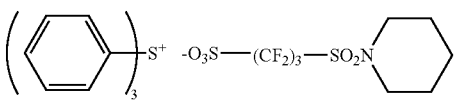
(z67) 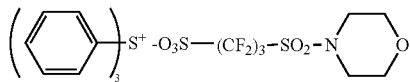
(z68) 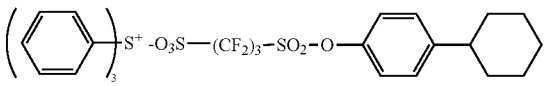

-continued
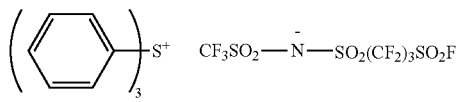
(z69)
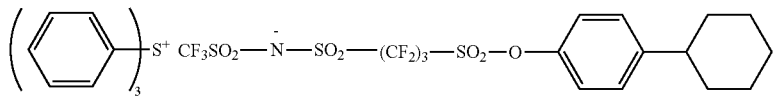
(z70)
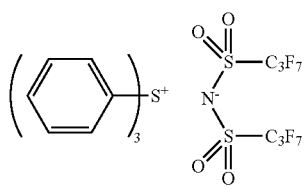
(z71)
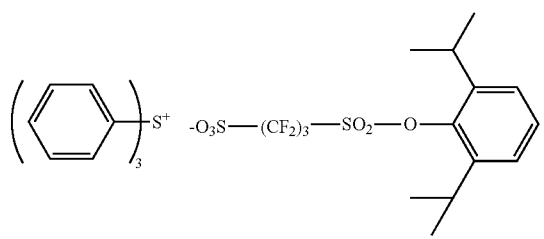
(z72)
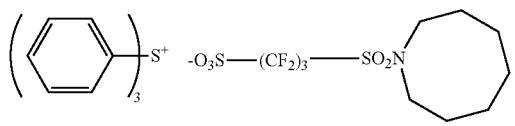
(z73)
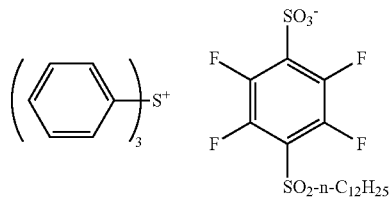
(z74)
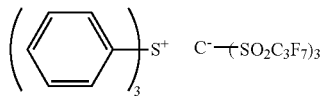
(z75)
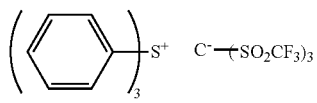
(z77)
(z78)
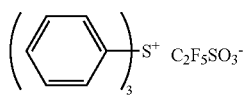
(z79)
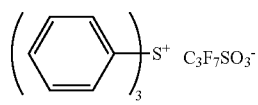
(z80)
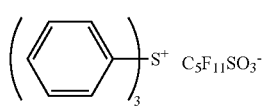
(z81)
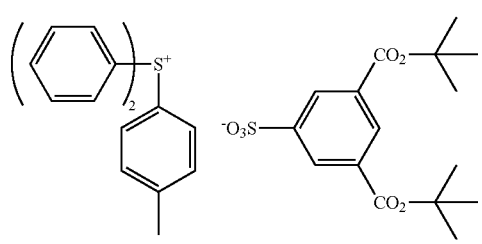
(z82)

-continued

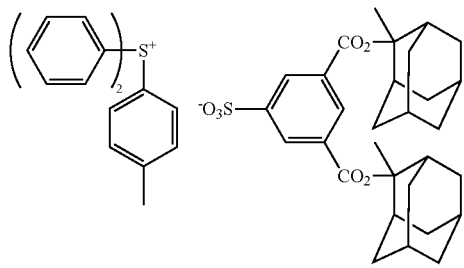
(z83)

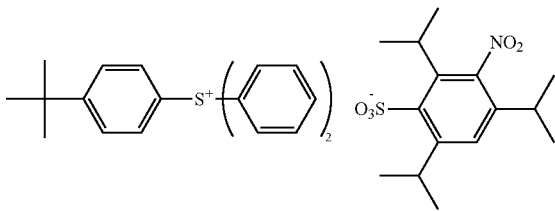
(z84)

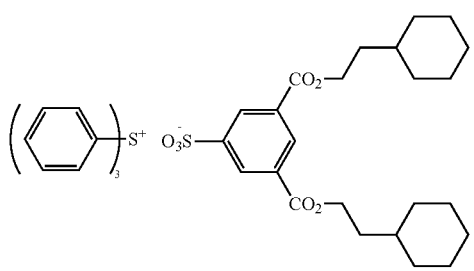
(z85)

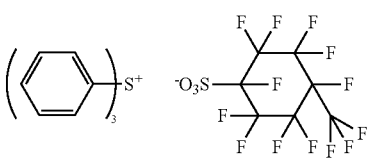
(z86)

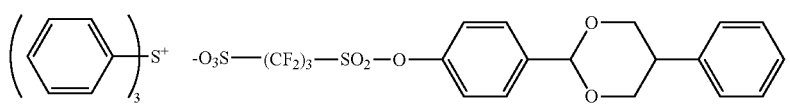
(z87)

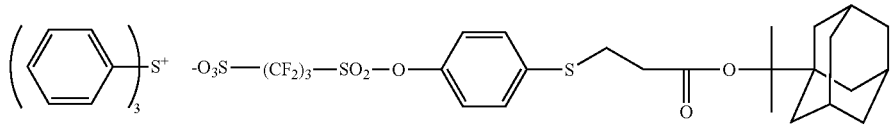
(z88)

(z89)

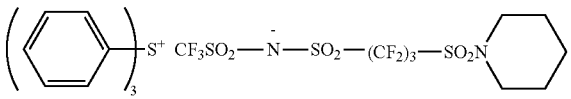
(z90)

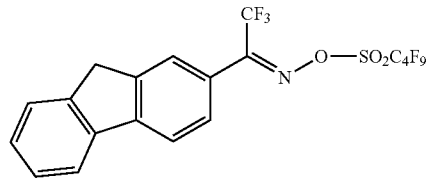

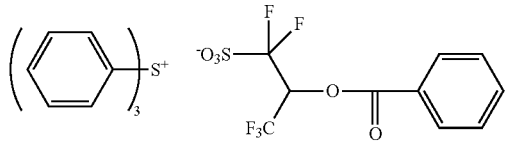
(z91)

The acid generators can be used either individually or in combination.

The amount of acid generator contained in the actinic-ray- or radiation-sensitive resin composition is preferably in the range of 0.1 to 20 mass %, more preferably 0.5 to 10 mass % and still more preferably 1 to 7 mass % based on the total solid content of the composition.

(C) Resin containing two or more resins (c) each having at least either a fluorine atom or a silicon atom The actinic-ray- or radiation-sensitive resin composition of the present invention contains (C) a resin containing two or more resins (c) each having at least either a fluorine atom or a silicon atom. This would bring about uneven localization of resin C on the surface layer of the film. When the liquid immersion medium is water, there would be attained an improvement of receding contact angle on the surface of the resist film with reference to water upon formation of a resist film, and accordingly an enhancement of the liquid immersion water following property. The receding contact angle of the film is preferably in the range of 60° to 90°, more preferably 70° or greater. The amount of resin added can be appropriately regulated so that the receding contact angle of the film falls within the above range. However, the addition amount is preferably in the range of 0.1 to 10 mass %, more preferably 0.1 to 5 mass % based on the total solids of the actinic-ray- or radiation-sensitive resin composition. Although resin (C) is unevenly localized on the interface as mentioned above, differing from the surfactant, the resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while following the movement of an exposure head involving high-speed scanning on the wafer and thus forming an exposure pattern. Therefore, the contact angle of the liquid for liquid immersion with respect to the film in a dynamic condition is important, and it is required for the resist to be capable of following the high-speed scanning of the exposure head without leaving any droplets.

The hydrophobicity (water following property) of the film surface can be increased and the amount of development residue (scum) can be reduced by the use of, as resin (C), a mixture of two or more resins (c) each having at least either a fluorine atom or a silicon atom.

The fluorine atom or silicon atom of the resins (c) having at least either a fluorine atom or a silicon atom (hereinafter also simply referred to as "resins (c)" or the like) may be present in the principal chain of the resin or may be a substituent on the side chain thereof.

It is preferred for the resins (c) to be resins having, as a partial structure having a fluorine atom, an alkyl group having a fluorine atom, a cycloalkyl group having a fluorine atom or an aryl group having a fluorine atom.

The alkyl group having a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be contained.

The cycloalkyl group having a fluorine atom is a monocyclic or polycyclic alkyl group having at least one hydrogen atom thereof substituted with a fluorine atom. Further, other substituents may be contained.

As the aryl group having a fluorine atom, there can be mentioned one having at least one hydrogen atom of the aryl group, such as a phenyl or naphthyl group, substituted with a fluorine atom. Further, other substituents may be contained.

As preferred alkyl groups having a fluorine atom, cycloalkyl groups having a fluorine atom and aryl groups having a fluorine atom, there can be mentioned groups of the following general formulae (F2) to (F4), which however in no way limit the scope of the present invention.

(F2)

(F3)

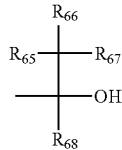
(F4)

In general formulae (F2) to (F4), each of $R_{57}$ to $R_{68}$ independently represents a hydrogen atom, a fluorine atom, a linear or branched alkyl group, a cycloalkyl group or an aryl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded to each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —C(CF$_3$)$_2$OH, —C(C$_2$F$_5$)$_2$OH, —C(CF$_3$)(CH$_3$)OH, —CH(CF$_3$)OH and the like. —C(CF$_3$)$_2$OH is preferred.

In the present invention, preferably, any of the groups of general formulae (F2) to (F4) is contained in a (meth)acrylate repeating unit.

Specific examples of the repeating units having a fluorine atom will be shown below, which however in no way limit the scope of the present invention.

In the specific examples, $X_1$ represents a hydrogen atom, —CH$_3$, —F or —CF$_3$.

$X_2$ represents —F or —CF$_3$.

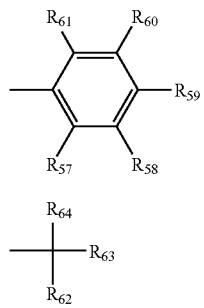

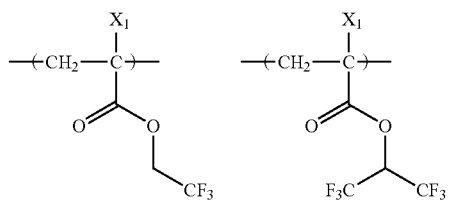

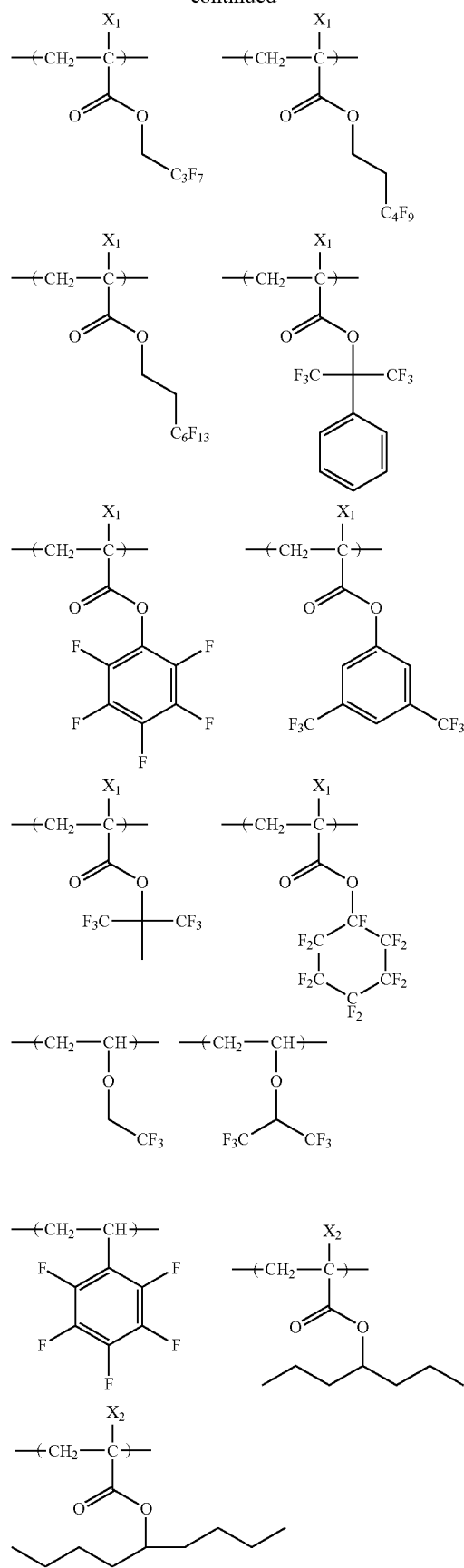
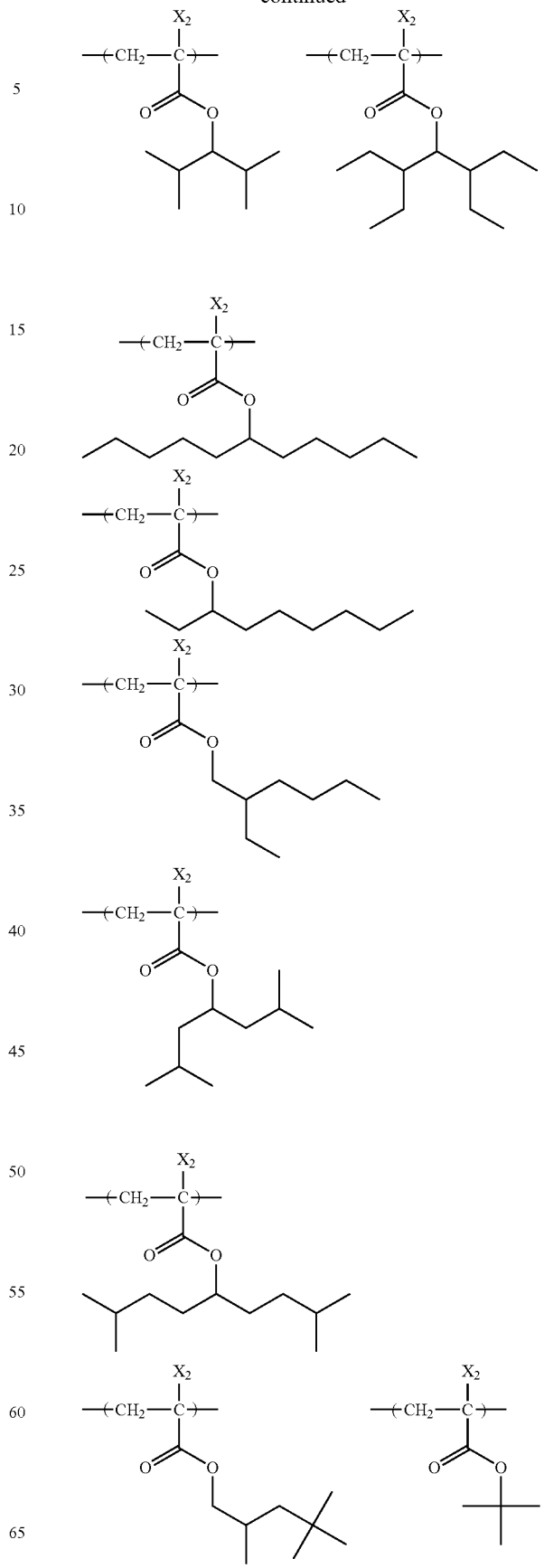

-continued
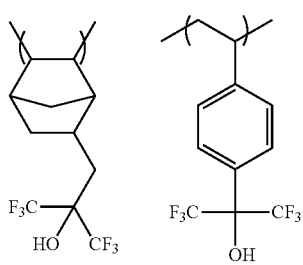
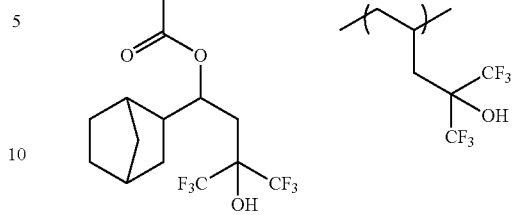
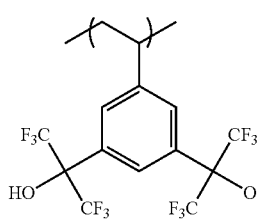
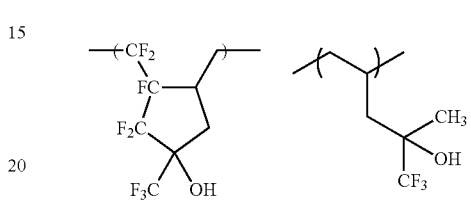
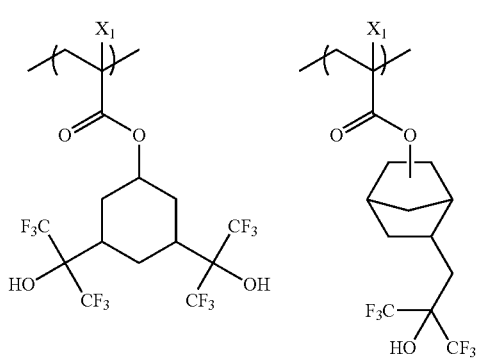
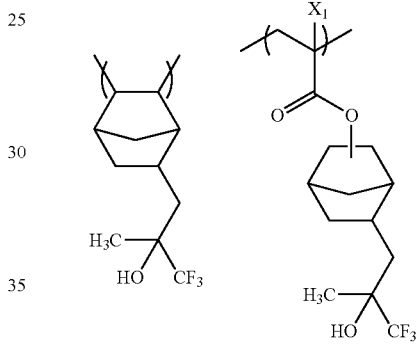
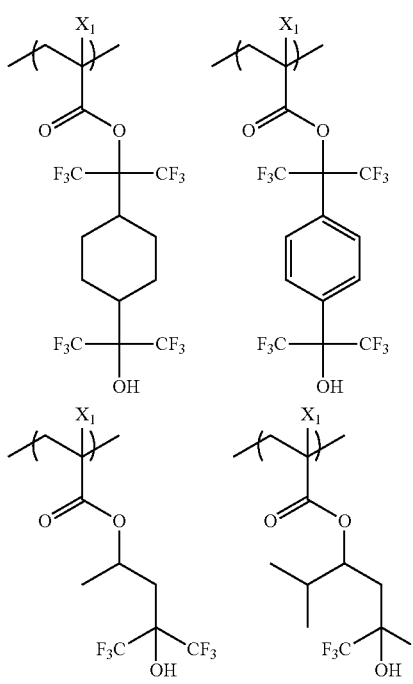
The resins (c) are preferably resins having an alkylsilyl structure (preferably a trialkylsilyl group) or a cyclosiloxane structure as a partial structure having a silicon atom.
As the alkylsilyl structure or cyclosiloxane structure, there can be mentioned, for example, any of the groups of the following general formulae (CS-1) to (CS-3) or the like.
(CS-1)
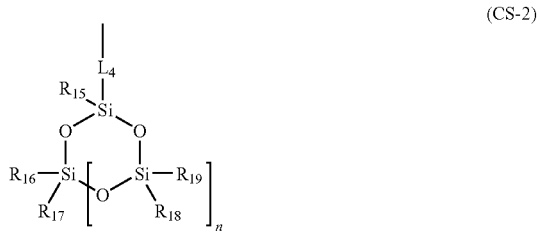
(CS-2)

-continued (CS-3)

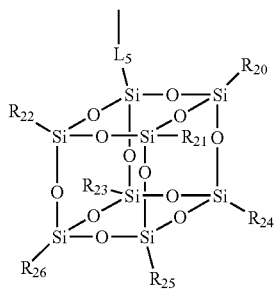

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a cycloalkylene group, a phenylene group, an ether group, a thioether group, a carbonyl group, an ester group, an amido group, a urethane group and a urea group.

In the formulae, n is an integer of 1 to 5.

In the present invention, preferably, any of the groups of general formulae (CS-1) to (CS-3) is contained in a (meth) acrylate repeating unit.

Specific examples of the repeating units having the groups of general formulae (CS-1) to (CS-3) will be shown below, which however in no way limit the scope of the present invention. In the specific examples, $X_1$ represents a hydrogen atom, —$CH_3$, —F or —$CF_3$.

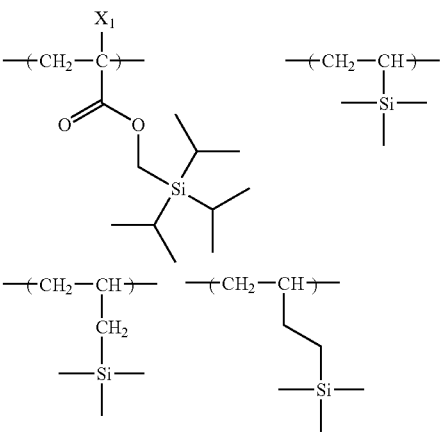
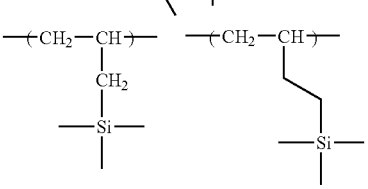
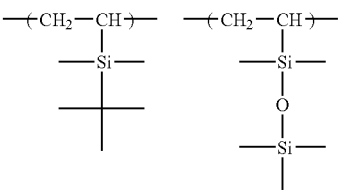
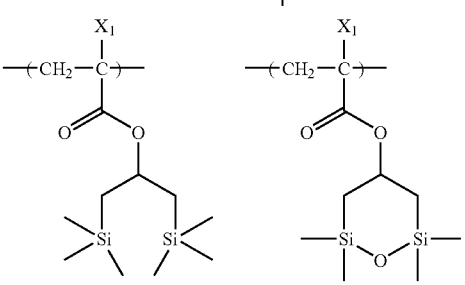
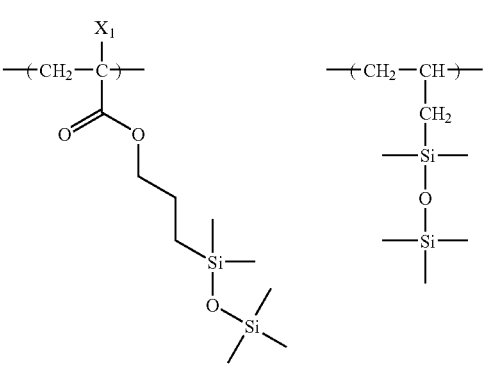
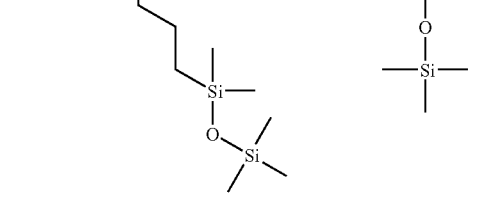
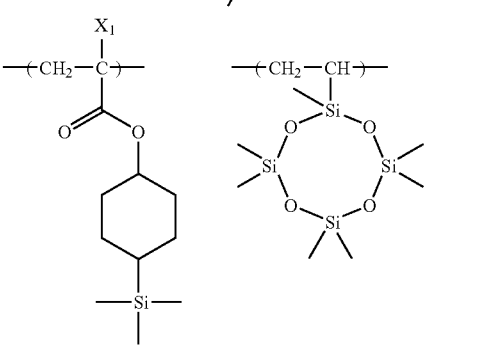
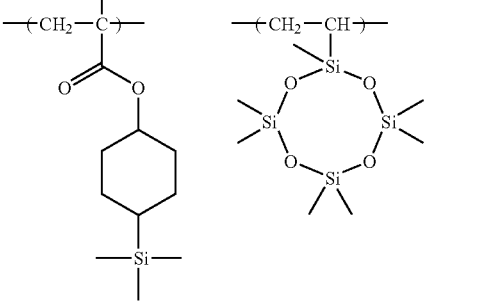
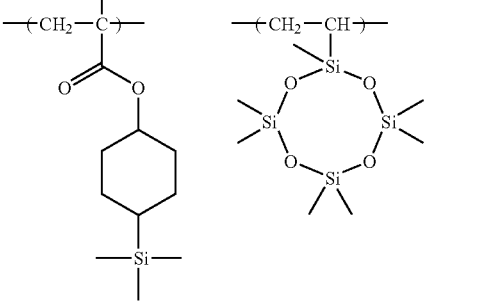
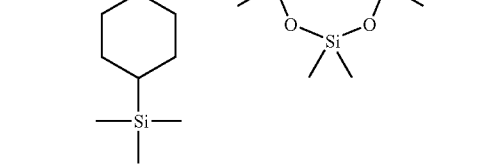

-continued

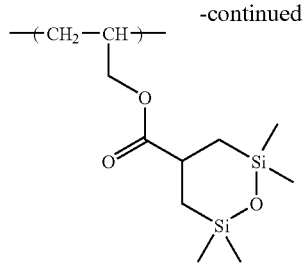

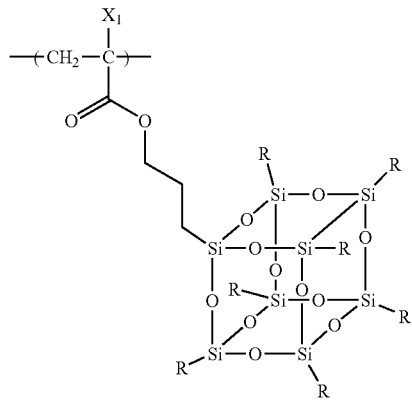

R = CH$_3$, C$_2$H$_5$, C$_3$H$_7$, C$_4$H$_9$

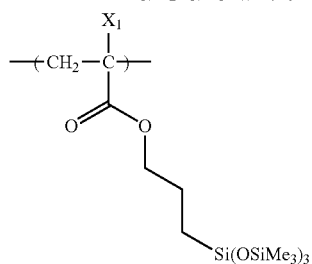

Moreover, the resins (c) may have at least one group selected from among the following groups (x) to (z):
(x) an alkali-soluble group,
(y) a group that is decomposed by the action of an alkali developer, resulting in an increase of solubility in the alkali developer, and
(z) a group that is decomposed by the action of an acid.

As the alkali-soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a fluoroalcohol group (preferably hexafluoroisopropanol), a sulfonimido group and a bis(carbonyl)methylene group.

As the repeating unit having an alkali-soluble group (x), preferred use is made of any of a repeating unit resulting from direct bonding of an alkali-soluble group to the principal chain of a resin like a repeating unit of acrylic acid or methacrylic acid, a repeating unit resulting from bonding, via a connecting group, of an alkali-soluble group to the principal chain of a resin and a repeating unit resulting from polymerization with the use of a chain transfer agent or polymerization initiator having an alkali-soluble group to thereby introduce the same in a polymer chain terminal.

The content of repeating units having an alkali-soluble group (x) is preferably in the range of 1 to 50 mol %, more preferably 3 to 35 mol % and still more preferably 5 to 30 mol % based on all the repeating units of the resin (c).

Specific examples of the repeating units having an alkali-soluble group (x) will be shown below, which however in no way limit the scope of the present invention.

In the formulae, Rx represents H, CH$_3$, CF$_3$ or CH$_2$OH.

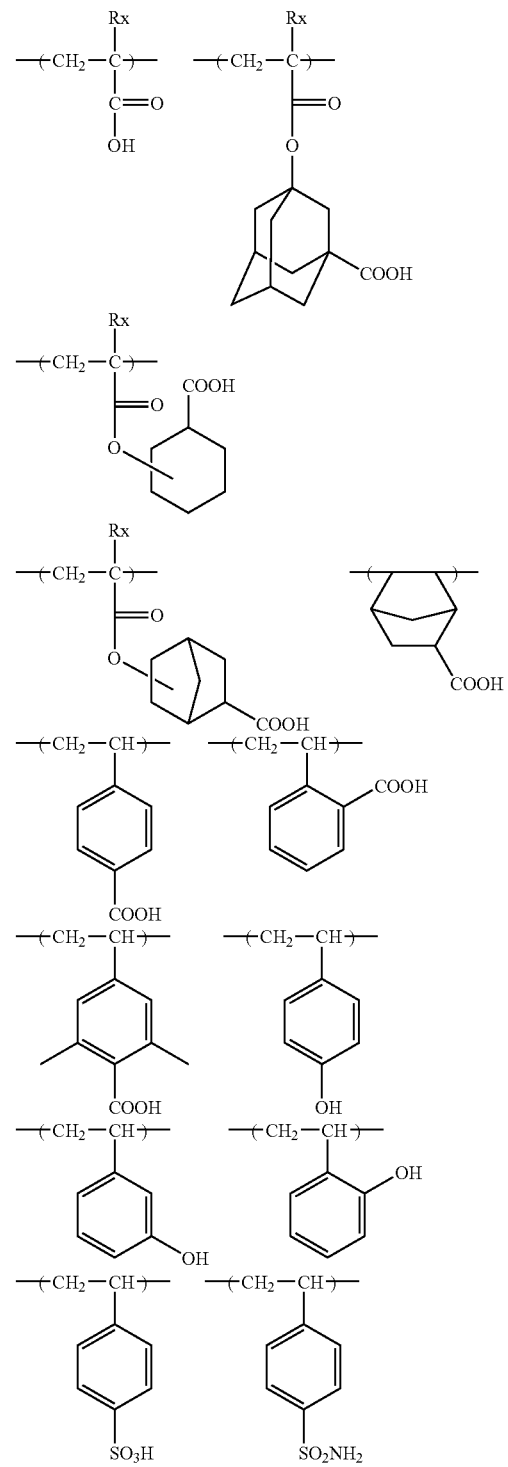

-continued

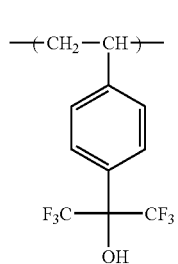 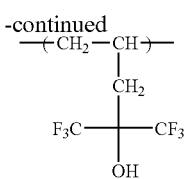

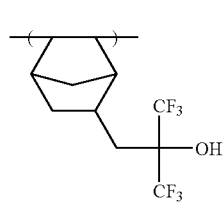 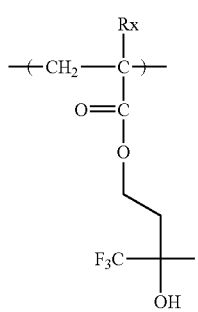

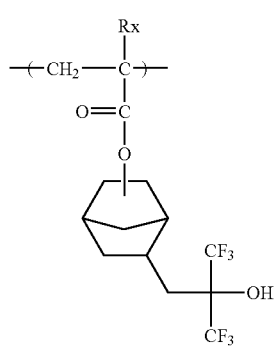

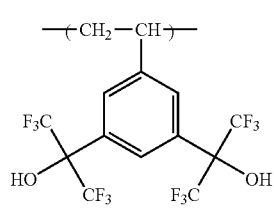

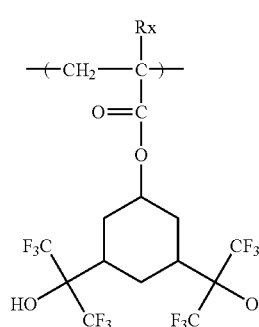 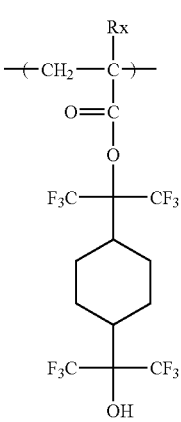

-continued

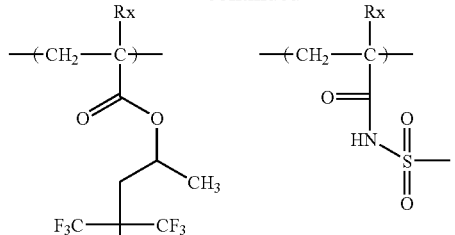

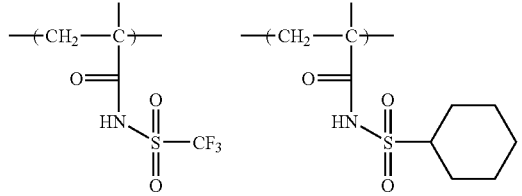

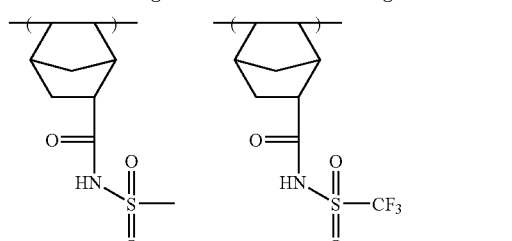

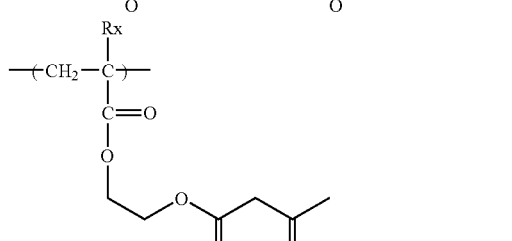

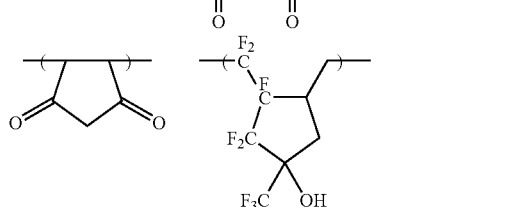

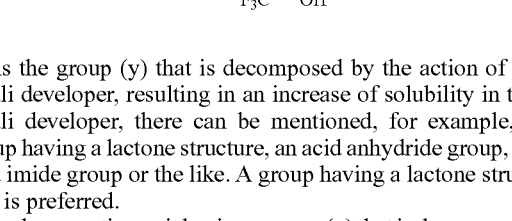

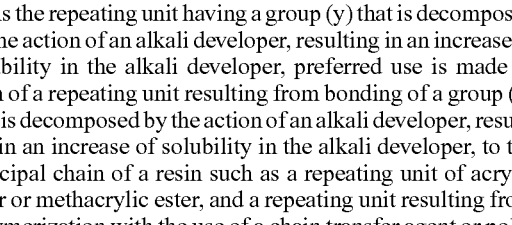

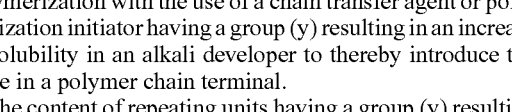
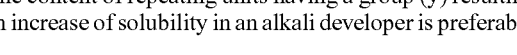

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 50 mol %, more preferably 3 to 35 mol % and still more preferably 5 to 20 mol % based on all the repeating units of the resin (c).

As specific examples of the repeating units having a group (y) resulting in an increase of solubility in an alkali developer, there can be mentioned those similar to the repeating units having a lactone structure set forth with respect to resin (A).

As the repeating unit having a group (z) that is decomposed by the action of an acid in the resins (c), there can be mentioned those similar to the repeating units having an acid decomposable group set forth with respect to resin (A). The content of repeating units having a group (z) that is decomposed by the action of an acid in each of the resins (c) is preferably in the range of 1 to 80 mol %, more preferably 10 to 80 mol % and still more preferably 20 to 60 mol % based on all the repeating units of the relevant resin (c).

The resins (c) may further have any of the repeating units of the following general formula (III).

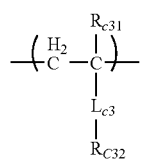

(III)

In general formula (III), $R_{c31}$ represents a hydrogen atom, an alkyl group, an optionally fluorinated alkyl group, a cyano group or a group of the formula —$CH_2$—O—$Rac_2$ in which $Rac_2$ represents a hydrogen atom, an alkyl group or an acyl group. $R_{c31}$ preferably represents a hydrogen atom, a methyl group, a hydroxymethyl group or a trifluoromethyl group, most preferably a hydrogen atom or a methyl group.

$R_{c32}$ represents any of groups having an alkyl group, cycloalkyl group, alkenyl group and cycloalkenyl group. These groups may be substituted with a fluorine atom or a silicon atom.

$L_{c3}$ represents a single bond or a bivalent connecting group.

In general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an ester group, an alkylene group (preferably having 1 to 5 carbon atoms), an oxy group or a phenylene group.

When a resin (c) has a fluorine atom, the content of fluorine atom(s) is preferably in the range of 5 to 80 mass %, more preferably 10 to 80 mass %, based on the molecular weight of the resin (c). The content of repeating unit containing a fluorine atom based on all the repeating units of the resin (c) is preferably in the range of 10 to 100 mass %, more preferably 30 to 100 mass %.

When a resin (c) has a silicon atom, the content of silicon atom(s) is preferably in the range of 2 to 50 mass %, more preferably 2 to 30 mass %, based on the molecular weight of the resin (c). The content of repeating unit containing a silicon atom based on all the repeating units of the resin (c) is preferably in the range of 10 to 100 mass %, more preferably 20 to 100 mass %.

The weight average molecular weight of the resins (c) in terms of standard polystyrene molecular weight is preferably in the range of 1000 to 100,000, more preferably 1000 to 50,000 and still more preferably 2000 to 15,000.

Impurities, such as metals, should naturally be of low quantity in the resins (c), as in resin (A). The content of residual monomers and oligomer components is preferably 0 to 10 mass %, more preferably 0 to 5 mass % and still more preferably 0 to 1 mass %. Accordingly, there can be obtained an actinic-ray- or radiation-sensitive resin composition being free from a change of in-liquid foreign matter, sensitivity, etc., over time. From the viewpoint of resolving power, resist profile, side wall of resist pattern, roughness, etc., the molecular weight distribution (Mw/Mn, also referred to as the dispersity) thereof is preferably in the range of 1 to 3, more preferably 1 to 2, still more preferably 1 to 1.8 and most preferably 1 to 1.5.

A variety of commercially available products can be used as the resins (c), and also the resin can be synthesized in accordance with routine methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the aforementioned solvent capable of dissolving the composition of the present invention, such as propylene glycol monomethyl ether acetate, propylene glycol monomethyl ether or cyclohexanone. Preferably, the polymerization is carried out with the use of the same solvent as that used in the actinic-ray- or radiation-sensitive resin composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc., and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a routine method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing resin solution A into contact with a solvent wherein the resin is poorly soluble or insoluble amounting to less than 10 times (preferably 5 times or less) the volume of resin solution A to thereby precipitate a resin solid (step d) and separating the precipitated resin (step e).

As the two or more resins (c) contained in resin (c), it is preferred to use a resin (c1) having an acid number (meq/g) of below 1.5 and a resin (c2) having an acid number of 1.5 or higher. It is more preferred to use a resin (c1) having an acid number (meq/g) of 1.1 or below and a resin (c2) having an acid number of 1.8 or higher. It is still more preferred to use a resin (c1) having an acid number (meq/g) of 0.5 or below and a resin (c2) having an acid number of 2.0 or higher. The acid numbers (meq/g) of the resins preferably exhibit a difference of 0.7 or greater, more preferably 1.0 or greater. In the event of three or more resins (c) contained in resin (C), the difference is to be one calculated from the highest acid number and the lowest acid number thereof.

The acid number of each resin (c), for example, a resin from four monomers can be calculated by the following formula. The acid number refers to the amount of potassium hydroxide (mmol) required for neutralizing 1 g of a polymer.

[acid number]=[acid group unit molar ratio×no. of acid groups within unit]/[(1st monomer MW×component mol. ratio)+(2$^{nd}$ monomer MW×component mol. ratio)+(3$^{rd}$ monomer MW×component mol. ratio)+(4$^{th}$ monomer MW×component mol. ratio)]×1000.

Herein, the acid number being 0 means having no acid group. In this case, the resin (c) is insoluble in alkali developers.

As the resins (c) being insoluble in alkali developers, there can be mentioned, for example, those having the repeating units of above-mentioned general formula (III). As more particular forms thereof, there can be mentioned those having the repeating units of the following general formula (IV).

(III)

In the formula, $R_{c31}$, $R_{c32}$ and $L_{c3}$ are as defined above.

(IV)

In general formula (IV), R5 and Ra are as defined in general formula (I) for resin (A).

As the acid groups of the resins (c), there can be mentioned the groups of aforementioned general formulae (F2) to (F4) and the groups (y) that are decomposed by the action of an alkali developer to thereby exhibit an increased solubility in the alkali developer. In particular, a carboxylate group, a fluoroalcohol group and a group with a lactone structure are preferred.

The acid number of the resins (c), as apparent from the aforementioned formula, can be appropriately regulated through the molecular weight of each monomer and the component molar ratio. Therefore, the resin (c1) can be obtained by, for example, copolymerizing a monomer corresponding to a repeating unit with an acid group with a monomer corresponding to any of the repeating units of general formula (III) or general formula (IV).

The acid group content of the resins (c1) is preferably less than 30 mol %, more preferably less than 10 mol % and most preferably less than 5 mol %. The acid group content of the resins (c2) is preferably 30 mol % or greater, more preferably 50 mol % or greater and most preferably 70 mol % or greater.

Specific examples of the resins (c) having at least either a fluorine atom or a silicon atom will be shown below. The following Table 1 indicates the molar ratio of individual repeating units (corresponding to individual repeating units in order from the left), weight average molecular weight (Mw) and dispersity (Mw/Mn) with respect to each of the resins.
(C-1)
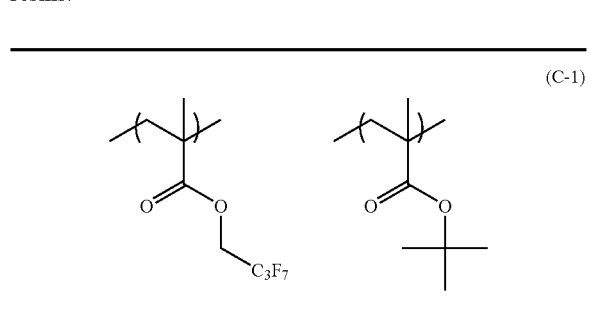
(C-2)
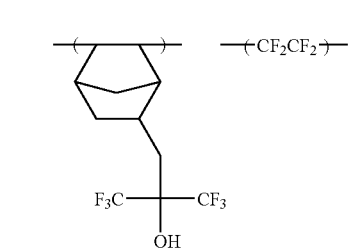
(C-3)
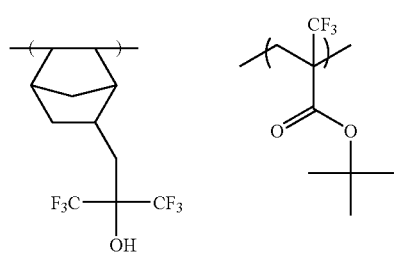
(C-4)
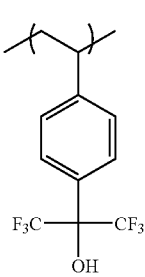
(C-5)
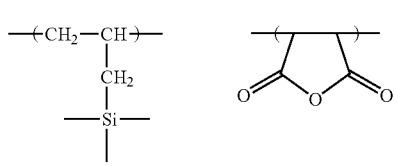
-continued
(C-6)
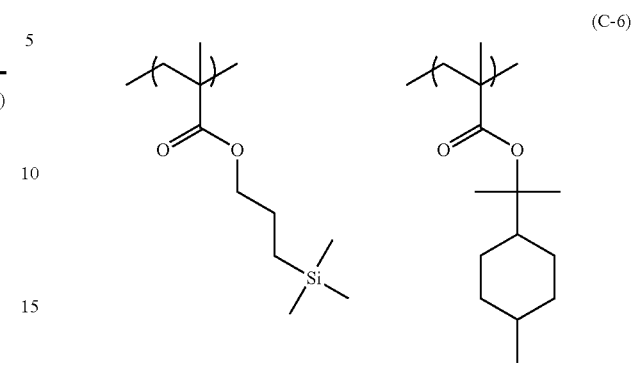
(C-7)
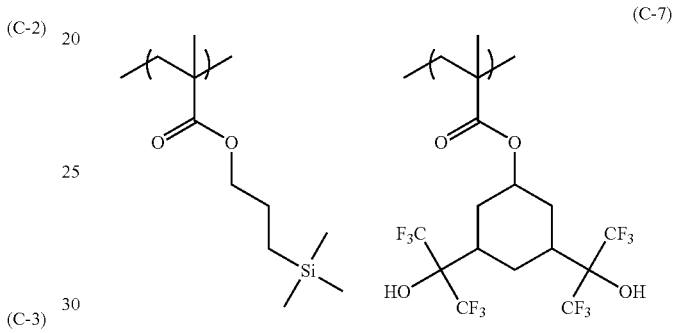
(C-8)
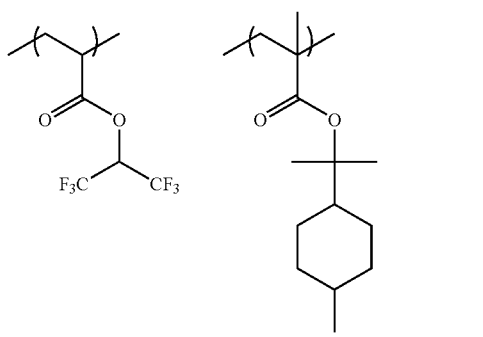
(C-9)
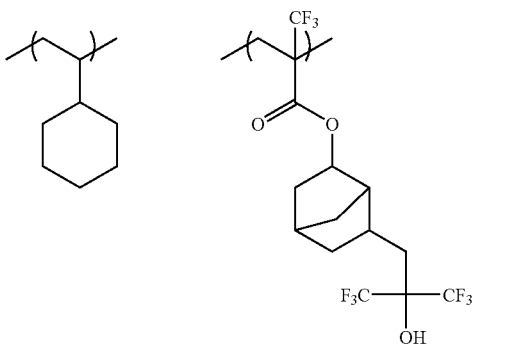

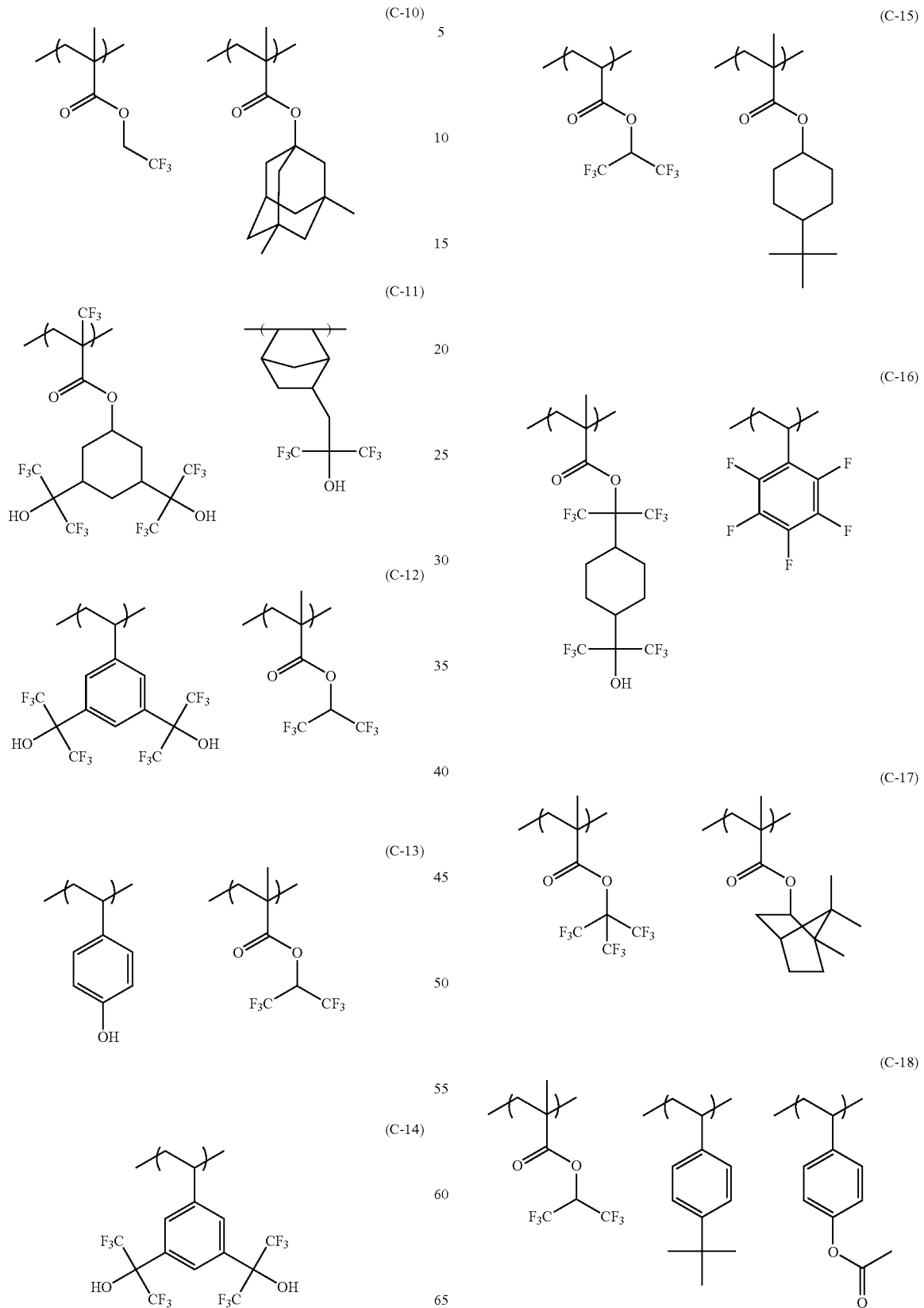

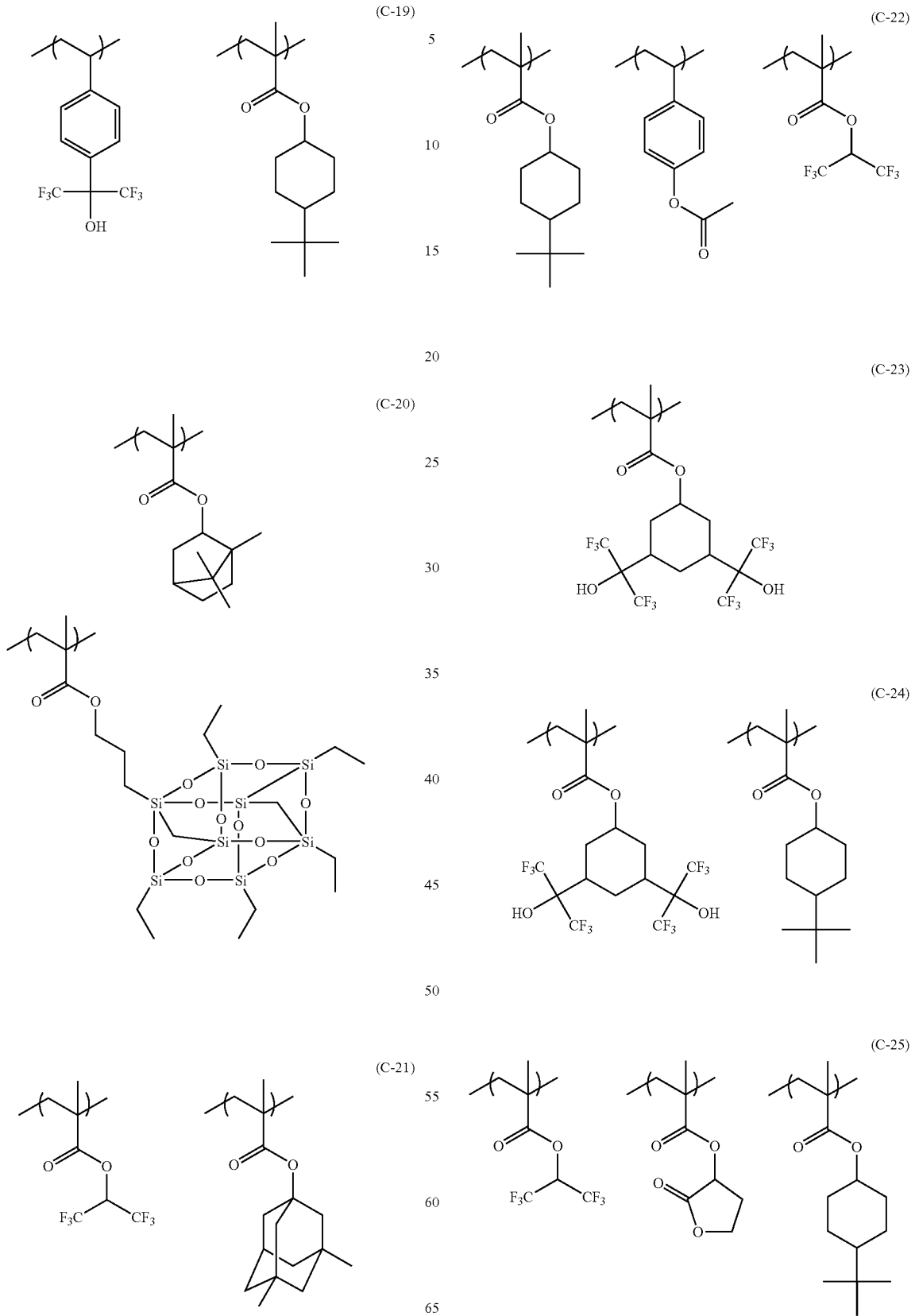

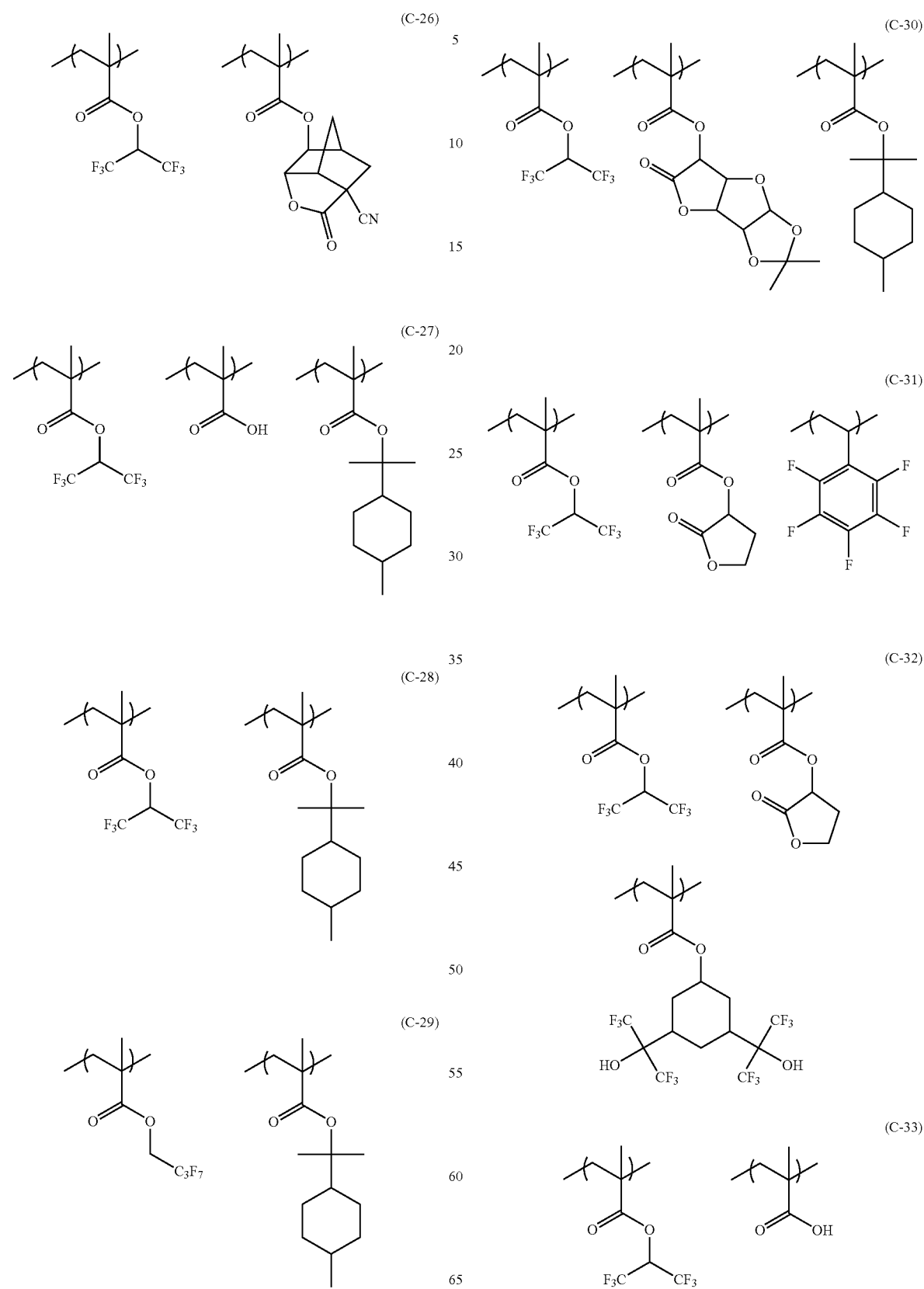

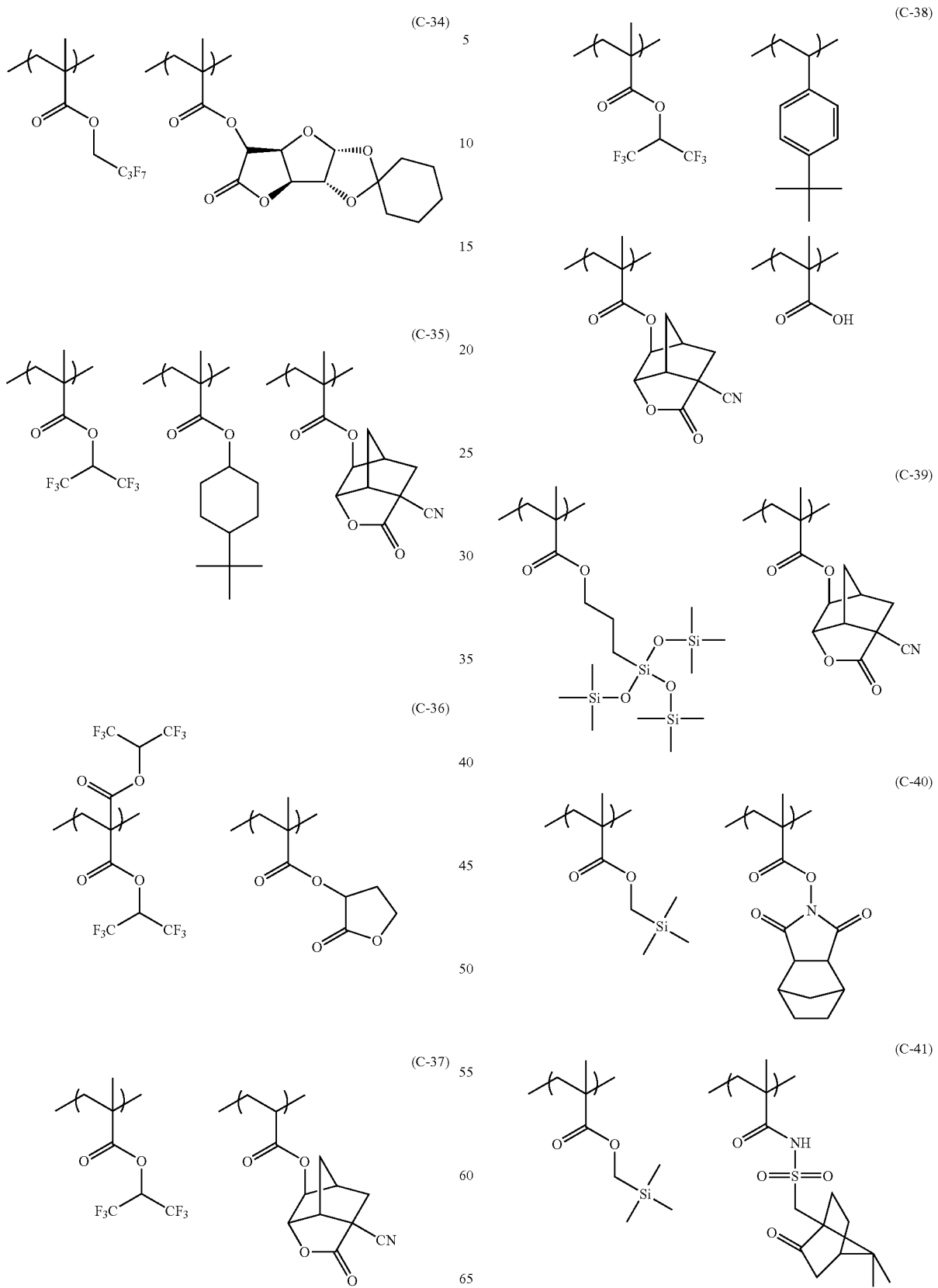

-continued
(C-42)
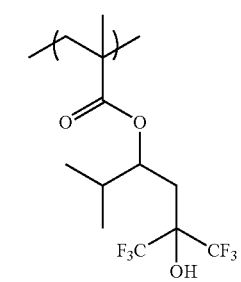 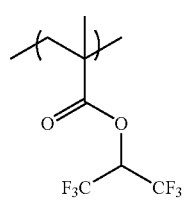
(C-43)
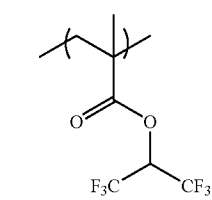 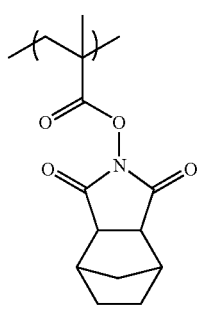
(C-44)
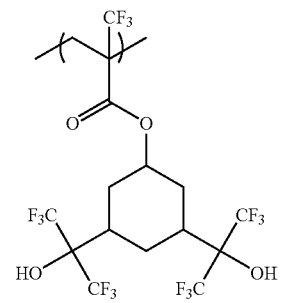 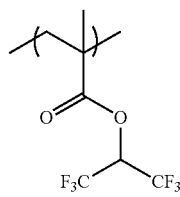
(C-45)
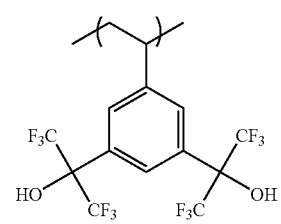 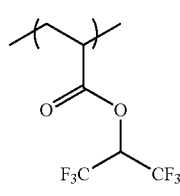
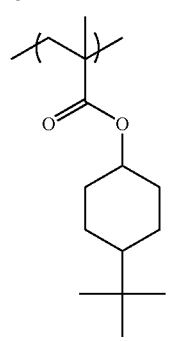
-continued
(C-46)
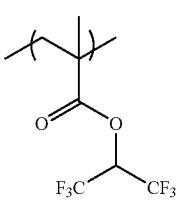 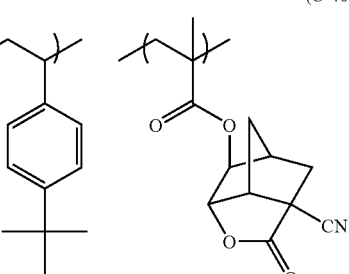
(C-47)
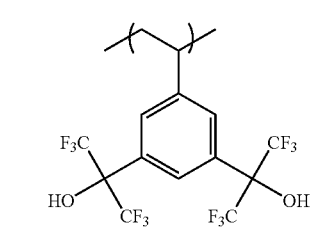 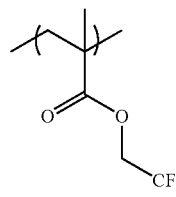
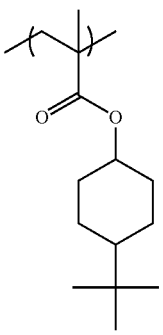
(C-48)
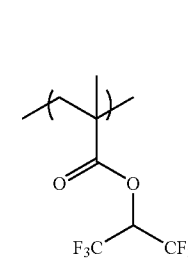  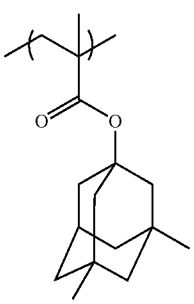
(C-49)
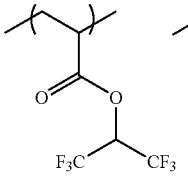 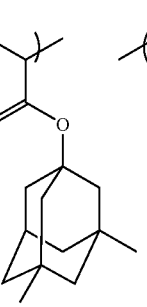

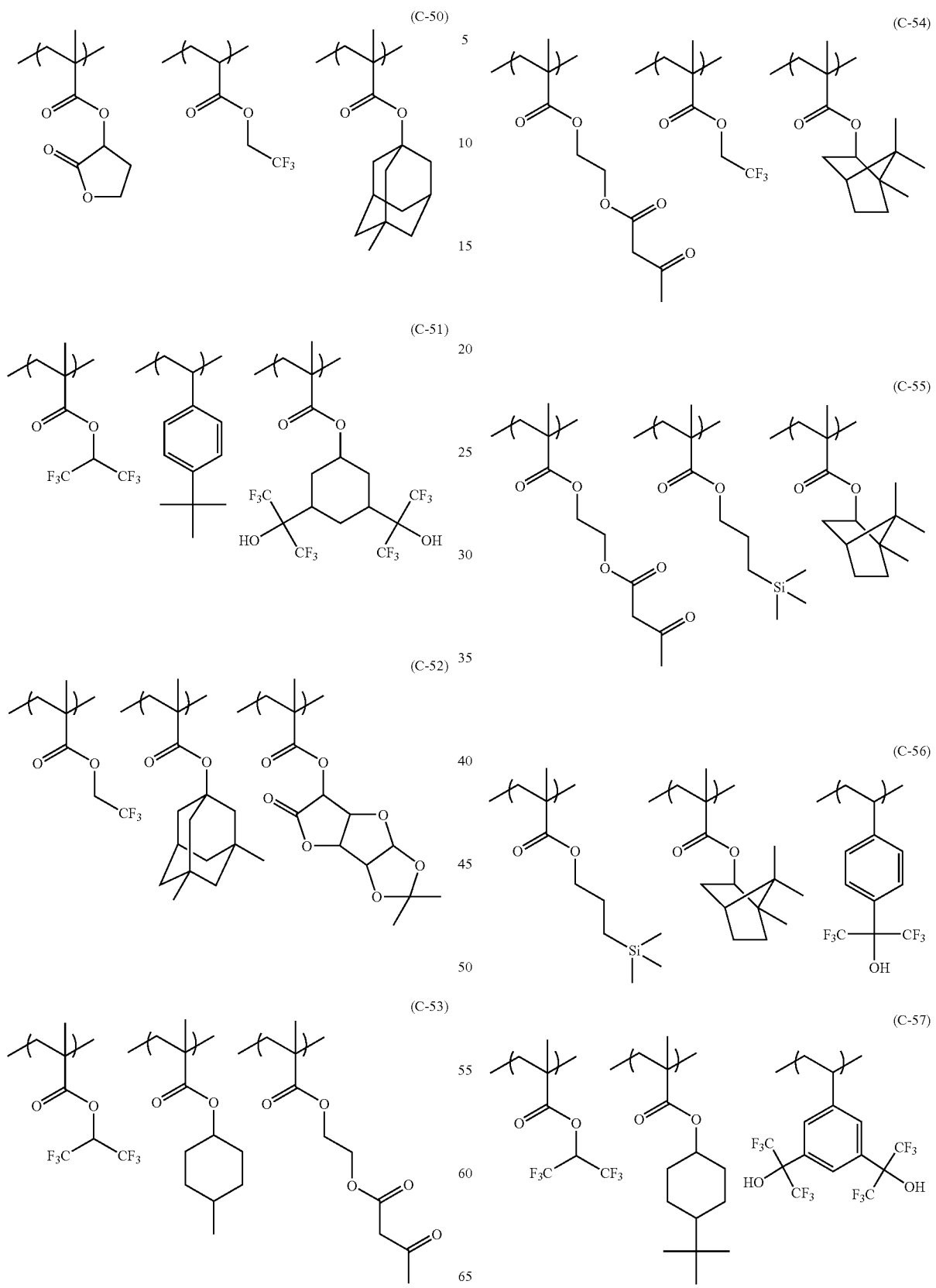

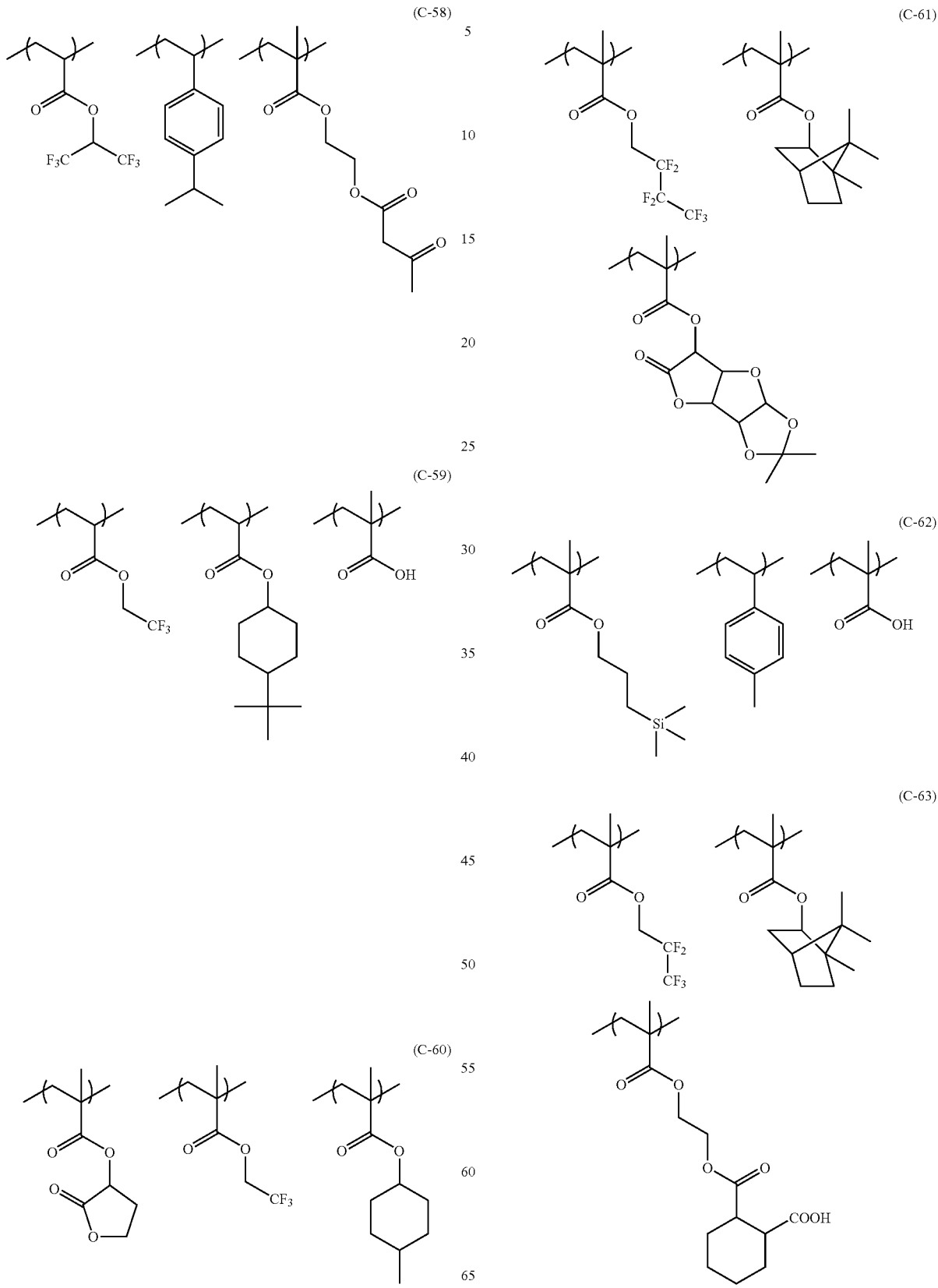

(C-64) 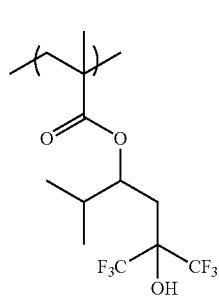
(C-65) 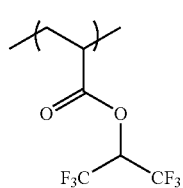
(C-66) 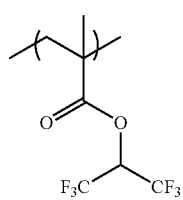
(C-67) 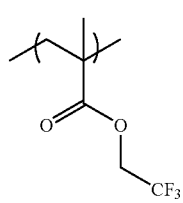
(C-68) 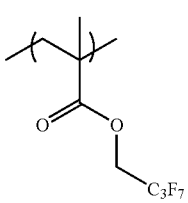
(C-69) 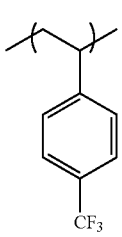
(C-70) 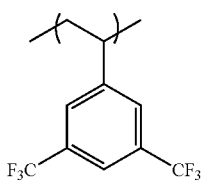
(C-71) 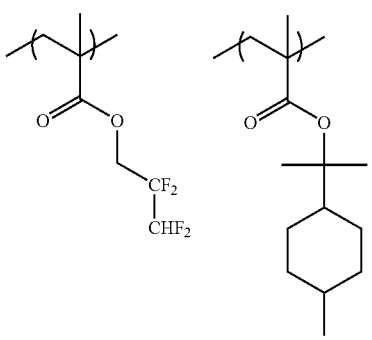
(C-72) 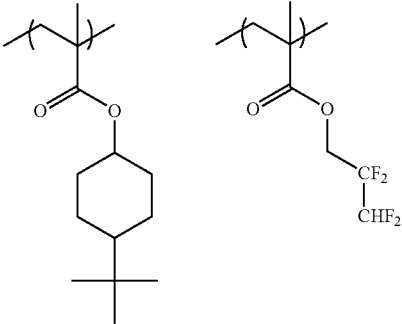
(C-73) 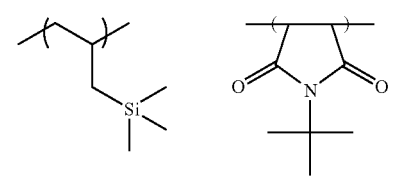
(C-74) 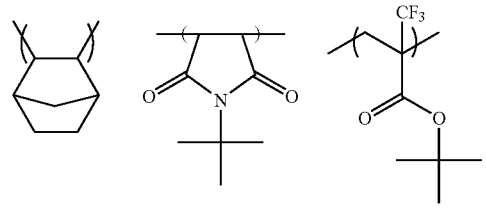

(C-75)
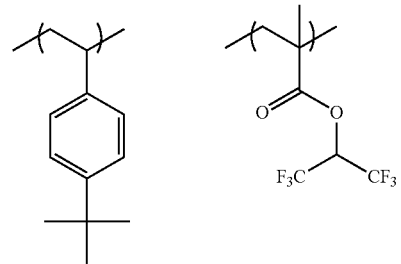
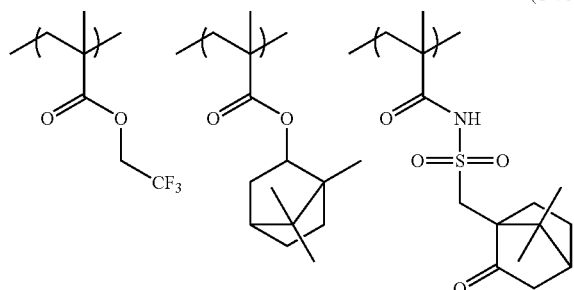
(C-76)
(C-77)
(C-78)
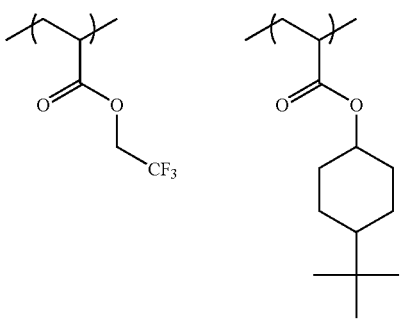
(C-79)
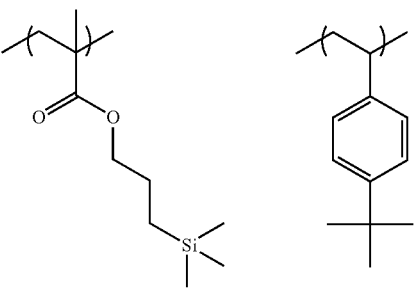
(C-80)
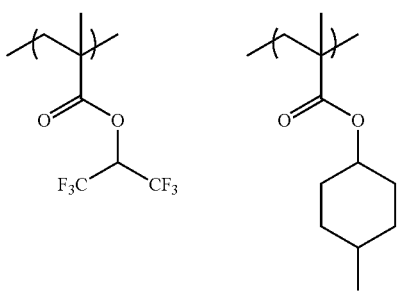
(C-81)
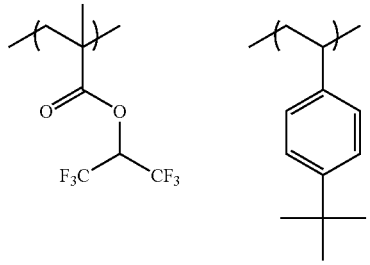
(C-82)
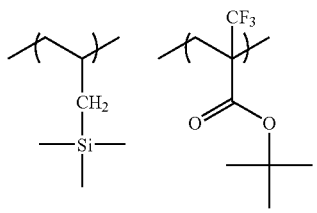
(C-83)
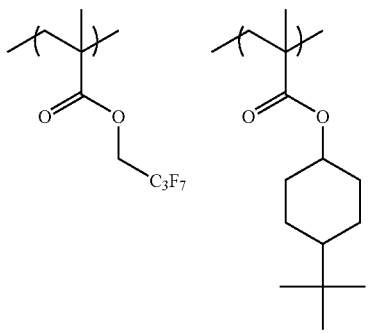

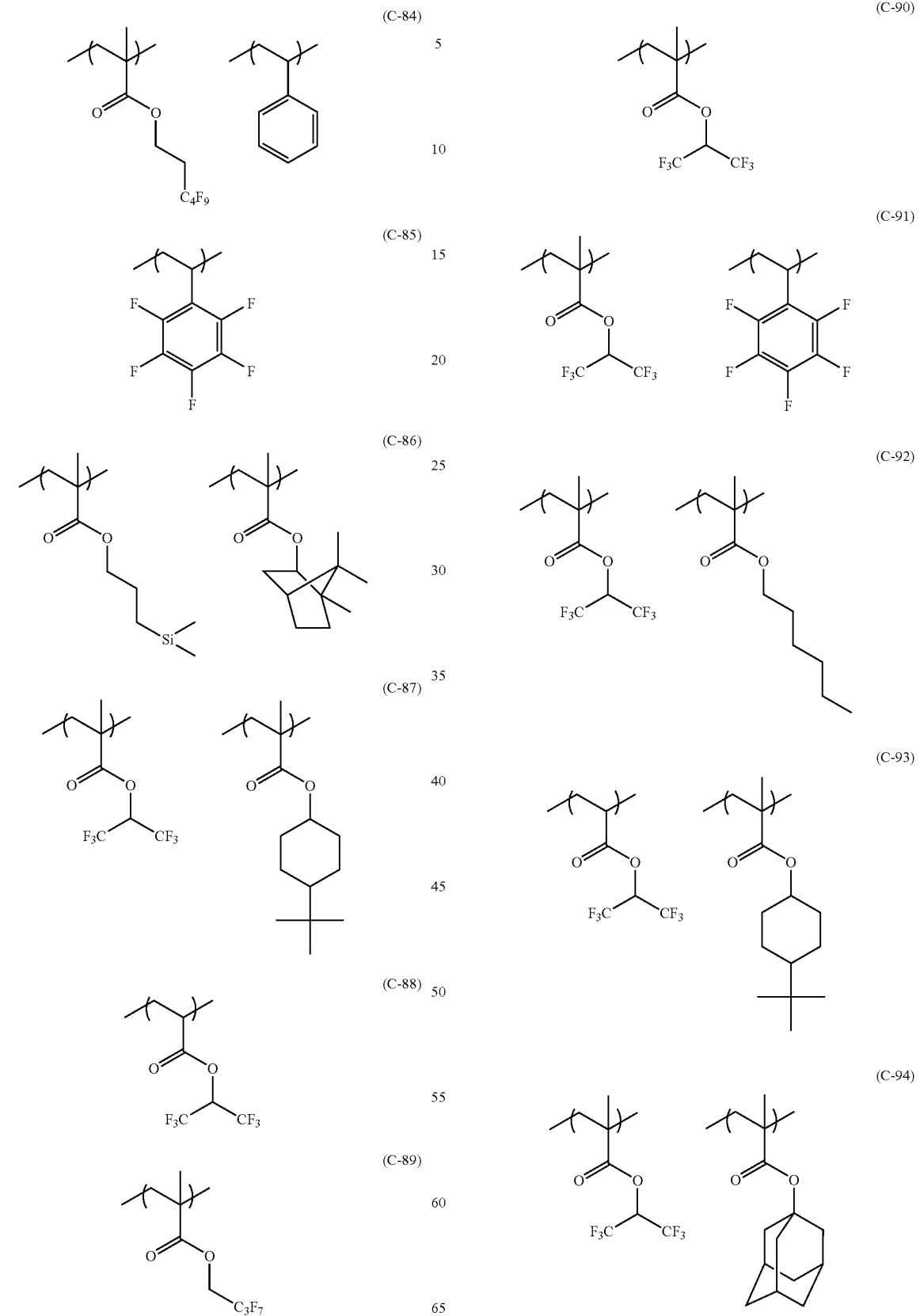

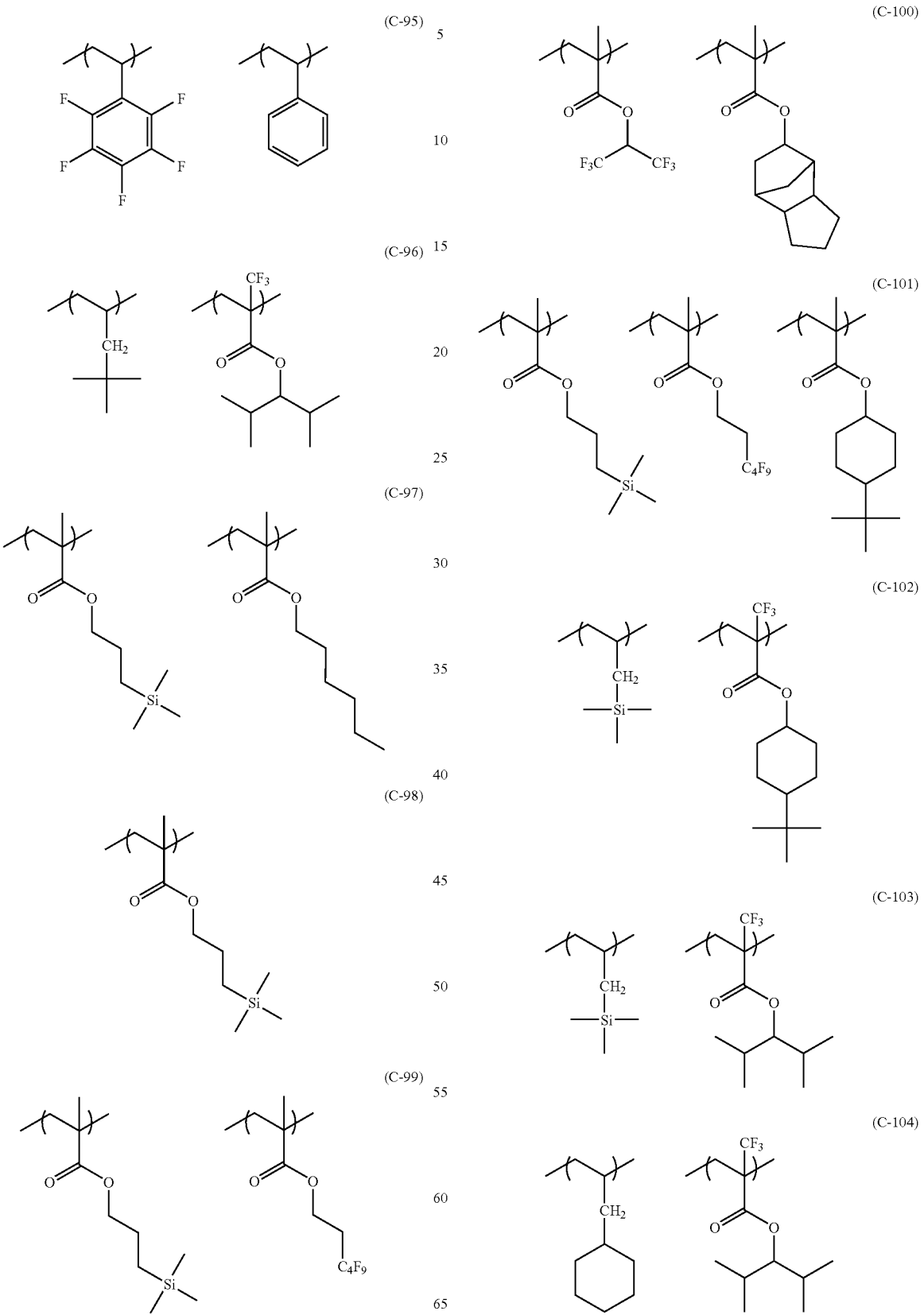

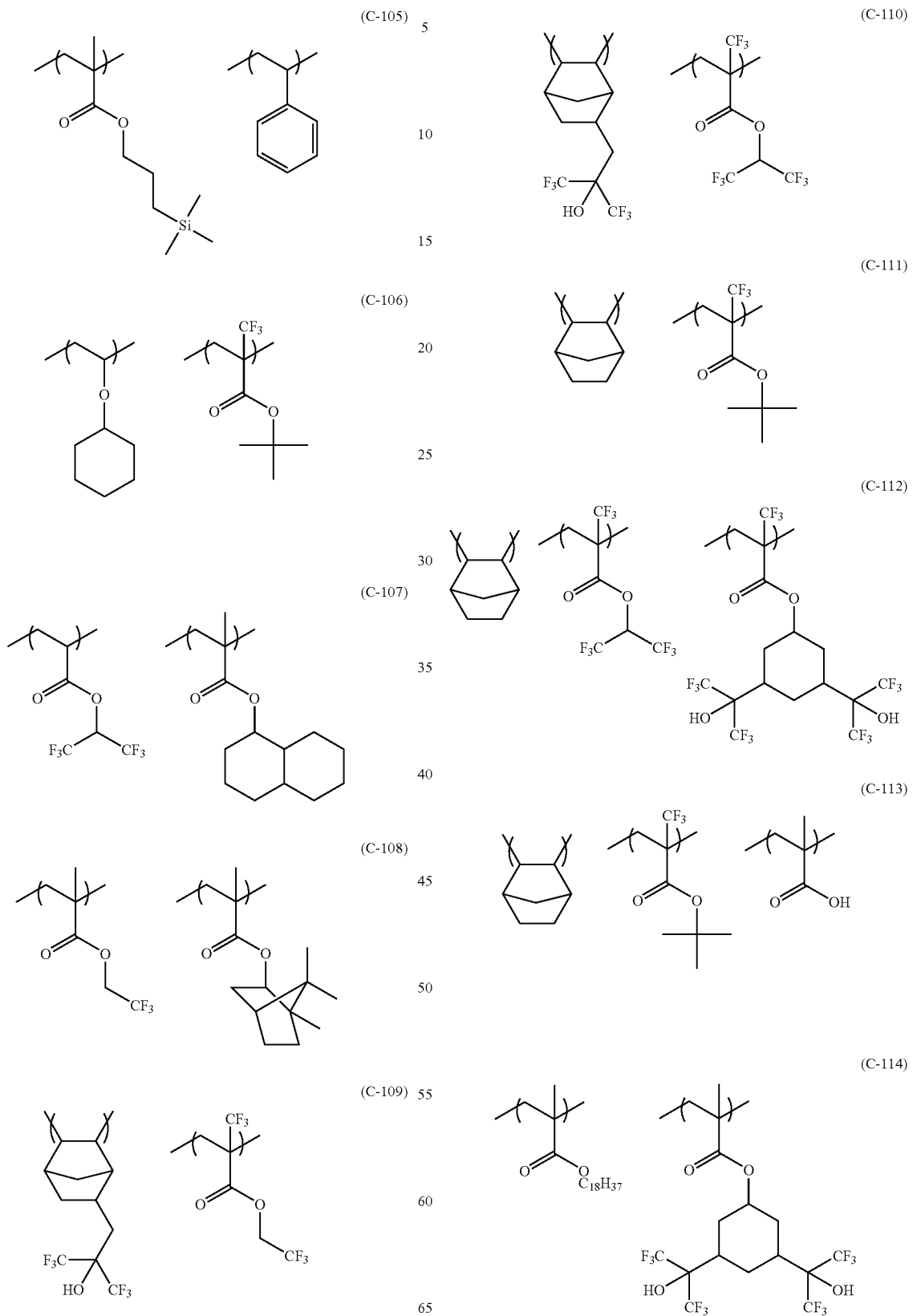

(C-115) 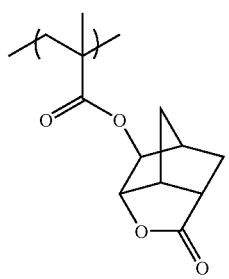 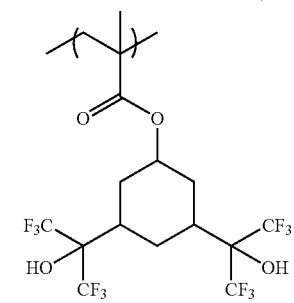
(C-116) 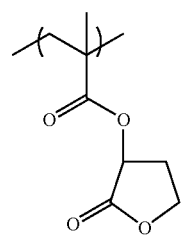 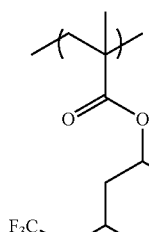
(C-117) 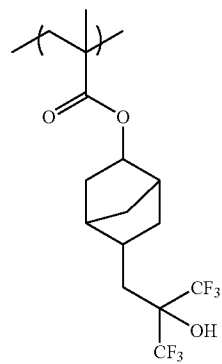
(C-118) 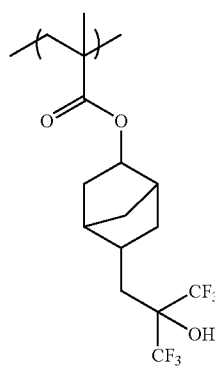 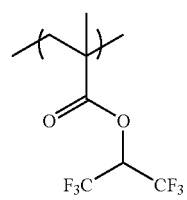
(C-119) 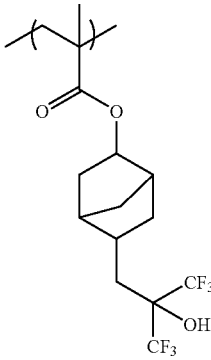 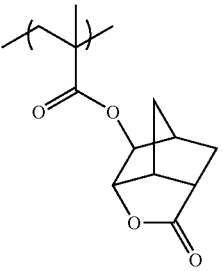
(C-120) 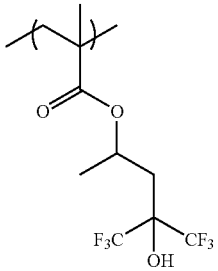 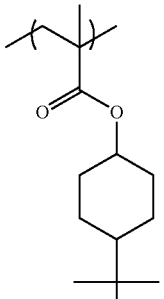
(C-121) 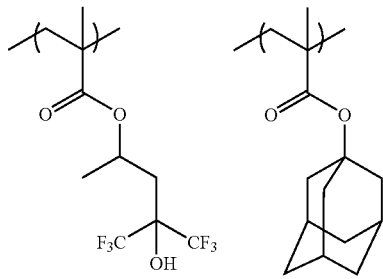
(C-122) 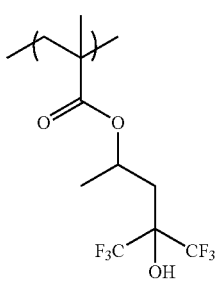 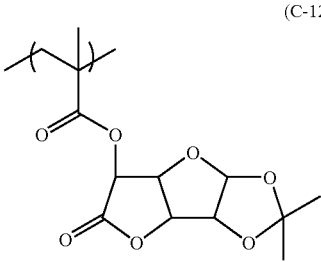
(C-123) 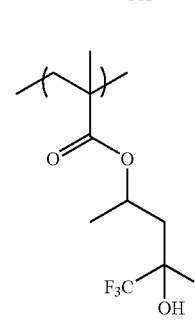 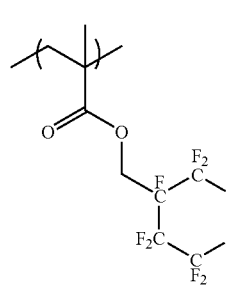

(C-124)
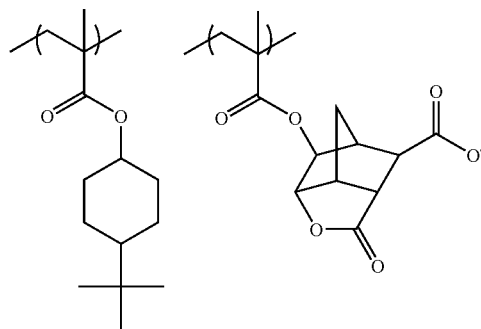
(C-125)
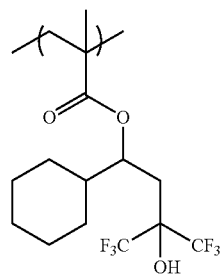
(C-126)
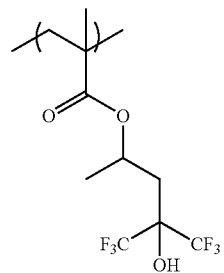
(C-127)
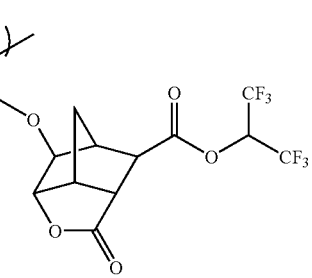
(C-128)
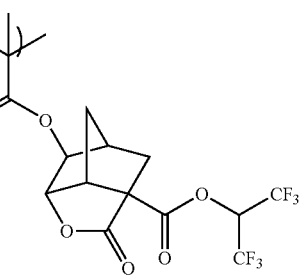
(C-129)
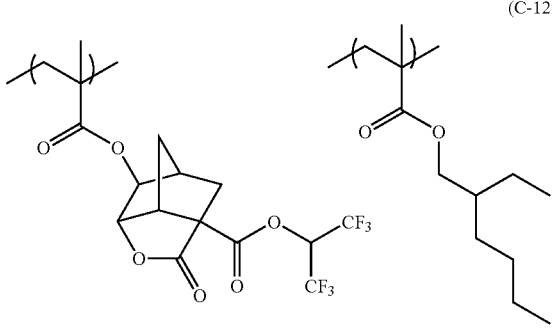
(C-130)
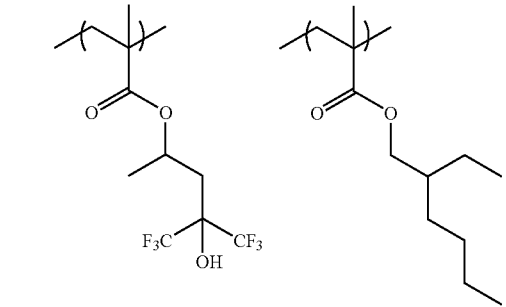
(C-131)
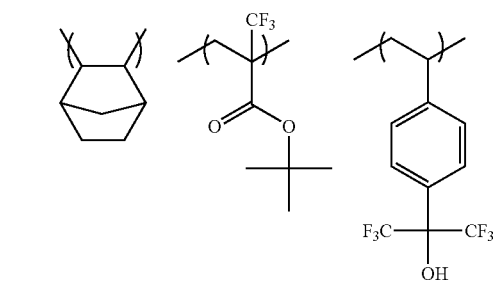
(C-132)
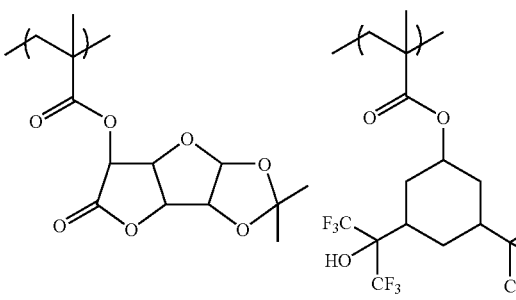
(C-133)
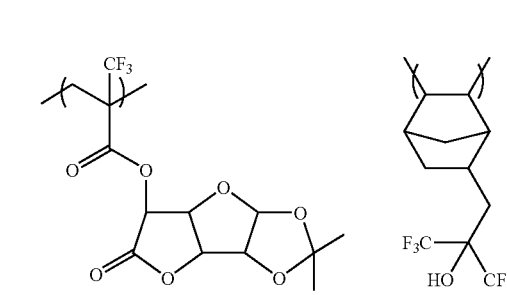

| Resin | Composition | Mw | Mw/Mn |
|---|---|---|---|
| C-1 | 50/50 | 6000 | 1.5 |
| C-2 | 50/50 | 7500 | 1.4 |
| C-3 | 50/50 | 6000 | 1.4 |
| C-4 | 100 | 9000 | 1.5 |
| C-5 | 50/50 | 6000 | 1.4 |
| C-6 | 40/60 | 8000 | 1.4 |
| C-7 | 60/40 | 6000 | 1.4 |
| C-8 | 50/50 | 6500 | 1.4 |
| C-9 | 50/50 | 8000 | 1.4 |
| C-10 | 50/50 | 6500 | 1.4 |
| C-11 | 50/50 | 10000 | 1.6 |
| C-12 | 40/60 | 7500 | 1.4 |
| C-13 | 40/60 | 6500 | 1.4 |
| C-14 | 100 | 8500 | 1.4 |
| C-15 | 40/60 | 7000 | 1.4 |
| C-16 | 60/40 | 7500 | 1.4 |
| C-17 | 40/60 | 6000 | 1.4 |
| C-18 | 50/30/20 | 5000 | 1.4 |
| C-19 | 40/60 | 8500 | 1.5 |
| C-20 | 40/60 | 5500 | 1.4 |
| C-21 | 50/50 | 6000 | 1.4 |
| C-22 | 40/20/40 | 5500 | 1.4 |
| C-23 | 100 | 9500 | 1.5 |
| C-24 | 40/60 | 8500 | 1.4 |
| C-25 | 40/30/30 | 5000 | 1.4 |
| C-26 | 60/40 | 6000 | 1.4 |
| C-27 | 50/10/40 | 8000 | 1.5 |
| C-28 | 50/50 | 6000 | 1.4 |
| C-29 | 50/50 | 5000 | 1.4 |
| C-30 | 40/20/40 | 7000 | 1.4 |
| C-31 | 40/30/30 | 8000 | 1.5 |
| C-32 | 40/30/30 | 9500 | 1.5 |
| C-33 | 70/30 | 9000 | 1.4 |
| C-34 | 60/40 | 9500 | 1.5 |
| C-35 | 40/40/20 | 7500 | 1.4 |
| C-36 | 80/20 | 9000 | 1.5 |
| C-37 | 80/20 | 9000 | 1.5 |
| C-38 | 40/30/15/15 | 7000 | 1.4 |
| C-39 | 60/40 | 8500 | 1.4 |
| C-40 | 50/50 | 7500 | 1.4 |
| C-41 | 60/40 | 9000 | 1.5 |
| C-42 | 80/20 | 10000 | 1.5 |
| C-43 | 40/60 | 8500 | 1.4 |
| C-44 | 30/70 | 5500 | 1.4 |
| C-45 | 20/40/40 | 6500 | 1.4 |
| C-46 | 50/30/20 | 6500 | 1.4 |
| C-47 | 20/50/30 | 7000 | 1.4 |
| C-48 | 35/35/30 | 9000 | 1.5 |
| C-49 | 50/30/20 | 8000 | 1.4 |
| C-50 | 25/45/30 | 9000 | 1.5 |
| C-51 | 30/50/20 | 6000 | 1.4 |
| C-52 | 30/30/40 | 9500 | 1.5 |
| C-53 | 40/40/20 | 8000 | 1.5 |
| C-54 | 10/50/40 | 7000 | 1.4 |
| C-55 | 30/30/40 | 6500 | 1.3 |
| C-56 | 40/30/30 | 8000 | 1.5 |
| C-57 | 40/40/20 | 6000 | 1.3 |
| C-58 | 50/20/30 | 9500 | 1.5 |
| C-59 | 45/40/15 | 7000 | 1.3 |
| C-60 | 30/50/20 | 8000 | 1.3 |
| C-61 | 40/40/20 | 6500 | 1.4 |
| C-62 | 50/30/20 | 8000 | 1.5 |
| C-63 | 35/25/40 | 10000 | 1.5 |
| C-64 | 50/50 | 8000 | 1.5 |
| C-65 | 100 | 5000 | 1.3 |
| C-66 | 100 | 6000 | 1.3 |
| C-67 | 100 | 4500 | 1.3 |
| C-68 | 100 | 5000 | 1.5 |
| C-69 | 100 | 5000 | 1.5 |
| C-70 | 100 | 5500 | 1.4 |
| C-71 | 50/50 | 9000 | 1.5 |
| C-72 | 80/20 | 9000 | 1.5 |
| C-73 | 50/50 | 6500 | 1.4 |
| C-74 | 50/25/25 | 6500 | 1.5 |
| C-75 | 46/50/2/2 | 4500 | 1.4 |
| C-76 | 40/40/20 | 5500 | 1.5 |
| C-77 | 50/30/20 | 6000 | 1.4 |
| C-78 | 60/40 | 8000 | 1.4 |
| C-79 | 50/50 | 7500 | 1.3 |
| C-80 | 50/50 | 8000 | 1.3 |
| C-81 | 50/50 | 7000 | 1.3 |
| C-82 | 50/50 | 8000 | 1.5 |
| C-83 | 60/40 | 6000 | 1.3 |
| C-84 | 70/30 | 8000 | 1.4 |
| C-85 | 100 | 8000 | 1.5 |
| C-86 | 50/50 | 9500 | 1.6 |
| C-87 | 50/50 | 7000 | 1.3 |
| C-88 | 100 | 6000 | 1.4 |
| C-89 | 100 | 8000 | 1.5 |
| C-90 | 100 | 7000 | 1.5 |
| C-91 | 50/50 | 6000 | 1.5 |
| C-92 | 70/30 | 6000 | 1.5 |
| C-93 | 50/50 | 4000 | 1.2 |
| C-94 | 60/40 | 6000 | 1.3 |
| C-95 | 80/20 | 8000 | 1.5 |
| C-96 | 50/50 | 6000 | 1.4 |
| C-97 | 80/20 | 7000 | 1.5 |
| C-98 | 100 | 5000 | 1.3 |
| C-99 | 50/50 | 4000 | 1.3 |
| C-100 | 50/50 | 6000 | 1.3 |
| C-101 | 30/30/40 | 6000 | 1.5 |
| C-102 | 50/50 | 8000 | 1.6 |
| C-103 | 50/50 | 7000 | 1.3 |
| C-104 | 50/50 | 6000 | 1.5 |
| C-105 | 60/40 | 4500 | 1.3 |
| C-106 | 50/50 | 7500 | 1.5 |
| C-107 | 60/40 | 8000 | 1.6 |
| C-108 | 60/40 | 6000 | 1.3 |
| C-109 | 50/50 | 4500 | 1.3 |
| C-110 | 50/50 | 5000 | 1.4 |
| C-111 | 50/50 | 3500 | 1.3 |
| C-112 | 40/30/30 | 4500 | 1.4 |
| C-113 | 50/45/5 | 5000 | 1.5 |
| C-114 | 20/80 | 10000 | 1.5 |
| C-115 | 30/70 | 9500 | 1.4 |
| C-116 | 20/80 | 7500 | 1.3 |
| C-117 | 100 | 5500 | 1.5 |
| C-118 | 80/20 | 5000 | 1.3 |
| C-119 | 70/30 | 8000 | 1.4 |
| C-120 | 80/20 | 9500 | 1.4 |
| C-121 | 80/20 | 7000 | 1.4 |
| C-122 | 80/20 | 8500 | 1.5 |
| C-123 | 80/20 | 5000 | 1.5 |
| C-124 | 20/80 | 10000 | 1.5 |
| C-125 | 100 | 10500 | 1.4 |
| C-126 | 100 | 8000 | 1.5 |
| C-127 | 100 | 8500 | 1.5 |
| C-128 | 100 | 6000 | 1.4 |
| C-129 | 90/10 | 8000 | 1.4 |
| C-130 | 90/10 | 9500 | 1.5 |
| C-131 | 40/40/20 | 5000 | 1.4 |
| C-132 | 30/70 | 9000 | 1.6 |
| C-133 | 50/50 | 4000 | 1.3 |

(D) Solvent

As the solvent that can be used in the preparation of an actinic-ray- or radiation-sensitive resin composition through dissolution of the above-mentioned components, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monomethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination.

In the present invention, a mixed solvent consisting of a mixture of a solvent having a hydroxyl group in its structure and a solvent having no hydroxyl group may be used as the organic solvent.

As the solvent having a hydroxyl group, there can be mentioned, for example, ethylene glycol, ethylene glycol monomethyl ether, ethylene glycol monoethyl ether, propylene glycol, propylene glycol monomethyl ether, propylene glycol monoethyl ether, ethyl lactate or the like. Of these, propylene glycol monomethyl ether and ethyl lactate are especially preferred.

As the solvent having no hydroxyl group, there can be mentioned, for example, propylene glycol monomethyl ether acetate, ethyl ethoxypropionate, 2-heptanone, γ-butyrolactone, cyclohexanone, butyl acetate, N-methylpyrrolidone, N,N-dimethylacetamide, dimethyl sulfoxide or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents containing propylene glycol monomethyl ether acetate.

[Basic Compound]

The actinic-ray- or radiation-sensitive resin composition of the present invention preferably contains a basic compound so as to decrease any performance alteration over time from exposure to heating.

As preferred basic compounds, there can be mentioned the compounds having the structures of the following formulae (A) to (E).

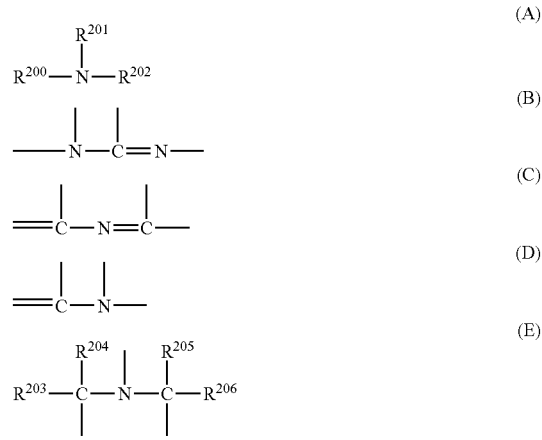

In general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to thereby form a ring.

$R^{203}$, $R^{204}$, $R^{205}$ and $R^{206}$ may be identical to or different from each other and each represent an alkyl group having 1 to 20 carbon atoms.

With respect to this alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

It is more preferred that in general formulae (A) and (E) the alkyl group be unsubstituted.

As preferred compounds, there can be mentioned guanidine, aminopyrrolidine, pyrazole, pyrazoline, piperazine, aminomorpholine, an aminoalkylmorpholine, piperidine and the like. As more preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, a triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, an acetate, an adamantane-1-carboxylate, a perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl)amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

As the amine compound, use can be made of any of primary, secondary and tertiary amine compounds. An amine compound having at least one alkyl group bonded to the nitrogen atom thereof is preferred. Among the amine compounds, a tertiary amine compound is more preferred. In the amine compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. In the amine compounds, it is preferred that the alkyl chain contain an oxygen atom, thereby forming an oxyalkylene group. The number of oxyalkylene groups in each molecule is one or more, preferably 3 to 9 and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

As the ammonium salt compound, use can be made of any of primary, secondary, tertiary and quaternary ammonium salt compounds. An ammonium salt compound having at least one alkyl group bonded to the nitrogen atom thereof is preferred. In the ammonium salt compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. In the ammonium salt compounds, it is preferred that the alkyl chain contain an oxygen atom, thereby forming an oxyalkylene group. The number of oxyalkylene groups in each molecule is one or more, preferably 3 to 9 and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

As the anion of the ammonium salt compounds, there can be mentioned a halogen atom, a sulfonate, a borate, a phosphate or the like. Of these, a halogen atom and a sulfonate are preferred. Among halogen atoms, chloride, bromide and iodide are especially preferred. Among sulfonates, an organic sulfonate having 1 to 20 carbon atoms is especially preferred. As the organic sulfonate, there can be mentioned an alkyl sulfonate having 1 to 20 carbon atoms and an aryl sulfonate. The alkyl group of the alkyl sulfonate may have a substituent. As the substituent, there can be mentioned, for example, fluorine, chlorine, bromine, an alkoxy group, an acyl group, an aryl group or the like. As specific alkyl sulfonates, there can be mentioned methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate and the like. As the aryl group of the aryl sulfonate, there can be mentioned a benzene ring, a naphthalene ring or an anthracene ring. The benzene ring, naphthalene ring or anthracene ring may have a substituent. As preferred substituents, there can be mentioned a linear or branched alkyl group having 1 to 6 carbon atoms and a cycloalkyl group having 3 to 6 carbon atoms. As specific linear or branched alkyl groups and cycloalkyl groups, there can be mentioned methyl, ethyl, n-propyl, isopropyl, n-butyl, i-butyl, t-butyl, n-hexyl, cyclohexyl and the like. As other substituents, there can be mentioned an alkoxy group having 1 to 6 carbon atoms, a halogen atom, cyano, nitro, an acyl group, an acyloxy group and the like.

The amine compound having a phenoxy group or ammonium salt compound having a phenoxy group is one having a phenoxy group at the end of alkyl group of amine compound or ammonium salt compound opposed to the nitrogen atom. The phenoxy group may have a substituent. As the substituent of the phenoxy group, there can be mentioned, for example, an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like. The substitution position of the substituent may be any of 2- to 6-positions. The number of substituents is optional within the range of 1 to 5.

It is preferred that at least one oxyalkylene group exist between the phenoxy group and the nitrogen atom. The number of oxyalkylene groups in each molecule is one or more, preferably 3 to 9 and further preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

The sulfonic ester group of the amine compound having a sulfonic ester group or ammonium salt compound having a sulfonic ester group may be any of an alkylsulfonic ester, cycloalkylsulfonic ester and arylsulfonic ester. In the alkylsulfonic ester, the alkyl group preferably has 1 to 20 carbon atoms. In the cycloalkylsulfonic ester, the cycloalkyl group preferably has 3 to 20 carbon atoms. In the arylsulfonic ester, the aryl group preferably has 6 to 12 carbon atoms. The alkylsulfonic ester, cycloalkylsulfonic ester and arylsulfonic ester may have substituents. As preferred substituents, there can be mentioned a halogen atom, a cyano group, a nitro group, a carboxyl group, a carboxylic ester group and a sulfonic ester group.

It is preferred that at least one oxyalkylene group exist between the sulfonic ester group and the nitrogen atom. The number of oxyalkylene groups in each molecule is one or more, preferably 3 to 9 and further preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group.

Furthermore, use may be made of a basic compound having a carbamate group on its nitrogen atom. The carbamate group can be expressed by the following general formula.

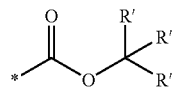
(d-1)

In general formula (d-1), each of R's independently represents a hydrogen atom, a linear or branched alkyl group, a cycloalkyl group, an aryl group, an aralkyl group or an alkoxyalkyl group. The R's may be bonded to each other to thereby form a ring.

Preferably, each of R's represents a linear or branched alkyl group, a cycloalkyl group or an aryl group, more preferably a linear or branched alkyl group or a cycloalkyl group.

In the general formula, * represents the bonding site with a nitrogen atom.

Particular structures are as follows.

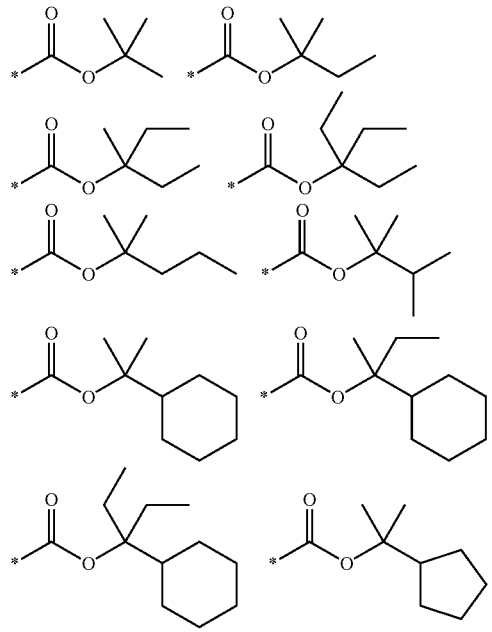

-continued

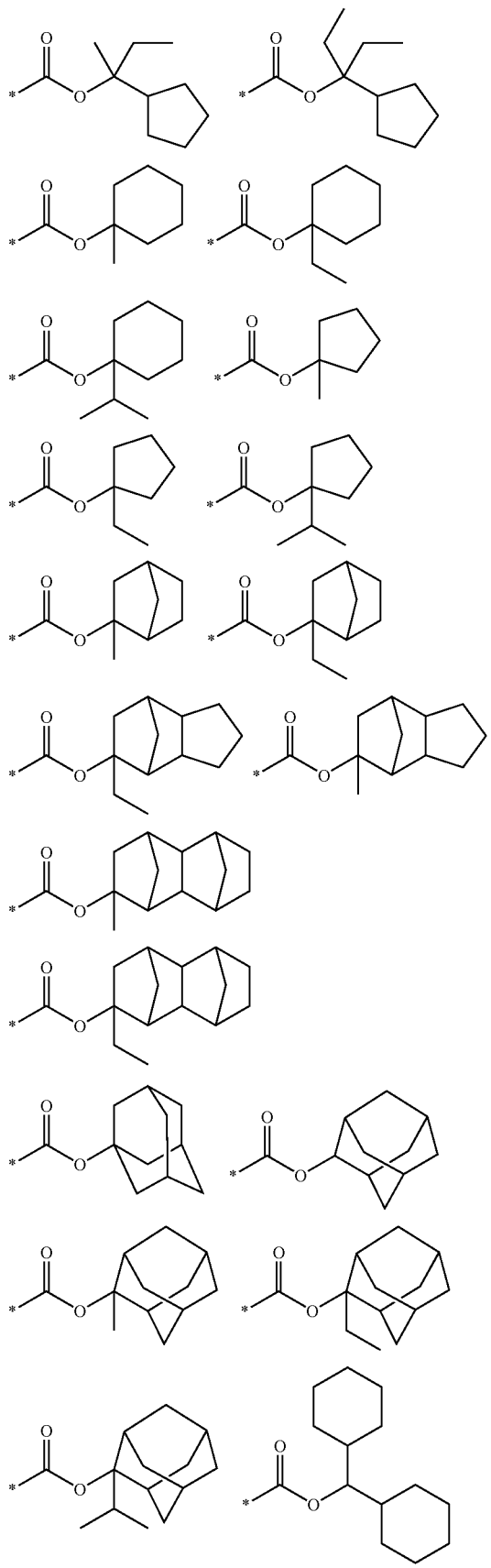

-continued

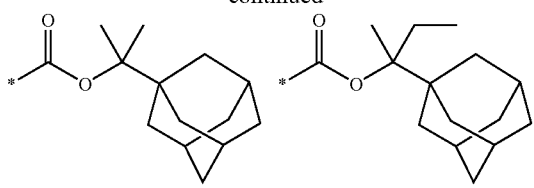
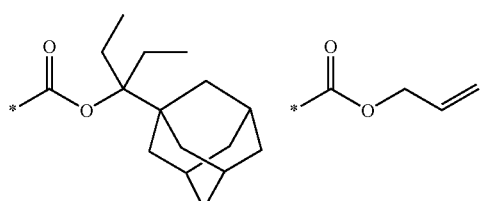
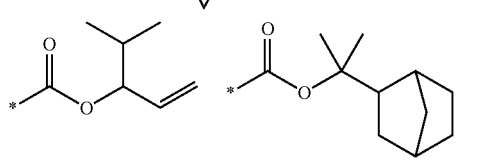
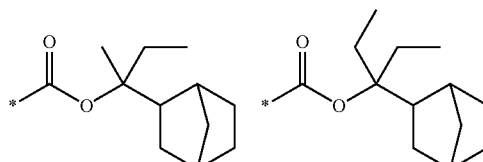
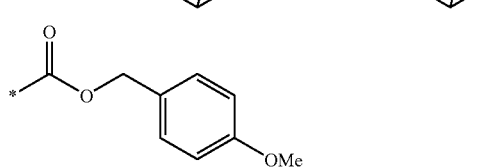
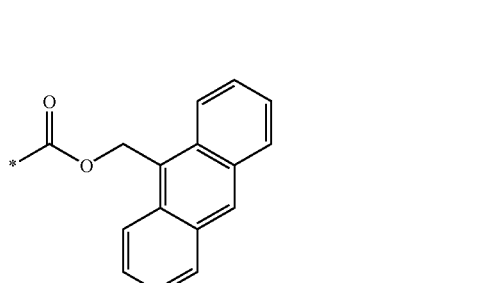
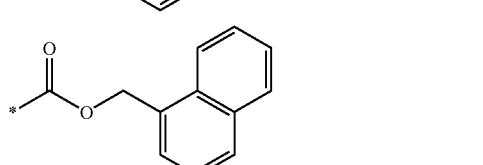
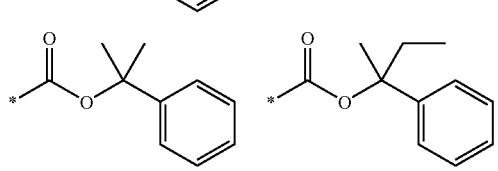
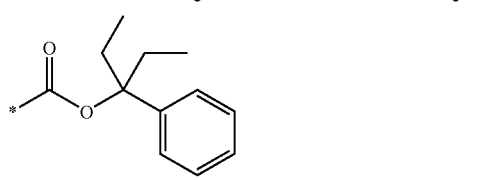

-continued

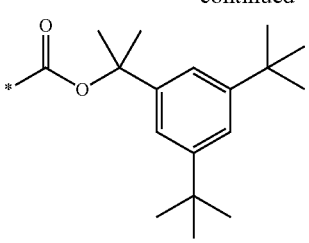

Desirable basic compounds can be formed by an arbitrary combination of the above-mentioned basic compounds with the structures of general formula (d-1).

Specific examples of the especially preferred compounds (D) as the basic compound having a carbamate group according to the present invention will be shown below, which however in no way limit the scope of the present invention.

(D-1)
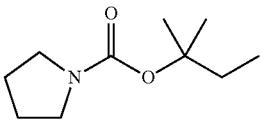

(D-2)
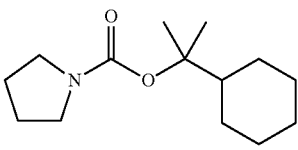

(D-3)
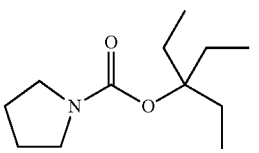

(D-4)
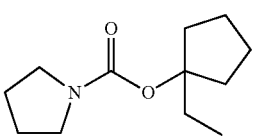

(D-5)
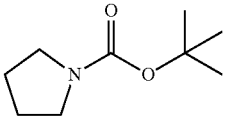

(D-6)
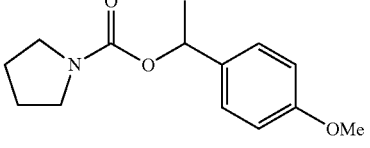

(D-7)
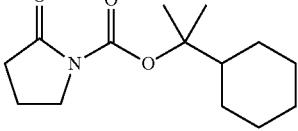

-continued
(D-8) 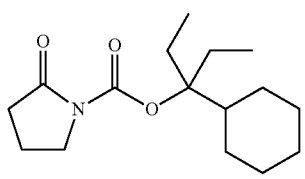
(D-9) 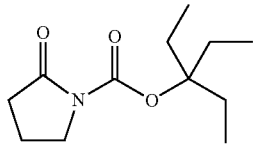
(D-10) 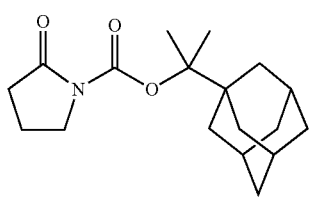
(D-11) 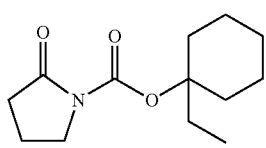
(D-12) 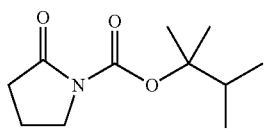
(D-13) 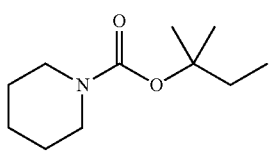
(D-14) 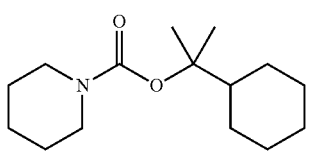
(D-15) 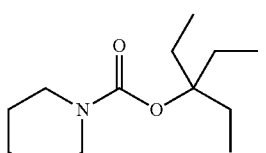
(D-16) 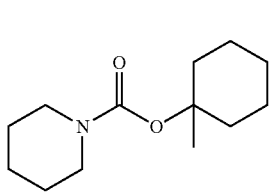
-continued
(D-17) 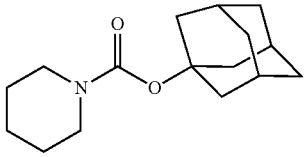
(D-18) 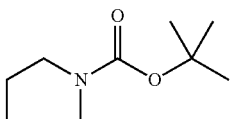
(D-19) 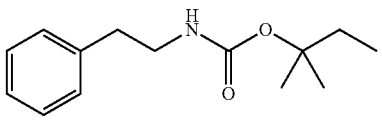
(D-20) 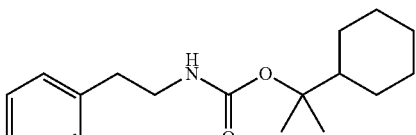
(D-21) 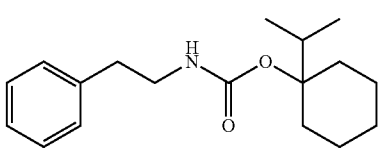
(D-22) 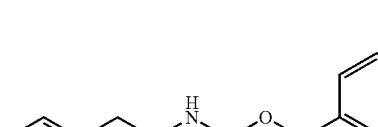
(D-23) 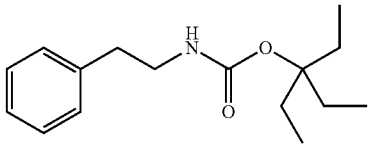
(D-24) 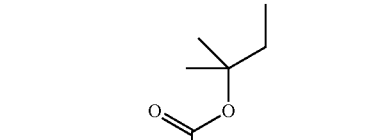

(D-25)
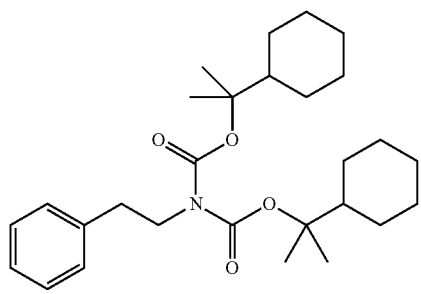
(D-30)
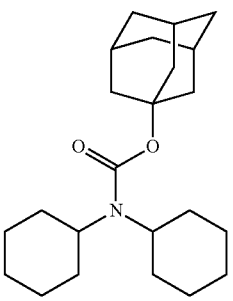
(D-26)
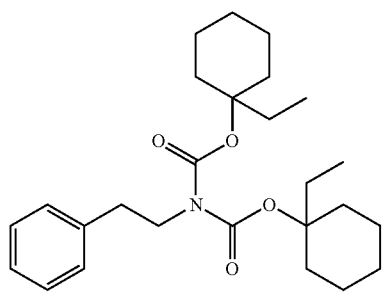
(D-31)
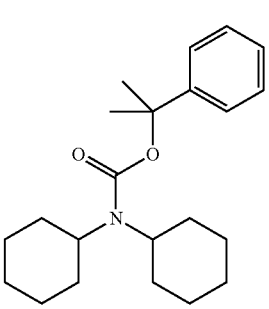
(D-27)
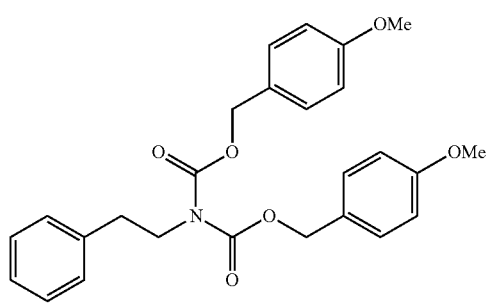
(D-32)
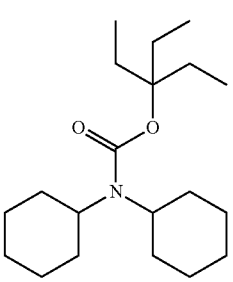
(D-28)
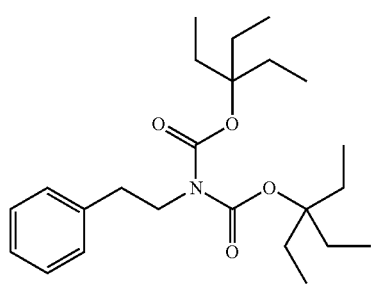
(D-33)
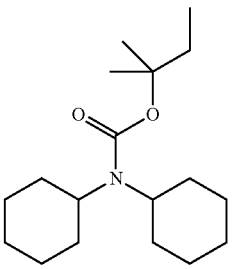
(D-29)
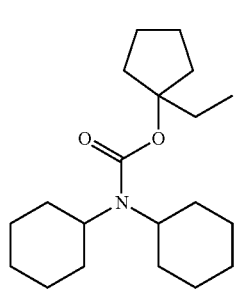
(D-34)
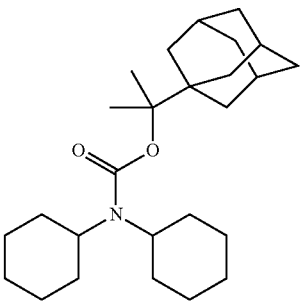

(D-35)
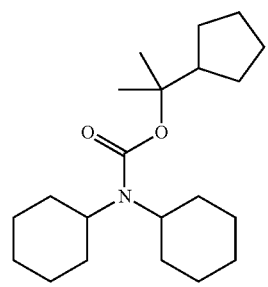
(D-36)
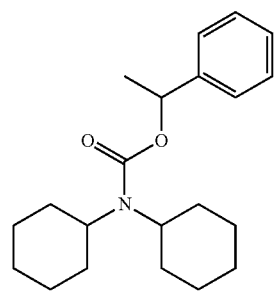
(D-37)
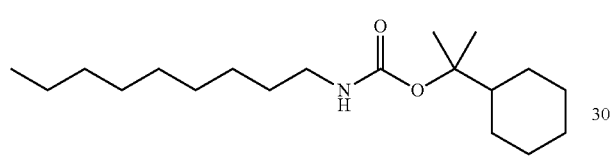
(D-38)
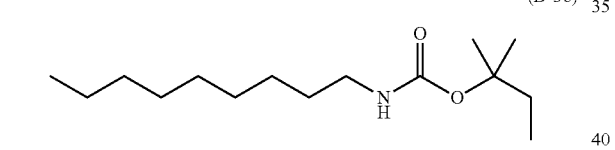
(D-39)
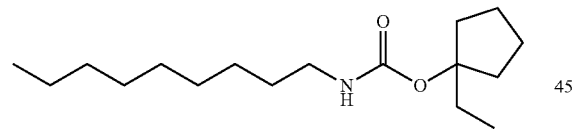
(D-40)
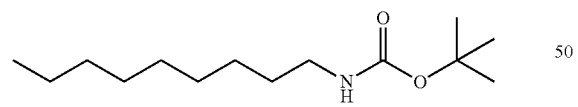
(D-41)
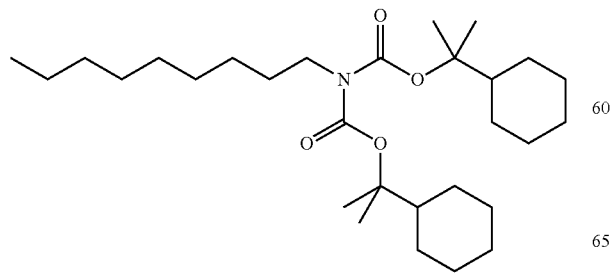
(D-42)
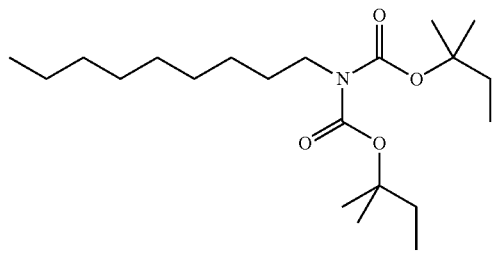
(D-43)
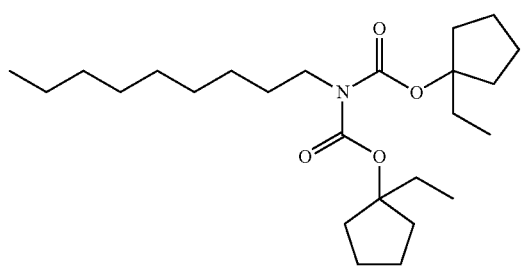
(D-44)
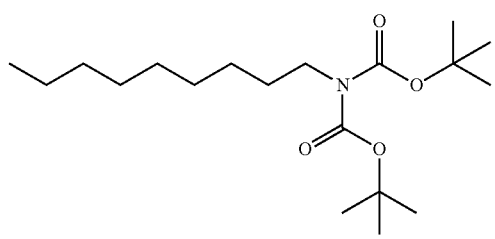
(D-45)
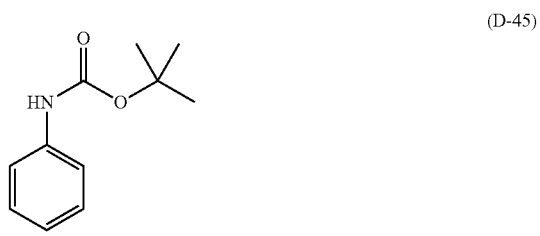
(D-46)
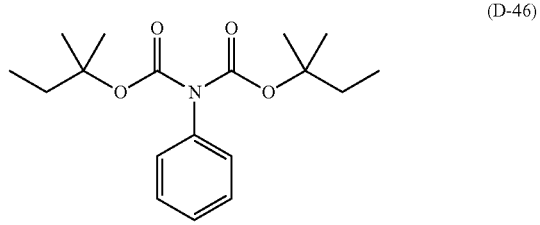
(D-47)
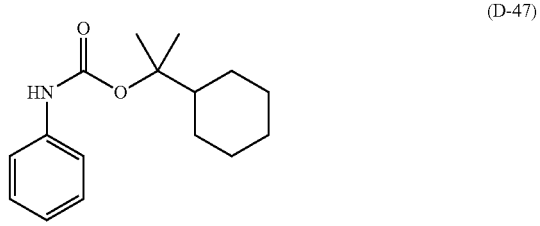

-continued

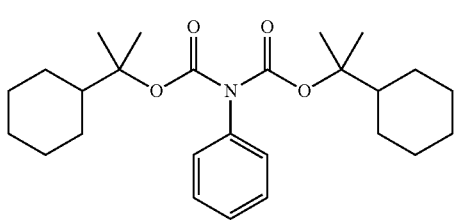
(D-48)

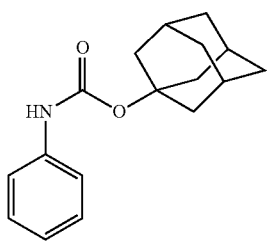
(D-49)

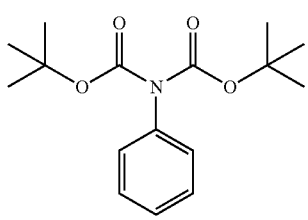
(D-50)

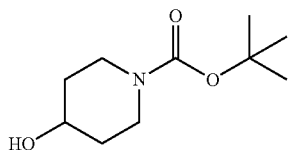
(D-51)

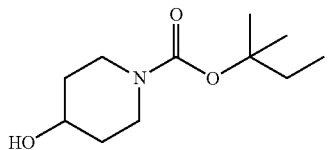
(D-52)

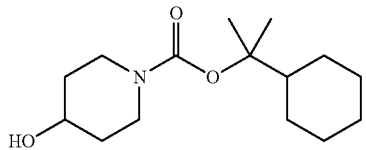
(D-53)

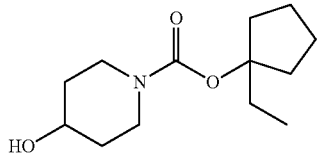
(D-54)

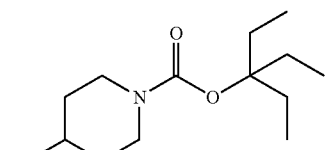
(D-55)

These basic compounds are used individually or in combination.

The amount of basic compound used is generally in the range of 0.001 to 10 mass %, preferably 0.01 to 5 mass % based on the total solid content of the actinic-ray- or radiation-sensitive resin composition.

With respect to the ratio of the acid generator to basic compound used in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of inhibition of any resolving power drop due to the thickening of the resist pattern over time up to heating treatment after exposure. The acid generator/basic compound (molar ratio) is more preferably in the range of 5.0 to 200, still more preferably 7.0 to 150.

[Surfactant]

The actinic-ray- or radiation-sensitive resin composition of the present invention preferably further contains a surfactant, and more preferably contains any one, or two or more members, of fluorinated and/or siliconized surfactants (fluorinated surfactant, siliconized surfactant and surfactant containing both fluorine and silicon atoms).

The actinic-ray- or radiation-sensitive resin composition of the present invention when containing the above surfactant would, in the use of an exposure light source of 250 nm or below, especially 220 nm or below, realize a favorable sensitivity and resolving power and produce a pattern of less adhesion and development defects.

As the fluorinated and/or siliconized surfactants, there can be mentioned, for example, those described in JP-As 62-36663, 61-226746, 61-226745, 62-170950, 63-34540, 7-230165, 8-62834, 9-54432, 9-5988 and 2002-277862 and U.S. Pat. Nos. 5,405,720, 5,360,692, 5,529,881, 5,296,330, 5,436,098, 5,576,143, 5,294,511 and 5,824,451. Any of the following commercially available surfactants can be used as is.

As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and poly(oxyalkylene) acrylate and/or poly (oxyalkylene) methacrylate, which copolymer may have a random distribution or may result from block copolymerization. As the poly(oxyalkylene) group, there can be mentioned a poly(oxyethylene) group, a poly(oxypropylene) group, a poly(oxybutylene) group or the like. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and poly(oxyalkylene) acrylate (or methacrylate), a copolymer from an acrylate (or methacrylate) having a $C_3F_7$ group, poly(oxyethylene) acrylate (or methacrylate) and poly(oxypropylene) acrylate (or methacrylate), or the like.

In the present invention, surfactants other than the fluorinated and/or siliconized surfactants can also be employed. In particular, there can be mentioned, for example, nonionic surfactants consisting of a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, or the like.

These surfactants may be used either individually or in combination.

The amount of surfactant used is preferably in the range of 0.0001 to 2 mass %, more preferably 0.001 to 1 mass % based on the total mass of the actinic-ray- or radiation-sensitive resin composition (excluding the solvent).

[Carboxylic Acid Onium Salt]

The actinic-ray- or radiation-sensitive resin composition of the present invention may contain a carboxylic acid onium salt. As the carboxylic acid onium salt, there can be mentioned, for example, a carboxylic acid sulfonium salt, a carboxylic acid iodonium salt, a carboxylic acid ammonium salt or the like. The especially preferred carboxylic acid onium salts are the iodonium salt and the sulfonium salt. It is preferred for the carboxylate residue of the carboxylic acid onium salt for use in the present invention to be one containing neither an aromatic group nor a carbon-carbon double bond. In particular, the especially preferred anion moiety thereof is a linear or branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. Accordingly, transparency to light of wavelength 220 nm or shorter, enhancement of the sensitivity and resolving power, and improvement of the dependency on density distribution and exposure margin is attainable.

As the fluorinated carboxylic acid anion, there can be mentioned any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid, or the like.

These carboxylic acid onium salts can be synthesized by reacting a sulfonium hydroxide, an iodonium hydroxide or an ammonium hydroxide and a carboxylic acid with silver oxide in an appropriate solvent.

The content of carboxylic acid onium salt in the composition is generally in the range of 0.1 to 20 mass %, preferably 0.5 to 10 mass % and still more preferably 1 to 7 mass % based on the total solids of the composition.

[Dissolution inhibiting compound of 3000 or less molecular weight that is decomposed by the action of an acid to thereby increase the solubility in an alkali developer]

The actinic-ray- or radiation-sensitive resin composition of the present invention may contain a dissolution inhibiting compound of 3000 or less molecular weight that is decomposed by the action of an acid to thereby increase the solubility in an alkali developer (hereinafter also referred to as "dissolution inhibiting compound"). From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to resin (A).

When the actinic-ray- or radiation-sensitive resin composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

In the present invention, the molecular weight of each dissolution inhibiting compound is 3000 or less, preferably 300 to 3000 and more preferably 500 to 2500.

The amount of dissolution inhibiting compound added is preferably in the range of 2 to 50 mass %, more preferably 3 to 30 mass % and still more preferably 5 to 10 mass % based on the total solids of the positive photosensitive composition.

Specific examples of the dissolution inhibiting compounds will be shown below, which however in no way limit the scope of the present invention.

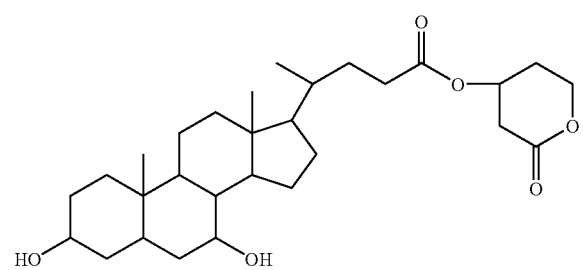

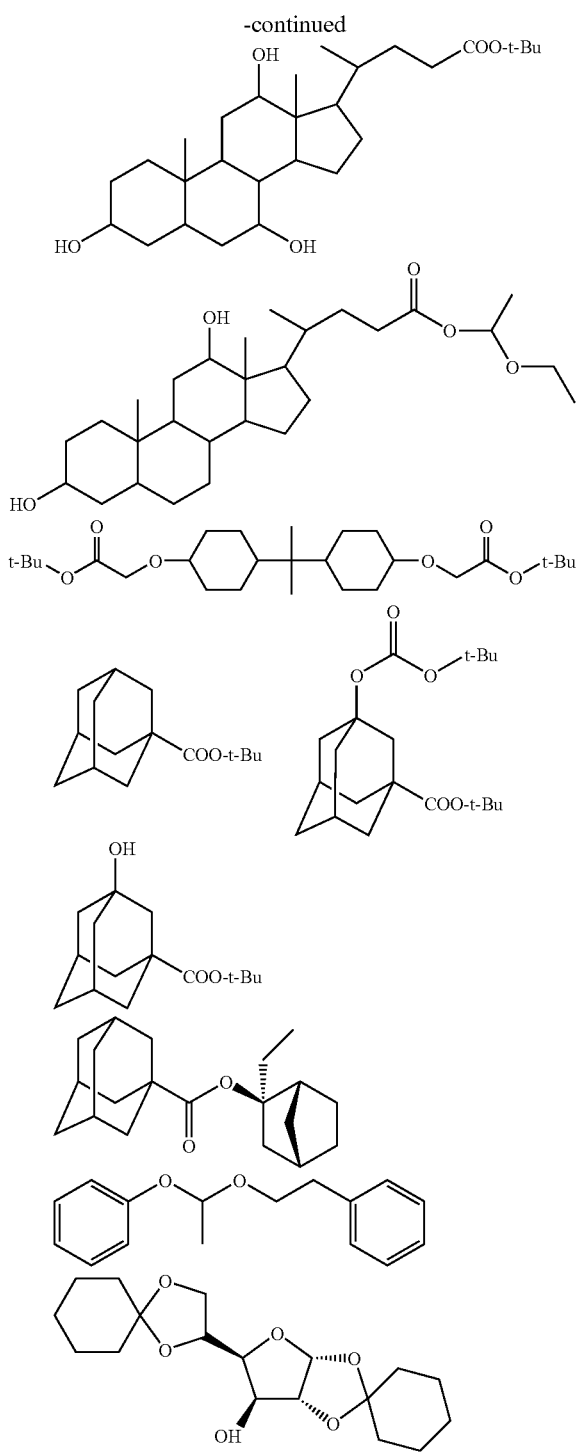

[Other Additives]

The actinic-ray- or radiation-sensitive resin composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

[Method of Forming Pattern]

From the viewpoint of enhancement of resolving power, it is preferred for the actinic-ray- or radiation-sensitive resin composition of the present invention to be used with a coating thickness of 30 to 250 nm. More preferably, the actinic-ray- or radiation-sensitive resin composition is used with a coating thickness of 30 to 200 nm. This coating thickness can be attained by setting the solid content of the actinic-ray- or radiation-sensitive resin composition within an appropriate range so as to cause the composition to have an appropriate viscosity, thereby improving the applicability and film forming property.

The total solid content of the actinic-ray- or radiation-sensitive resin composition is generally in the range of 1 to 10 mass %, preferably 1 to 8 mass % and more preferably 1 to 6 mass %.

The actinic-ray- or radiation-sensitive resin composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, especially 0.05 μm or less and more especially 0.03 μm or less.

For example, the actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a film.

The film is exposed through a given mask to actinic rays or radiation, preferably baked (heated), and developed and rinsed. Accordingly, a desirable pattern can be obtained.

As the actinic rays or radiation, there can be mentioned infrared rays, visible light, ultraviolet rays, far-ultraviolet rays, extreme ultraviolet rays, X-rays, electron beams or the like. Among them, preferred use is made of far-ultraviolet rays of wavelength especially 250 nm or less, more especially 220 nm or less and still more especially 1 to 200 nm, such as a KrF excimer laser (248 nm), an ArF excimer laser (193 nm) and an F2 excimer laser (157 nm), as well as X-rays, electron beams and the like. More preferred use is made of an ArF excimer laser, an F2 excimer laser, EUV (13 nm) and electron beams.

Prior to the formation of a film, the substrate may be coated with an antireflection film.

As the antireflection film, use can be made of not only an inorganic film of titanium, titanium dioxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

In the development step, an alkali developer is used as follows. As the alkali developer for the actinic-ray- or radiation-sensitive resin composition, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

At the time of irradiation with actinic rays or radiation, exposure (liquid immersion exposure) may be carried out after filling the interstice between film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the film of the actinic-ray- or radiation-sensitive resin composition. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be an aqueous solution or an organic solvent.

In the use of water as a liquid for liquid immersion, a slight proportion of additive (liquid) that would not dissolve the film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193-nm rays or an impurity whose refractive index is greatly different from that of water is mixed therein, the mixing would invite a distortion of optical image projected on the film. Accordingly, it is preferred to use distilled water as the liquid immersion water. Furthermore, use may be made of pure water having been filtered through an ion exchange filter or the like.

Desirably, the electrical resistance of the water is 18.3 MΩcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or alternatively heavy water ($D_2O$) may be used in place of water.

A film that is highly insoluble in the liquid for liquid immersion (hereinafter also referred to as a "top coat") may be provided between the film of the actinic-ray- or radiation-sensitive resin composition of the present invention and the liquid for liquid immersion for the prevention of direct contact of this film with the liquid for liquid immersion. The functions to be fulfilled by the top coat are applicability to an upper layer portion of the film, transparency in radiation of especially 193 nm and being highly insoluble in the liquid for liquid immersion. Preferably, the top coat does not mix with the resist and is uniformly applicable to an upper layer of the resist.

From the viewpoint of 193-nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned resins (C) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or alternatively a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the resist film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film of the actinic-ray- or radiation-sensitive resin composition and also does not mix with the liquid for liquid immersion. From this viewpoint, when the liquid for liquid immersion is water, it is preferred for the solvent used in the top coat to be highly insoluble in the solvent used in the actinic-ray- or radiation-sensitive resin composition and be a non-water-soluble medium. When the liquid for liquid immersion is an organic solvent, the top coat may be soluble or insoluble in water.

EXAMPLE

The present invention will now be described in greater detail with reference to the following Examples, which however in no way limit the gist of the present invention.

Synthetic Example 1 Synthesis of Resin (C-90)

First, 20 g of hexafluoroisopropyl methacrylate was dissolved in 40 g of propylene glycol monomethyl ether acetate. Then, 8 mol % of polymerization initiator V601 produced by Wako Pure Chemical Industries, Ltd. was added to the solution. The mixture was dropped into 40 g of propylene glycol monomethyl ether acetate heated at 80° C. in a nitrogen atmosphere over a period of 6 hours. After the completion of the dropping, the reaction mixture was agitated for 2 hours so as to finalize the reaction. After the finalization of the reaction, the mixture was cooled to room temperature and was subjected to recrystallization from 1000 ml of methanol. The thus precipitated white powder was collected by filtration, thereby recovering 12 g of a desired resin (C-90).

The weight average molecular weight of the obtained resin in terms of standard polystyrene molecular weight determined by GPC measurement was 7000 and the dispersity (Mw/Mn) thereof was 1.5.

In the same manner, the other resins (c) of the following Table 3 were synthesized.

Synthetic Example 2 Synthesis of Resin (1)

In a nitrogen stream, 8.6 g of cyclohexanone was placed in a three-necked flask and heated at 80° C. A solution obtained by dissolving 9.8 g of 2-adamantylisopropyl methacrylate, 4.4 g of dihydroxyadamantyl methacrylate, 8.9 g of norbornane lactone methacrylate and further 8 mol %, based on the monomers, of polymerization initiator V601 (produced by Wako Pure Chemical Industries, Ltd.) in 79 g of cyclohexanone was dropped thereinto over a period of 6 hours. After the completion of the dropping, reaction was continued at 80° C. for 2 hours. The reaction mixture was allowed to stand still to cool and was dropped into a mixed liquid consisting of hexane/ethyl acetate (800 ml/200 ml) over a period of 20 min. The thus precipitated powder was collected by filtration and dried, thereby obtaining 19 g of a desired resin (1). The weight average molecular weight of the obtained resin in terms of standard polystyrene molecular weight was 8800 and the dispersity (Mw/Mn) thereof was 1.9.

In the same manner, the following other resins (A) were synthesized.

The structures of the acid-decomposable resins (A) employed in the Examples will be shown below. The following Table 2 indicates the molar ratios of individual repeating units (in order from the left in each structural formula), the weight average molecular weight (Mw) and the dispersity (Mw/Mn) with respect to each of the resins.

TABLE 2

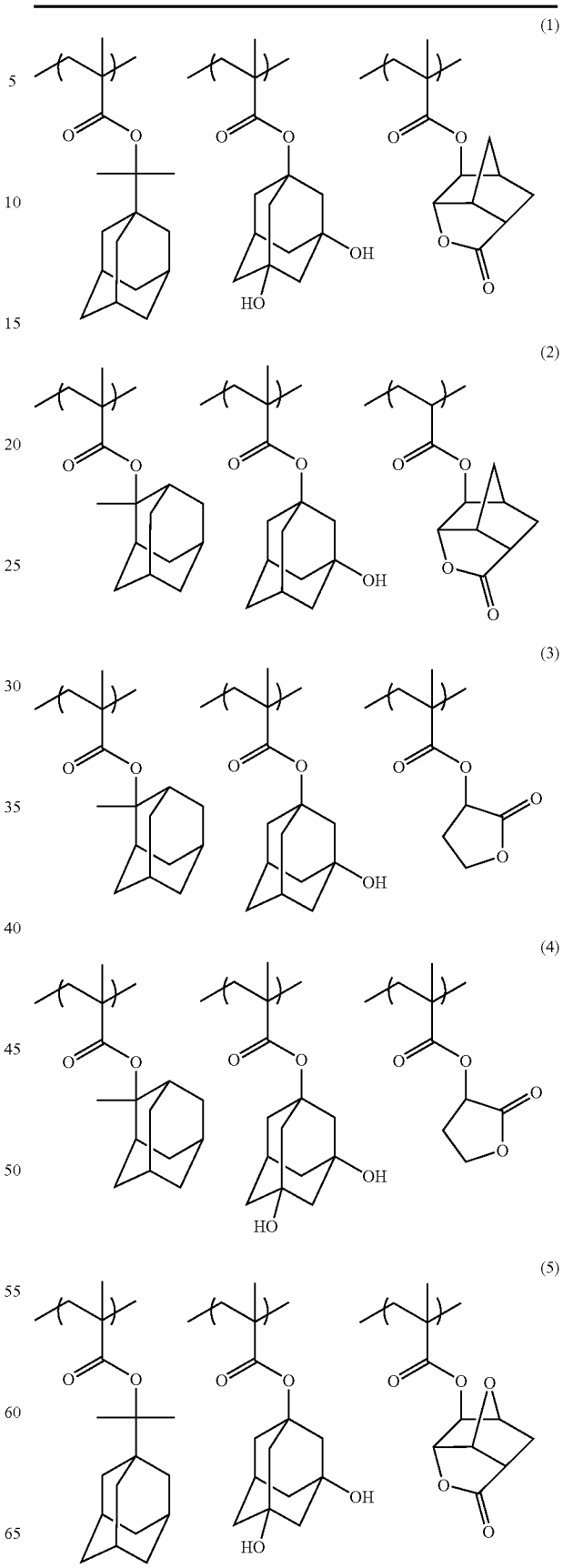

TABLE 2-continued
(6)
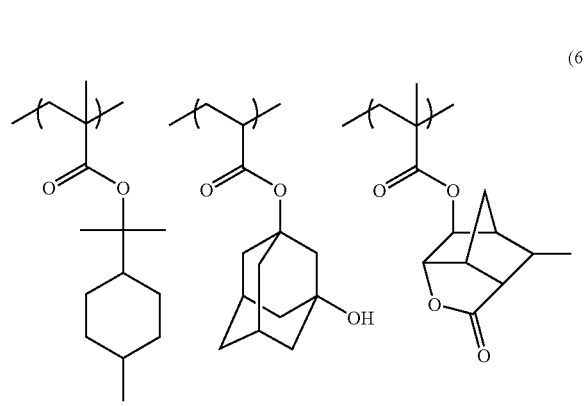
(7)
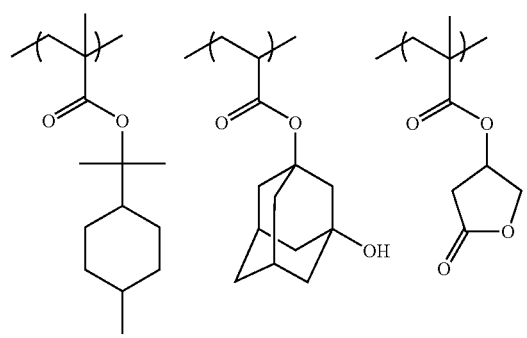
(8)
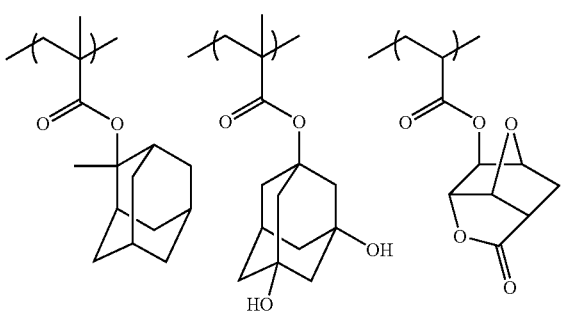
(9)
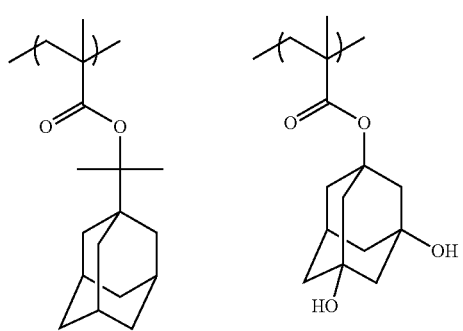
TABLE 2-continued
(5)
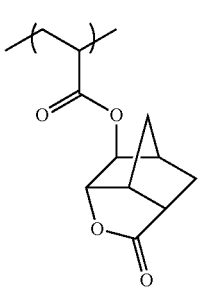
(10)
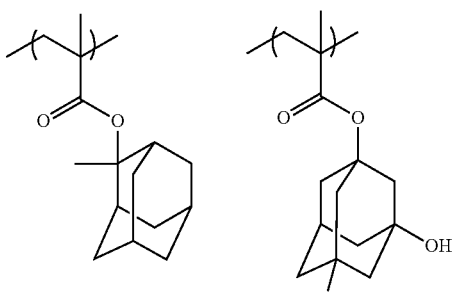
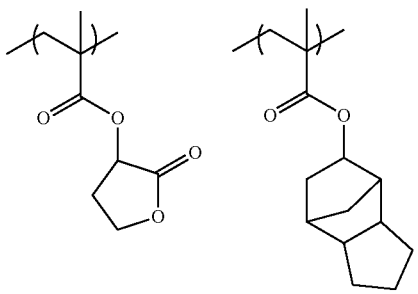
(11)
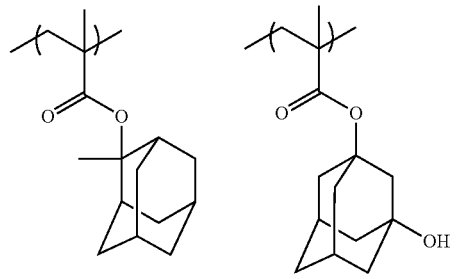
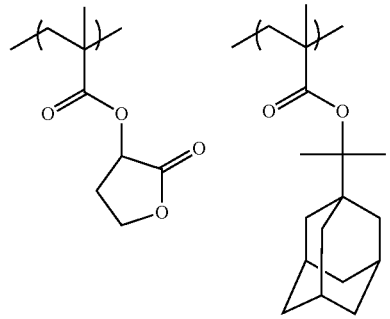

TABLE 2-continued
(12)
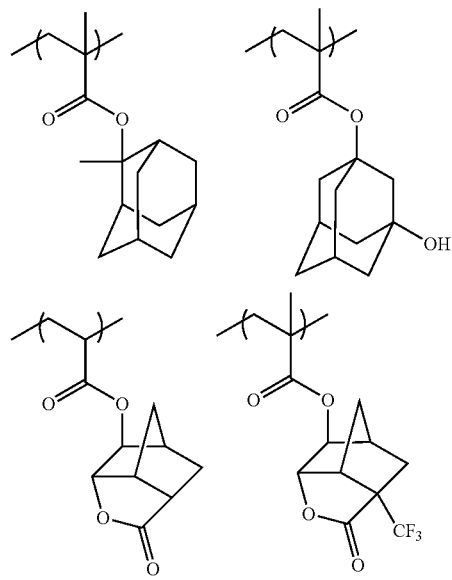
(13)
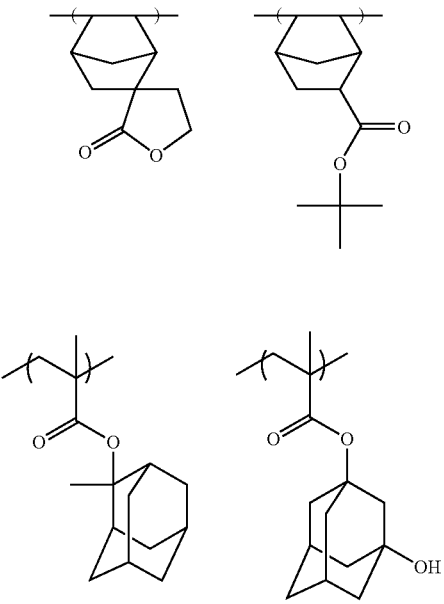
(14)
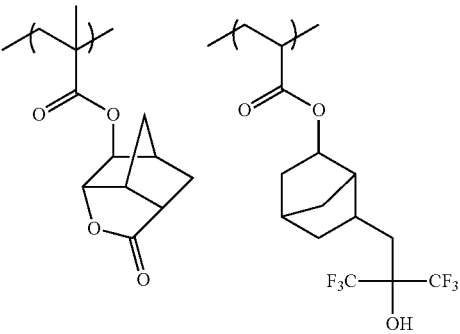
TABLE 2-continued
(15)
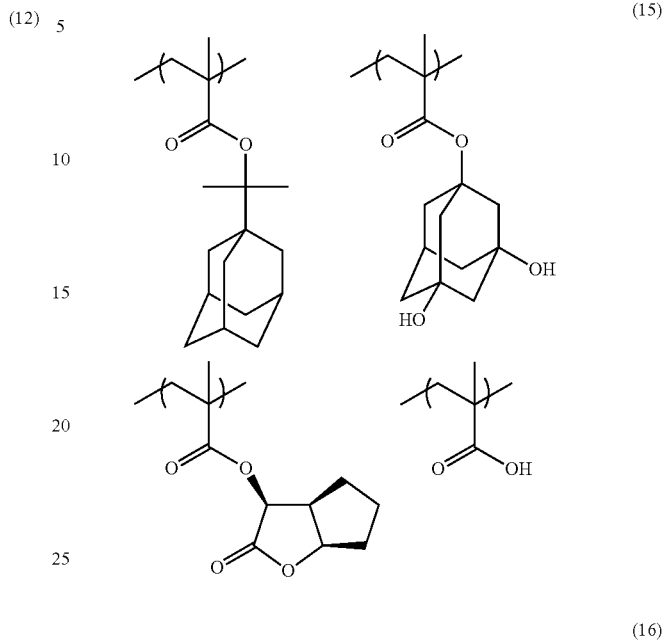
(16)
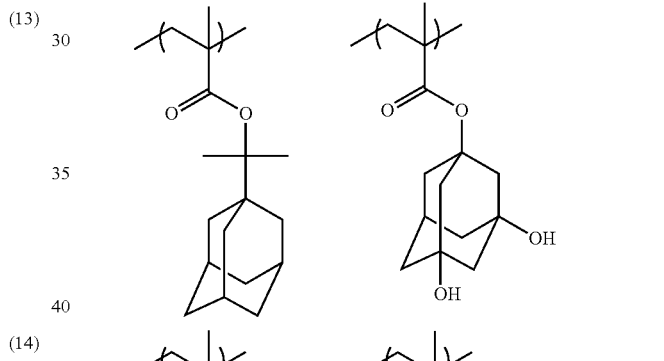
(17)
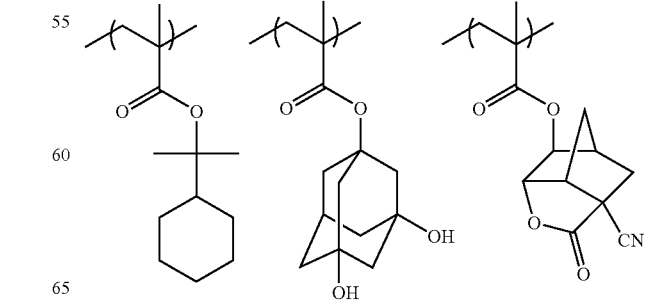

TABLE 2-continued
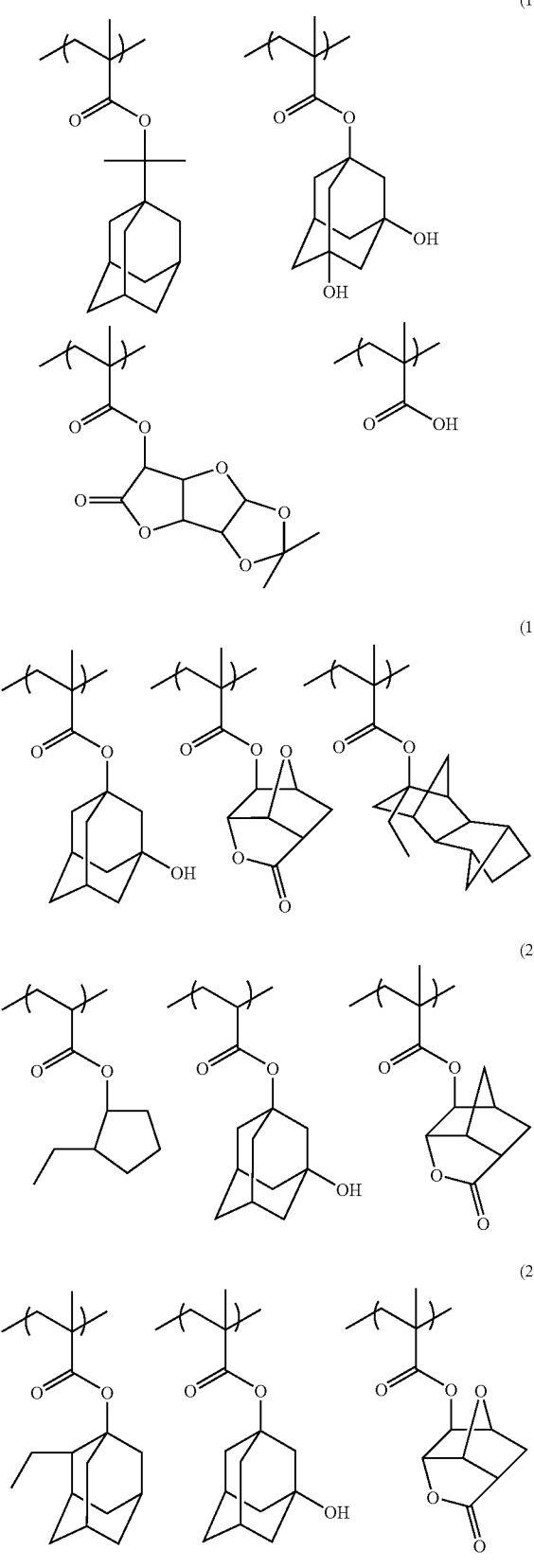
TABLE 2-continued
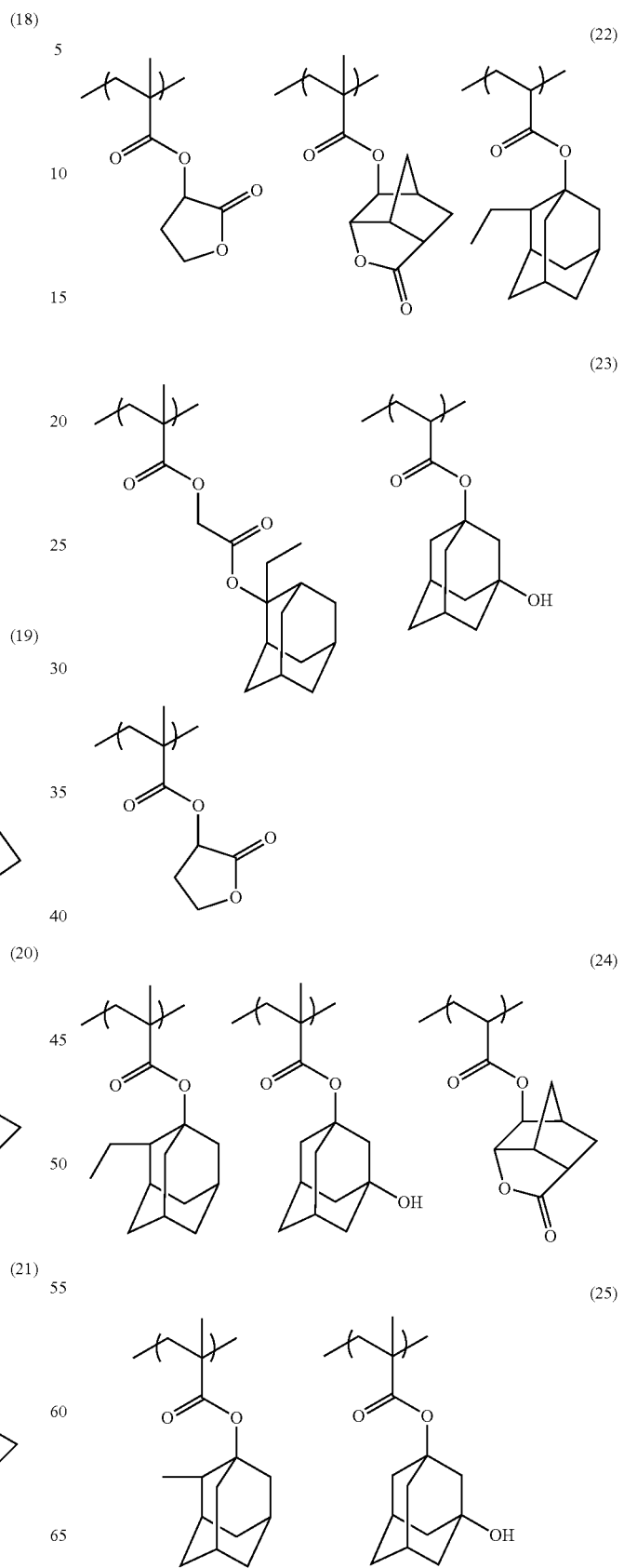

TABLE 2-continued
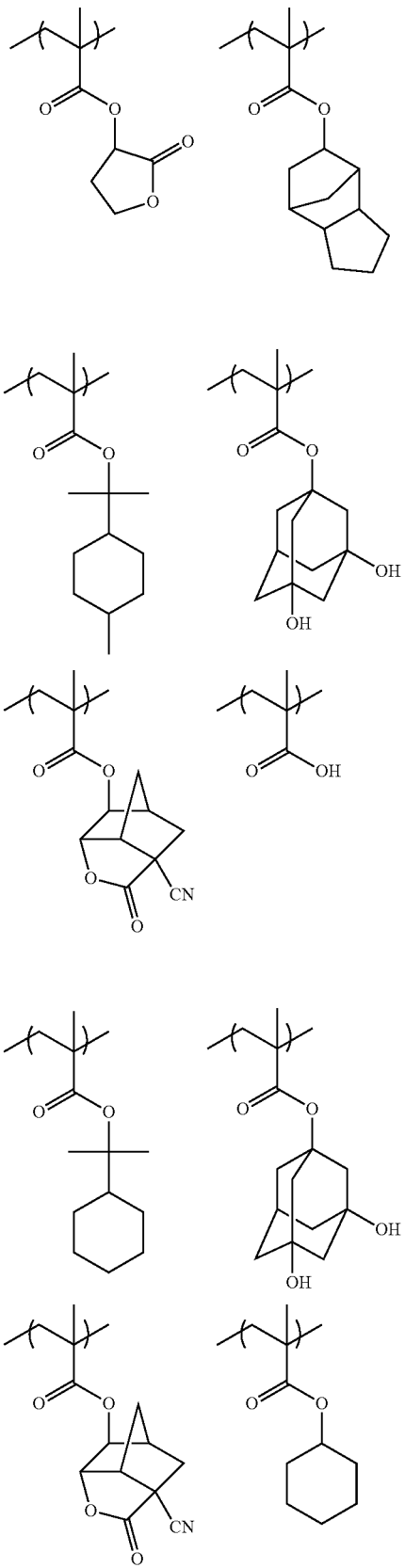
TABLE 2-continued
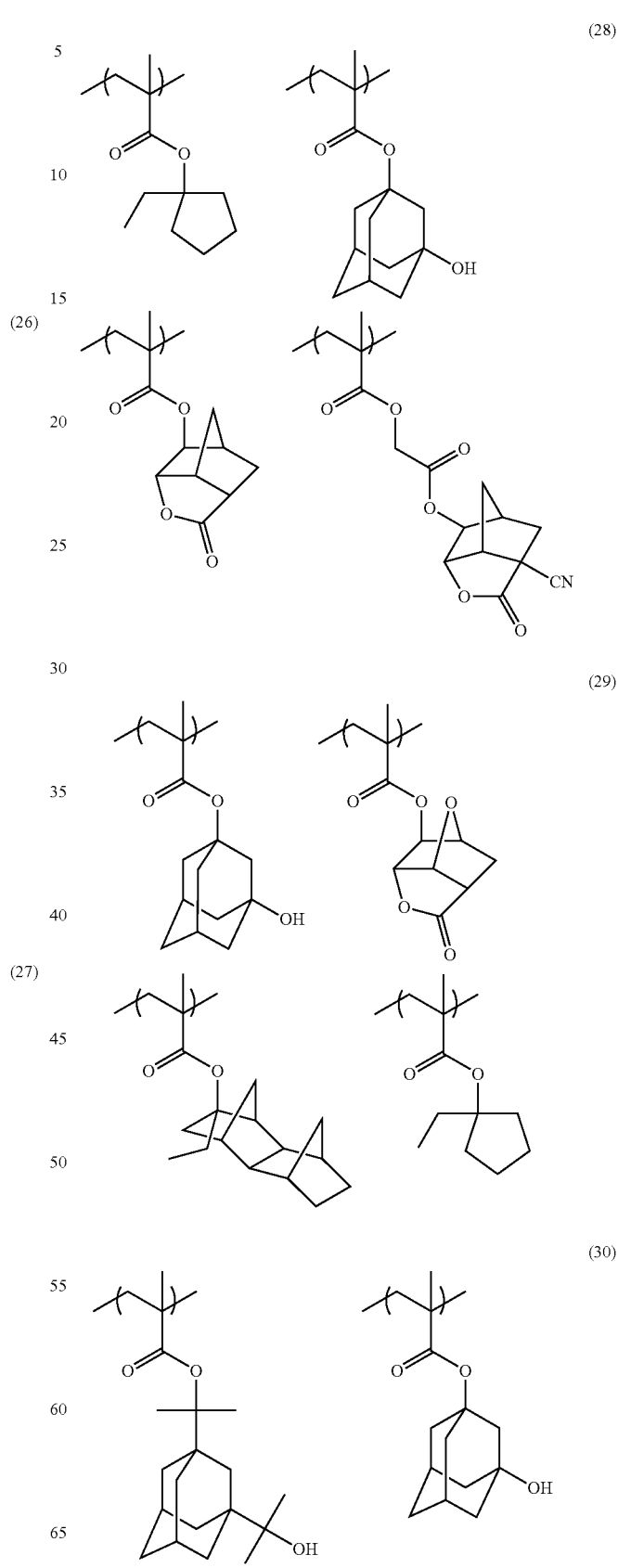

TABLE 2-continued
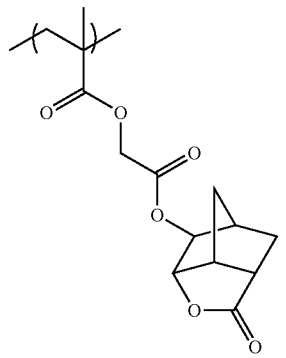
(31)
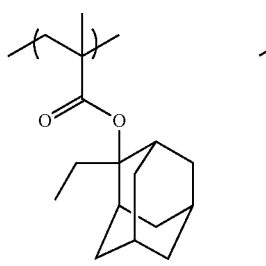
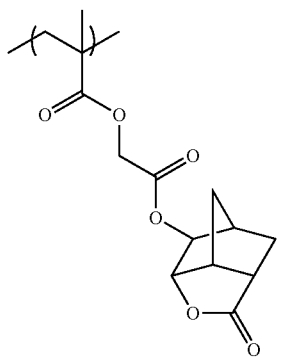
(32)
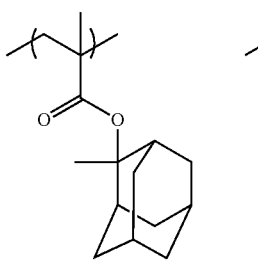
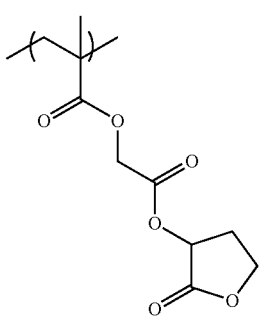
TABLE 2-continued
(33)
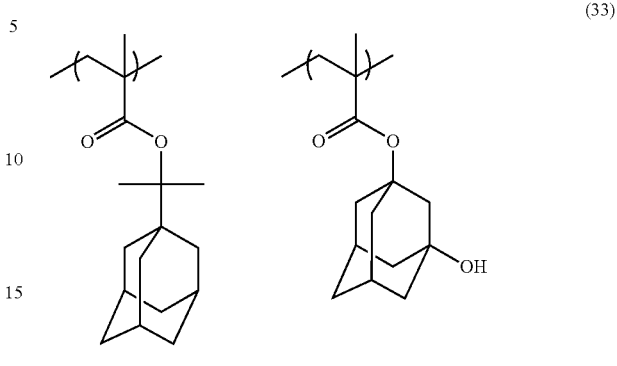
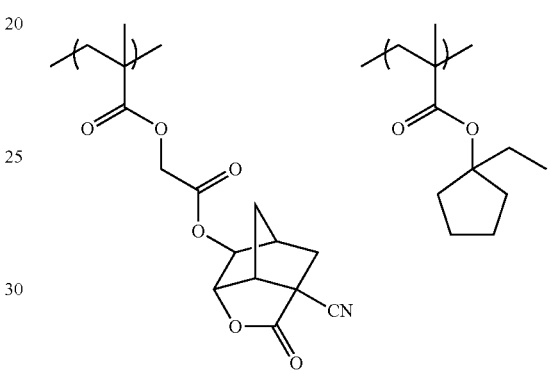
(34)
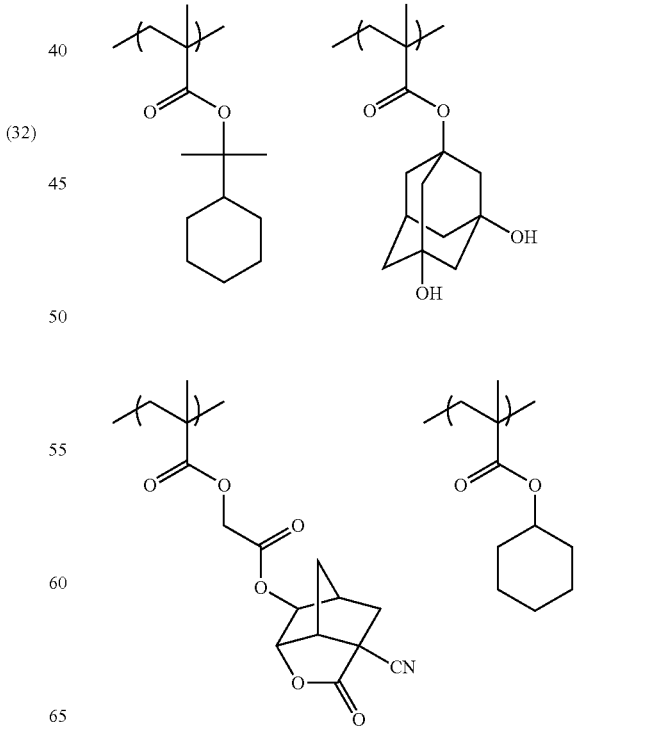

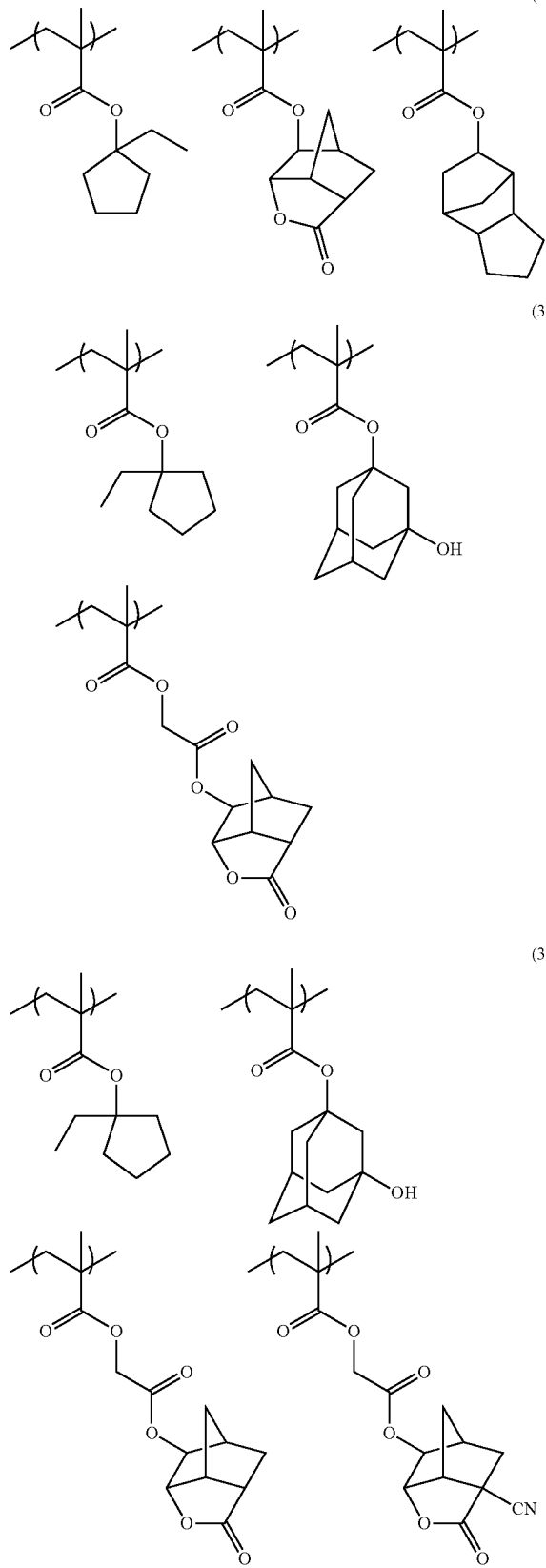

TABLE 2-continued

| Resin (A) | Composition | Mw | Mw/Mn |
|---|---|---|---|
| 1 | 50/10/40 | 8800 | 1.9 |
| 2 | 40/22/38 | 12000 | 2.0 |
| 3 | 34/33/33 | 11000 | 2.3 |
| 4 | 45/15/40 | 10500 | 2.1 |
| 5 | 30/25/45 | 8400 | 2.3 |
| 6 | 39/20/41 | 10500 | 2.1 |
| 7 | 49/10/41 | 9500 | 2.5 |
| 8 | 35/32/33 | 14000 | 2.6 |
| 9 | 40/20/35/5 | 12500 | 2.4 |
| 10 | 40/15/40/5 | 10000 | 1.8 |
| 11 | 40/15/40/5 | 9800 | 2.3 |
| 12 | 35/20/40/5 | 6100 | 2.3 |
| 13 | 50/50 | 5200 | 2.1 |
| 14 | 30/30/30/10 | 8600 | 2.5 |
| 15 | 40/20/35/5 | 12000 | 2.1 |
| 16 | 30/20/40/10 | 8000 | 2.0 |
| 17 | 40/10/50 | 6000 | 1.8 |
| 18 | 30/20/40/10 | 8500 | 1.5 |
| 19 | 30/40/30 | 9500 | 1.9 |
| 20 | 40/10/50 | 7700 | 1.7 |
| 21 | 35/30/35 | 9800 | 1.8 |
| 22 | 25/25/50 | 8800 | 1.8 |
| 23 | 50/25/25 | 6500 | 1.6 |
| 24 | 50/30/20 | 10000 | 1.9 |
| 25 | 40/20/20/20 | 6400 | 1.7 |
| 26 | 40/10/40/10 | 8600 | 1.8 |
| 27 | 40/10/40/10 | 9200 | 1.8 |
| 28 | 40/15/20/25 | 8500 | 1.6 |
| 29 | 10/40/25/25 | 12000 | 1.8 |
| 30 | 40/10/50 | 8000 | 1.7 |
| 31 | 50/10/40 | 8000 | 1.7 |
| 32 | 40/10/40/10 | 7000 | 1.7 |
| 33 | 20/15/35/30 | 10000 | 1.7 |
| 34 | 45/10/35/10 | 8500 | 1.7 |
| 35 | 50/40/10 | 10000 | 1.6 |
| 36 | 55/10/35 | 12000 | 1.8 |
| 37 | 40/15/20/25 | 9000 | 1.7 |

<Preparation of Resist>

The components indicated in the following Table 3 and Table 4 were dissolved in also indicated solvents so as to obtain solutions of 5 mass % solid content. The solutions were passed through a polyethylene filter of 0.1 µm pore size, thereby obtaining positive resist compositions. The thus obtained positive resist compositions were evaluated by the following methods. The results are given in Table 3 and Table 4.

<Image Quality Testing>

[Exposure Condition: ArF Liquid Immersion Exposure]

An organic antireflection film ARC29A (produced by Nissan Chemical Industries, Ltd.) was applied onto a silicon wafer and baked at 205° C. for 60 sec, thereby forming a 98 nm antireflection film. Each of the prepared positive resist compositions was applied thereonto and baked at 130° C. for 60 sec, thereby forming a 120 nm resist film. The resultant wafer was exposed through a 6% half-tone mask of 75 nm 1:1 line and space pattern with the use of an ArF excimer laser liquid immersion scanner (manufactured by ASML, XT1250i, NA0.85). Ultrapure water was used as the liquid for liquid immersion. Thereafter, the exposed wafer was heated at 130° C. for 60 sec, developed with an aqueous solution of tetramethylammonium hydroxide (2.38 mass %) for 30 sec, rinsed with pure water and spin dried, thereby obtaining a resist pattern.

[Pattern Collapse]

The optimum exposure intensity refers to the exposure intensity that reproduces a 75 nm line-and-space pattern. The critical pattern collapse line width was defined as the line width allowing pattern resolution without any collapse upon the employment of reduced mask size under exposure with the optimum exposure intensity with respect to a 1:1 line-and-space dense pattern and a 1:10 line-and-space isolated pattern. The smaller the value thereof, the finer the pattern is resolved without any collapse, that is, the more effective the suppression of pattern collapse.

[Line Edge Roughness (LER)]

With respect to a 5 μm region of each longitudinal edge of a line pattern, the distance from a reference line on which edges were to be present was measured at 50 points by means of a critical dimension scanning electron microscope (SEM [model S-8840, manufactured by Hitachi, Ltd.]). The standard deviation of measurements was determined, and 3σ was computed. The evaluation marks o, Δ and x were given when the computed value was less than 5.0, 5.0 to less than 7.0 and 7.0 or greater, respectively. The smaller the value thereof, the higher the performance exhibited.

[Scum]

The presence of any development residue (scum) on a 75 nm line width resist pattern was observed by means of an SEM (model S-4800, manufactured by Hitachi, Ltd.). The evaluation mark o was given when no residue occurred at all. The evaluation mark x was given when the occurrence of residue was extreme. The evaluation mark o or Δ was given when the occurrence of residue was intermediate.

[Water Following Property]

Each of the prepared positive resist compositions was applied onto a silicon wafer and baked at 130° C. for 60 sec, thereby forming a 160 nm resist film. Referring to FIG. 1, the space between a quartz glass plate (3) and the obtained wafer (1) furnished with the resist film (4) was filled with pure water (2). In this state, the quartz glass plate (3) was moved (scanned) in parallel to the surface of the wafer (1) furnished with the resist film (4), and the condition of the pure water (2) following the moving glass plate was visually observed. The water following property was evaluated by gradually increasing the scan speed of the quartz glass plate (3) and determining the critical scan speed at which the pure water (2) can no longer track the scan speed of the quartz glass plate (3) to thereby cause water droplets to begin to remain on the receding side. The greater the critical scan speed allowed, the greater the scan speed at which water following is practicable and the better the water following property on the resist film.

[Evaluation of Development Defect]

Random-mode measurement was carried out by the use of a defect inspection apparatus KLA-2360 (trade name) manufactured by KLA-Tencor Corporation. In the defect inspection apparatus, the pixel size was set at 0.16 μm and the threshold value at 20. Any development defects extracted from differences generated by superimposition between a comparative image and the pixel unit were detected, and the number of development defects per area was calculated. The evaluation marks o*, o, Δ and x were given when the calculated value was less than 0.5, 0.5 to less than 0.7, 0.7 to less than 1.0 and 1.0 or greater, respectively. The less the value thereof, the better the development performance.

TABLE 3

| | | | | | Resist composition | | | | |
|---|---|---|---|---|---|---|---|---|---|
| | | | | | | Resin (c1) | | Resin (c2) | |
| | Resin (A) (2 g) | Acid generator (mg) | Solvent (mass ratio) | Basic compound (mg) | Additive amount (mass %) | Acid number (meq) | Additive amount (mass %) | Acid number (meq) | Surfactant (mg) |
| Ex. 1 | 1 | z55/z23 (100/25) | SL-2/SL-4 60/40 | N-5/N-1 (7/7) | C-107 (0.6) | 0 | C-23 (5.0) | 4.0 | W-4 (2) |
| Ex. 2 | 2 | z55/z65 (75/75) | SL-2/SL-4 60/40 | N-5/N-1 (7/7) | C-10 (0.6) | 0 | C-11 (3.0) | 3.6 | W-4 (2) |
| Ex. 3 | 3 | z55 100 | SL-2/SL-4 60/40 | N-5/N-1 (7/7) | C-21 (1.0) | 0 | C-24 (3.0) | 2.4 | W-4 (2) |
| Ex. 4 | 4 | z55/z51 (45/45) | SL-2/SL-4 60/40 | N-1 (10) | C-1 (1.0) | 0 | C-32 (2.0) | 3.0 | W-4 (2) |
| Ex. 5 | 5 | z2 80 | SL-4/SL-2 40/60 | N-5 (7) | C-35 (1.0) | 0.9 | C-55 (1.0) | 1.8 | W-1 (3) |
| Ex. 6 | 6 | z1 60 | SL-4/SL-2 40/60 | N-5 (7) | C-35 (2.0) | 0.9 | C-55 (3.0) | 1.8 | W-1 (3) |
| Ex. 7 | 7 | z2 80 | SL-4/SL-2 40/60 | N-3 (6) | C-6 (1.0) | 0 | C-60 (2.0) | 1.6 | W-1 (3) |
| Ex. 8 | 8 | z51 100 | SL-2/SL-4/SL-6 40/59/1 | N-6 (10) | C-30 (1.0) | 0 | C-52 (1.0) | 1.7 | W-3 (3) |
| Ex. 9 | 9 | z51 100 | SL-2/SL-4/SL-6 40/59/1 | N-1 (7) | C-20 (1.0) | 0 | C-24 (1.0) | 2.4 | W-3 (3) |
| Ex. 10 | 10 | z9 100 | SL-2/SL-4/SL-6 40/59/1 | N-2 (9) | C-102 (0.6) | 0 | C-44 (3.0) | 1.8 | W-3 (3) |
| Ex. 11 | 11 | z2/z55 (20/100) | SL-2/SL-4 70/30 | N-3 (6) | C-47 (1.0) | 0.84 | C-33 (1.0) | 1.6 | W-6 (3) |
| Ex. 12 | 12 | z2/z15 (40/60) | SL-2/SL-4 70/30 | N-3 (6) | C-15 (1.5) | 0 | C-19 (2.0) | 2.0 | W-6 (3) |
| Ex. 13 | 13 | z9 100 | SL-2/SL-4 60/40 | — | C-25 (2.0) | 1.4 | C-26 (2.0) | 1.7 | W-1 (5) |
| Ex. 14 | 14 | z65/z9 (20/80) | SL-3/SL-4 30/70 | N-6 (10) | C-85 (0.6) | 0 | C-16 (3.0) | 1.6 | W-5 (4) |
| Ex. 15 | 15 | z44/z65 (25/80) | SL-2/SL-4/SL-5 40/58/2 | N-1 (7) | C-17 (0.8) | 0 | C-3 (2.0) | 2.3 | W-1 (4) |
| Ex. 16 | 16 | z55/z47 (30/60) | SL-1/SL-2 60/40 | N-4 (13) | C-100 (0.8) | 0 | C-24 (1.0) | 2.4 | W-6 (4) |
| Ex. 17 | 17 | z44/z65 (50/50) | SL-1/SL-2 60/40 | N-3 (6) | C-95 (0.6) | 0 | C-44 (3.0) | 1.8 | W-2 (3) |
| Ex. 18 | 18 | z65 100 | SL-2/SL-4/SL-6 40/59/1 | N-2 (9) | C-10 (0.7) | 0 | C-60 (2.0) | 1.6 | W-3 (3) |

TABLE 3-continued

|  | # | Resin (amt) | SL ratio | N (amt) | C (amt) |  | C (amt) |  | W (amt) |
|---|---|---|---|---|---|---|---|---|---|
| Ex. 19 | 19 | z15/z37 (80/50) | SL-2/SL-4/SL-6 40/59/1 | N-6 (10) | C-73 (1.0) | 0 | C-63 (2.0) | 1.6 | W-4 (5) |
| Ex. 20 | 20 | z55/z23 (100/25) | SL-2/SL-4 60/40 | N-5/N-1 (7/7) | C-54 (1.0) | 0.51 | C-11 (4.0) | 3.6 | W-4 (2) |
| Ex. 21 | 21 | z55/z65 (75/75) | SL-2/SL-4 60/40 | N-5/N-9 (7/7) | C-103 (0.6) | 0 | C-13 (2.0) | 2.1 | — |
| Ex. 22 | 22 | z55 100 | SL-2/SL-4 60/40 | N-5/N-1 (7/7) | C-87 (0.6) | 0 | C-32 (2.0) | 3.0 | W-6 (2) |
| Ex. 23 | 23 | z55/z23 (100/25) | SL-2/SL-4 60/40 | N-5/N-1 (7/7) | C-93 (1.0) | 0 | C-7 (2.0) | 2.5 | W-6 (2) |
| Ex. 24 | 24 | z55/z23 (100/25) | SL-2/SL-4 60/40 | N-5/N-9 (7/7) | C-96 (0.5) | 0 | C-24 (1.0) | 2.4 | W-6 (2) |
| Ex. 25 | 25 | z15/z37 (80/50) | SL-2/SL-4 60/40 | N-1 (7) | C-81 (0.7) | 0 | C-23 (3.0) | 4.0 | — |
| Ex. 26 | 26 | z2 (80) | SL-2 100 | N-7 (7) | C-90 (0.8) | 0 | C-3 (2.0) | 2.3 | W-3 (2) |
| Ex. 27 | 27 | z2 (80) | SL-1 100 | N-7 (7) | C-80 (0.6) | 0 | C-24 (1.0) | 2.4 | W-6 (3) |
| Ex. 28 | 28 | z65 (100) | SL-2/SL-4/SL-5 40/58/2 | N-1 (7) | C-111 (1.0) | 0 | C-23 (3.0) | 4.0 | W-1 (4) |
| Ex. 29 | 29 | z55/z47 (30/60) | SL-1/SL-2 60/40 | N-4 (13) | C-28 (1.0) | 0 | C-117 (3.0) | 2.8 | W-6 (4) |
| Ex. 30 | 30 | z67 (100) | SL-1/SL-2 60/40 | N-3 (6) | C-75 (0.5) | 0.1 | C-128 (4.0) | 2.4 | W-2 (3) |
| Ex. 31 | 31 | z65 (100) | SL-2/SL-4/SL-6 40/59/1 | N-2 (9) | C-111 (1.0) | 0 | C-115 (4.0) | 4.1 | W-3 (3) |
| Ex. 32 | 32 | z87 (100) | SL-2/SL-4/SL-6 40/59/1 | N-6 (10) | C-113 (1.0) | 0.4 | C-126 (3.0) | 3.4 | W-4 (5) |
| Ex. 33 | 33 | z67 (100) | SL-2/SL-4 60/40 | N-3 (6) | C-54 (1.0) | 0.51 | C-23 (3.0) | 4.0 | W-4 (2) |
| Ex. 34 | 34 | z65 (100) | SL-2/SL-4 60/40 | D-51 (15) | C-75 (0.5) | 0.1 | C-109 (2.0) | 2.0 | W-1 (4) |
| Ex. 35 | 35 | z55 (100) | SL-2/SL-4 60/40 | N-5/N-1 (7/7) | C-1 (1.5) | 0 | C-125 (4.0) | 2.8 | W-6 (2) |
| Ex. 36 | 36 | z67 (100) | SL-2/SL-4 60/40 | N-3 (6) | C-81 (0.7) | 0 | C-115 (2.0) | 4.1 | W-1 (4) |
| Ex. 37 | 37 | z65 (100) | SL-2/SL-4 60/40 | N-3 (6) | C-75 (0.5) | 0.1 | C-23 (3.0) | 4.0 | W-6 (2) |
| Ex. 38 | 27 | z2 (80) | SL-1 100 | N-7/D-52 (7/7) | C-80 (0.6) | 0 | C-24 (1.0) | 2.4 | W-6 (3) |
| Ex. 39 | 29 | Z55/z47 (30/60) | SL-1/SL-2 60/40 | D-52/D-19 (7/7) | C-28 (1.0) | 0 | C-117 (3.0) | 2.8 | W-6 (4) |
| Ex. 40 | 17 | z9 (100) | SL-2/SL-4 60/40 | N-3 (6) | C-25 (2.0) | 1.4 | C-63 (2.0) | 1.6 | W-1 (5) |
| Ex. 41 | 27 | z2 (80) | SL-1 100 | N-7 (7) | C-80 (0.6) C-54 (0.9) | 0 0.51 | C-24 (1.0) | 2.4 | W-6 (3) |

| | Evaluation result | | | | |
|---|---|---|---|---|---|
| | Collapse (nm) | LER | Scum | Development defect | Water following property (nm/s) |
| Ex. 1 | 50 | ○ | ○* | ○* | 300 |
| Ex. 2 | 50 | ○ | ○* | ○* | 300 |
| Ex. 3 | 45 | ○ | ○* | ○* | 350 |
| Ex. 4 | 50 | ○ | ○* | ○* | 350 |
| Ex. 5 | 50 | ○ | ○ | ○* | 150 |
| Ex. 6 | 50 | ○ | ○ | ○* | 200 |
| Ex. 7 | 45 | ○ | ○ | ○ | 300 |
| Ex. 8 | 50 | ○ | ○ | ○ | 300 |
| Ex. 9 | 50 | ○ | ○* | ○* | 300 |
| Ex. 10 | 45 | ○ | ○ | ○* | 300 |
| Ex. 11 | 55 | ○ | ○ | ○ | 150 |
| Ex. 12 | 50 | ○ | ○* | ○* | 300 |
| Ex. 13 | 60 | ○ | ○ | ○ | 150 |
| Ex. 14 | 45 | ○ | ○ | ○ | 300 |
| Ex. 15 | 50 | ○ | ○* | ○* | 350 |
| Ex. 16 | 50 | ○ | ○* | ○* | 400 |
| Ex. 17 | 45 | ○ | ○ | ○* | 250 |
| Ex. 18 | 50 | ○ | ○ | ○ | 300 |
| Ex. 19 | 50 | ○ | ○ | ○ | 250 |
| Ex. 20 | 50 | ○ | ○* | ○* | 200 |
| Ex. 21 | 50 | ○ | ○* | ○* | 350 |
| Ex. 22 | 40 | ○ | ○* | ○* | 350 |
| Ex. 23 | 45 | ○ | ○* | ○* | 300 |
| Ex. 24 | 50 | ○ | ○* | ○* | 300 |
| Ex. 25 | 40 | ○ | ○* | ○* | 400 |
| Ex. 26 | 50 | ○ | ○* | ○* | 400 |
| Ex. 27 | 40 | ○ | ○* | ○* | 350 |

TABLE 3-continued

| | | | | | | |
|---|---|---|---|---|---|---|
| Ex. 28 | 40 | ○ | ○* | ○* | | 400 |
| Ex. 29 | 50 | ○ | ○* | ○* | | 350 |
| Ex. 30 | 40 | ○ | ○* | ○* | | 400 |
| Ex. 31 | 40 | ○ | ○* | ○* | | 400 |
| Ex. 32 | 40 | ○ | ○* | ○* | | 300 |
| Ex. 33 | 40 | ○ | ○* | ○* | | 250 |
| Ex. 34 | 40 | ○ | ○* | ○* | | 400 |
| Ex. 35 | 50 | ○ | ○* | ○* | | 350 |
| Ex. 36 | 40 | ○ | ○* | ○* | | 400 |
| Ex. 37 | 40 | ○ | ○* | ○* | | 400 |
| Ex. 38 | 40 | ○ | ○* | ○* | | 350 |
| Ex. 39 | 45 | ○ | ○* | ○* | | 350 |
| Ex. 40 | 50 | ○ | ○ | ○ | | 150 |
| Ex. 41 | 45 | ○ | ○* | ○* | | 350 |

TABLE 4

| | | | | | Resist composition | | | | |
|---|---|---|---|---|---|---|---|---|---|
| | | | | | Resin (c1) | | Resin (c2) | | |
| | Resin (A) (2 g) | Acid generator (mg) | Solvent (mass ratio) | Basic compound (mg) | Additive amount (mass %) | Acid number (meq) | Additive amount (mass %) | Acid number (meq) | Surfactant (mg) |
| Ex. 42 | 1 | z55/z23 (100/25) | SL-2/SL-4 60/40 | N-5/N-1 (7/7) | — | — | — | — | W-4 (2) |
| Ex. 43 | 1 | z55/z23 (100/25) | SL-2/SL-4 60/40 | N-5/N-1 (7/7) | C-107 (1.5) | 0 | — | — | W-4 (2) |
| Ex. 44 | 2 | z55/z65 (75/75) | SL-2/SL-4 60/40 | N-5/N-1 (7/7) | C-10 (1.5) | 0 | — | — | W-4 (2) |
| Ex. 45 | 3 | z55 100 | SL-2/SL-4 60/40 | N-5/N-1 (7/7) | — | — | C-24 (3.0) | 2.4 | W-4 (2) |
| Ex. 46 | 4 | z55/z51 (45/45) | SL-2/SL-4 60/40 | N-1 (10) | — | — | C-32 (2.0) | 3.0 | W-4 (2) |
| Ex. 47 | 2 | z55/z65 (75/75) | SL-2/SL-4 60/40 | N-5/N-1 (7/7) | C-10 (1.2) C-54 (1.0) | 0 0.51 | — | — | W-4 (2) |
| Ex. 48 | 1 | z55/z23 (100/25) | SL-2/SL-4 60/40 | N-5/N-1 (7/7) | — | — | C-63 (2.0) C-33 (1.0) | 1.6 1.6 | W-4 (2) |

| | Evaluation result | | | | |
|---|---|---|---|---|---|
| | Collapse (nm) | LER | Scum | Development defect | Water following property (nm/s) |
| Ex. 42 | T-top | x | ○ | Δ | 50 |
| Ex. 43 | 55 | x | x | x | 300 |
| Ex. 44 | 55 | x | x | x | 300 |
| Ex. 45 | 55 | ○ | ○ | x | 50 |
| Ex. 46 | 55 | ○ | ○ | x | 100 |
| Ex. 47 | 55 | x | x | x | 300 |
| Ex. 48 | 55 | x | ○ | x | 150 |

The brevity codes appearing in Tables 3 and 4 are as follows.

The acid generators and resins (C) correspond to those shown hereinbefore by way of examples.

[Basic Compound]
N-1: N,N-dibutylaniline,
N-2: N,N-dihexylaniline,
N-3: 2,6-diisopropylaniline,
N-4: tri-n-octylamine,
N-5: N,N-dihydroxyethylaniline,
N-6: 2,4,5-triphenylimidazole,
N-7: tris(methoxyethoxyethyl)amine,
N-9: 2-[2-{2-(2,2-dimethoxy-phenoxyethoxy)ethyl}-bis(2-methoxyethyl)]-amine, and
D-19, D-51, D-52: shown hereinbefore by way of examples.

[Surfactant]
W-1: Megafac F176 (produced by Dainippon Ink & Chemicals, Inc., fluorinated),
W-2: Megafac R08 (produced by Dainippon Ink & Chemicals, Inc., fluorinated and siliconized),
W-3: polysiloxane polymer KP-341 (produced by Shin-Etsu Chemical Co., Ltd., siliconized),
W-4: Troy Sol S-366 (produced by Troy Chemical Co., Ltd.),
W-5: PF656 (produced by OMNOVA, fluorinated), and
W-6: PF6320 (produced by OMNOVA, fluorinated).

[Solvent]
SL-1: cyclohexanone,
SL-2: propylene glycol monomethyl ether acetate,
SL-3: ethyl lactate,
SL-4: propylene glycol monomethyl ether,
SL-5: γ-butyrolactone, and
SL-6: propylene carbonate.

From Tables 3 and 4, it is apparent that the resist patterns formed by the use of the positive resist compositions as the actinic-ray- or radiation-sensitive resin composition according to the present invention exhibit excellent performance in all of the pattern collapse, line edge roughness, scum, development defect and following property with respect to the liquid for liquid immersion employed in a liquid immersion exposure.

What is claimed is:

1. An actinic-ray- or radiation-sensitive resin composition comprising:
   (A) a resin that exhibits an increased solubility in an alkali developer when acted on by an acid
   (B) a compound that generates an acid when exposed to actinic rays or radiation,
   (C) a resin containing two or more resins (c) each having at least either a fluorine atom or a silicon atom, and
   (D) a solvent,
   wherein resin (C) contains (c1) a resin having an acid number of 1.1 or below and (c2) a resin having an acid number of 1.8 or higher as the resins (c) each having at least either a fluorine atom or a silicon atom.

2. The actinic-ray- or radiation-sensitive resin composition according to claim 1, wherein at least one of the resins (c) each having at least either a fluorine atom or a silicon atom has at least any one of the groups represented by the following general formulae (F2) to (F4) and (CS-1) to (CS-3):

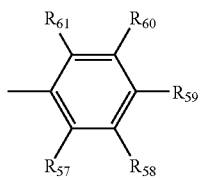
(F2)

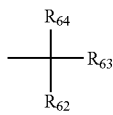
(F3)

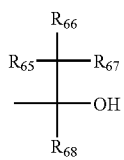
(F4)

in general formulae (F2) to (F4),
each of $R_{57}$ to $R_{68}$ independently represents a hydrogen atom, a fluorine atom, a linear or branched alkyl group, a cycloalkyl group or an aryl group, provided that with respect to each of $R_{57}$-$R_{61}$, $R_{62}$-$R_{64}$ and $R_{65}$-$R_{68}$, at least one thereof represents a fluorine atom or an alkyl group whose at least one hydrogen atom is substituted by a fluorine atom, and that $R_{62}$ and $R_{63}$ may be bonded to each other to thereby form a ring, and

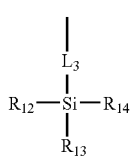
(CS-1)

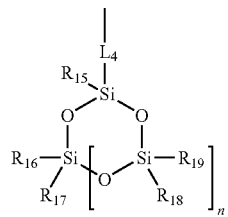
(CS-2)

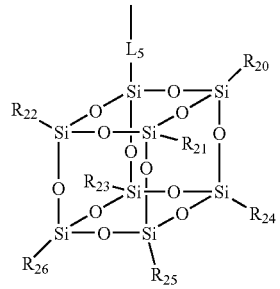
(CS-3)

in general formulae (CS-1) to (CS-3),
each of $R_{12}$ to $R_{26}$ independently represents a linear or branched alkyl group or a cycloalkyl group;
each of $L_3$ to $L_5$ represents a single bond or a bivalent connecting group; and
n is an integer of 1 to 5.

3. The actinic-ray- or radiation-sensitive resin composition according to claim 2, wherein at least one of the resins (c) each having at least either a fluorine atom or a silicon atom contains at least one acrylate or methacrylate repeating unit having any one of the groups represented by general formulae (F2) to (F4) and (CS-1) to (CS-3).

4. The actinic-ray- or radiation-sensitive resin composition according to claim 1, wherein resin (A) contains a repeating unit containing a lactone structure.

5. The actinic-ray- or radiation-sensitive resin composition according to claim 1, wherein resin (A) has a monocyclic or polycyclic acid-decomposable group.

6. The actinic-ray- or radiation-sensitive resin composition according to claim 1, wherein resin (C) is contained in a ratio of 0.1 to 10 mass % based on the total solid content of the composition.

7. A method of forming a pattern, comprising the steps of forming the actinic-ray- or radiation-sensitive resin composition according to claim 1 into a film, exposing the film with the use of a liquid immersion technique and developing the exposed film.

8. The actinic-ray- or radiation-sensitive resin composition according to claim 1, wherein resin (c) contains a group with a lactone structure.

9. The actinic-ray- or radiation-sensitive resin composition according to claim 1, wherein the acid group content of resin (c2) is 50 mol % or greater.

10. The actinic-ray- or radiation-sensitive resin composition according to claim 1, wherein the resins (c) contain at least one group (y) that is decomposed by the action of an alkali developer, resulting in an increase of solubility in the alkali developer.

11. The actinic-ray- or radiation-sensitive resin composition according to claim 1, wherein the resins (c) contain at least one group (z) that is decomposed by the action of an acid.

12. The actinic-ray- or radiation-sensitive resin composition according to claim 1, wherein the difference in acid number between two resins (c) contained in the resin (C) is 1.0 or higher.

13. The actinic-ray- or radiation-sensitive resin composition according to claim 1, wherein the resin (A) contains any of the repeating units having a lactone structure represented by formula (3):

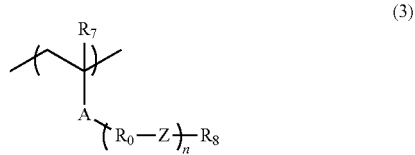

wherein A represents an ester bond (—COO—) or an amido bond (—CONH—);

$R_0$, each independently in the presence of two or more groups, represents an alkylene group, a cycloalkylene group or a combination thereof;

Z, each independently in the presence of two or more groups, represents an ether bond, an ester bond, a carbonyl group, an amido bond, a urethane bond or a urea bond;

$R_8$ represents a monovalent organic group with a lactone structure;

n represents the number of repetitions of the structure of the formula —$R_0$—Z— in any of the repeating units of formula (3) and is an integer of 1 to 5; and $R_7$ represents a hydrogen atom, a halogen atom or an optionally substituted alkyl group.

14. The actinic-ray- or radiation-sensitive resin composition according to claim 13, wherein
in general formula (3),
A represents an ester bond,
$R_0$ represents a methylene group, and
n represents 1.

15. The actinic-ray- or radiation-sensitive resin composition according to claim 1, wherein the actinic-ray- or radiation-sensitive resin composition further comprises a basic compound having a carbamate group on its nitrogen atom.

16. The actinic-ray- or radiation-sensitive resin composition according to claim 1, wherein resin (A) contains neither a fluorine atom nor a silicon atom.

17. The actinic-ray- or radiation-sensitive resin composition according to claim 1, wherein resin (c1) has an acid number (meq/g) of 0.5 or below, and resin (c2) has an acid number of 2.0 or higher.

18. The actinic-ray- or radiation-sensitive resin composition according to claim 1, wherein an acid group content of the resin (cl) is less than 30 mol %.

19. The actinic-ray- or radiation-sensitive resin composition according to claim 1, wherein each of resins (c1) and (c2) is a resin having a fluorine atom.

* * * * *